US012534824B2

United States Patent
(12) United States Patent
Priya et al.

(10) Patent No.: US 12,534,824 B2
(45) Date of Patent: Jan. 27, 2026

(54) METHOD OF FORMING A HALIDE PEROVSKITE CRYSTAL BY DISPERSING A HALIDE PEROVSKITE MATERIAL INTO A SOLUTION, FORMING A METASTABLE INTERMEDIATE PHASE, AND TRANSITIONING TO A HALIDE PEROVSKITE CRYSTAL FILM

(71) Applicant: The Penn State Research Foundation, University Park, PA (US)

(72) Inventors: Shashank Priya, State College, PA (US); Kai Wang, University Park, PA (US)

(73) Assignee: The Penn State Research Foundation, University Park, PA (US)

(*) Notice: Subject to any disclaimer, the term of this patent is extended or adjusted under 35 U.S.C. 154(b) by 425 days.

(21) Appl. No.: 18/006,810

(22) PCT Filed: Jul. 29, 2021

(86) PCT No.: PCT/US2021/043700
§ 371 (c)(1),
(2) Date: Jan. 25, 2023

(87) PCT Pub. No.: WO2022/026707
PCT Pub. Date: Feb. 3, 2022

(65) Prior Publication Data

US 2023/0272553 A1 Aug. 31, 2023

Related U.S. Application Data

(60) Provisional application No. 63/057,927, filed on Jul. 29, 2020.

(51) Int. Cl.

| | |
|---|---|
| *C30B 7/14* | (2006.01) |
| *C30B 7/06* | (2006.01) |
| *C30B 29/12* | (2006.01) |

(52) U.S. Cl.
CPC ................ *C30B 29/12* (2013.01); *C30B 7/06* (2013.01); *C30B 7/14* (2013.01)

(58) Field of Classification Search
CPC .... C30B 7/00; C30B 7/02; C30B 7/04; C30B 7/06; C30B 7/14; C30B 29/00; C30B 29/10; C30B 29/12

(Continued)

(56) References Cited

U.S. PATENT DOCUMENTS

2018/0151813 A1* 5/2018 Zhu ........................ H10K 85/30
2019/0256535 A1* 8/2019 Ma .......................... C07F 1/005

FOREIGN PATENT DOCUMENTS

WO 2017184292 A1 10/2017

OTHER PUBLICATIONS

Intellectual Search Report for PCT/US2021/043700 dated Nov. 11, 2021.

(Continued)

*Primary Examiner* — Kenneth A Bratland, Jr.
(74) *Attorney, Agent, or Firm* — Buchanan Ingersoll & Rooney PC

(57) ABSTRACT

Embodiments relate to methods of forming a halide perovskite crystal. The method involves dispersing a halide perovskite material exhibiting a perovskite crystallographic lattice into a solution. The solution can include amine and a volatile solvent. The method involves forming a metastable intermediate state via amine molecules inserting into the perovskite crystallographic lattice. The method involves transitioning the perovskite material to a photo-sensitive phase via escape of the amine molecules from the perovskite crystallographic lattice. The method involves transitioning the metastable intermediate state to a halide perovskite crystal film.

21 Claims, 51 Drawing Sheets

(58) Field of Classification Search
USPC .............................. 117/11, 68, 70, 937, 940
See application file for complete search history.

(56) References Cited

OTHER PUBLICATIONS

Written Opinion of the International Searching Authority for PCT/US2021/043700 dated Nov. 11, 2021.

* cited by examiner

Inverted device w/ other perovskite composition: $MAPbI_3$

FIG. 31 A
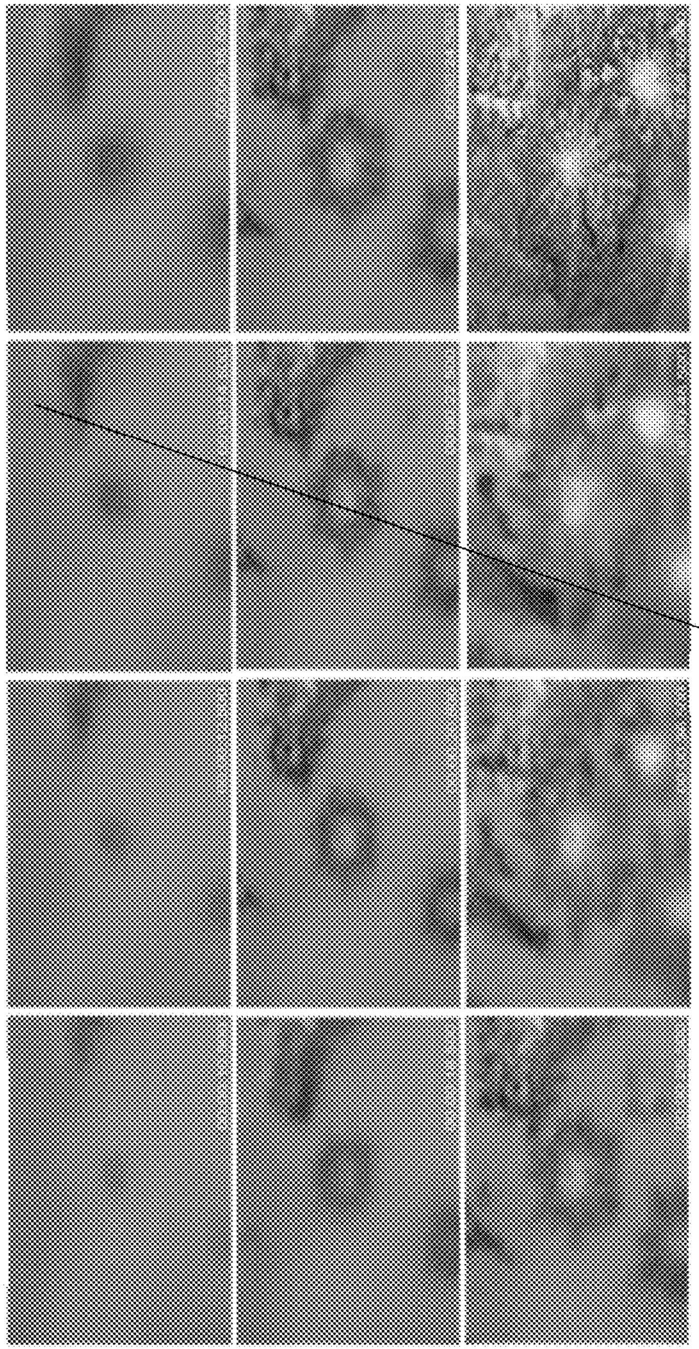
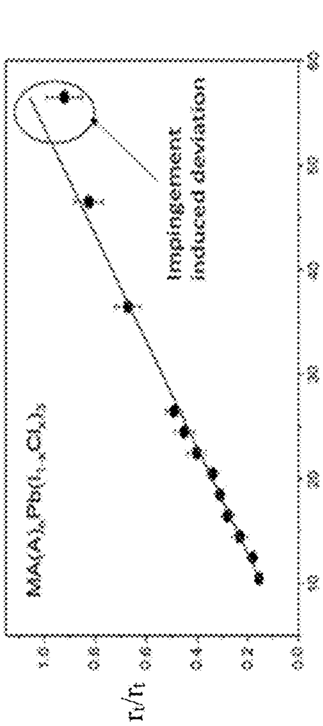
FIG. 31B
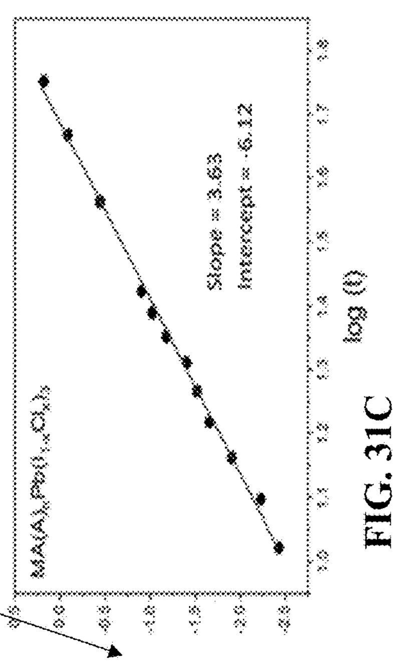
FIG. 31C

METHOD OF FORMING A HALIDE PEROVSKITE CRYSTAL BY DISPERSING A HALIDE PEROVSKITE MATERIAL INTO A SOLUTION, FORMING A METASTABLE INTERMEDIATE PHASE, AND TRANSITIONING TO A HALIDE PEROVSKITE CRYSTAL FILM

CROSS-REFERENCE TO RELATED APPLICATIONS

This application is related to and claims the benefit of priority of U.S. provisional application No. 63/057,927, filed on Jul. 29, 2020 and International Patent Application PCT/US2021/043700, filed on Jul. 29, 2021, the contents of each which is incorporated by reference in their entirety.

FIELD OF THE INVENTION

Embodiments relate to perovskites, perovskite structured compounds, perovskite structure compounds that include a halide perovskite material of $(LA)_2(SA)_{n-3}BX_{3n+1}$ or $ABX_3$, solar cells, photodetectors, memristors, light emitting diode (LED), lasers, X-ray and high energy sensors, artificial retina, image sensory devices and other optoelectronic devices that utilize abovementioned perovskite structured material and methods of making and using the same.

BACKGROUND OF THE INVENTION

Organic-inorganic halide perovskites (HPs) exhibit benign electronic band structure, heavy-metal spin-orbital coupling, polaronic charge transfer and electron-phonon coherence. These characteristics impart attractive optoelectronic features such as large light-extinction, long carrier lifetimes and high charge carrier mobilities, making them excellent candidates for photovoltaic (PV) and other optoelectronic applications. HPs can be easily processed using regular solution-processing techniques, such as spin-coating, which distinguishes them from traditional photovoltaic (PV) semiconductors suchas silicon (Si), cadmium telluride (CdTe), copper indium gallium selenide (GIGS), etc. There is continuous need to obtain PVs with low levelized-cost-of-electricity (LCOE) and simplified environment-friendly manufacturing techniques.

Perovskite precursor inks typically consist of high-boiling-point solvents such as dimethylformamide (DMF), dimethyl sulfoxide (DMSO) and γ-butyrolactone (GBL) that require redundant solvent-removing steps (with elevated temperature of 70-150° C.) and long processing time (long-time solvent/thermal annealing and/or light sintering for facilitating Ostwald ripening to thermodynamically favor the crystal growth). Perovskite crystallization requires a chemical potential difference in order to drive the precipitation of crystals from precursor solution, which is proportional to the logarithm of supersaturation ratio. The initiation of supersaturation can be achieved through temperature control (cooling from hot solution), concentration modulation, or adjustments of the solution activity coefficients as those in the solvent/antisolvent methodologies. Prior attempts on developing low-temperature synthesis process for HPs suffer from the use of nonvolatile ionic precursor system for initiating the supersaturation, and general room temperature (RT) processing is accompanied by subsequent laminar gas-blowing, anti-solvent washing or instant laser annealing. In addition, known processes require mild thermal annealing (TA) procedures in order to induce supersaturation to drive crystallization.

Prior attempts on processing of perovskite thin film with minimal energy/economical budget include the RT-processed film fabrication followed by various post-processing techniques including gas-blowing, antisolvent-washing and mild thermal annealing (TA). Table 1 summarizes representative prior studies to show the ongoing progress on low-/mild-temperature processed perovskite thin film for photovoltaic (PV) applications. These known methods rely on high-boiling-point solvent systems to process the high-quality perovskite polycrystalline thin film. These solvents are DMF, DMSO, NMP, PC, 2-ME, etc., all of which are nonvolatile at RT and require redundant post-processing to remove.

TABLE 1

Comparison of reported low-/mild-temperature processed perovskite thin films coupled with corresponding device efficiency

| Mechanism | Precursor Solvent System | Temp. | Expense on solvent removing | Time Window | Device Efficiency |
|---|---|---|---|---|---|
| Gas-blowing | dimethylformamide (DMF, 307.4° F. (153° C.)) and DMSO | 105° C. | high $N_2$ flow rate ($42 \pm 3$ m $s^{-1}$) + TA @ 105 ° C. for 60 min | 60+ min. | 20.26% |
| Solvent engineering | Acetonitrile (ACN, bp: 179.6° F. (82° C.)) + 2-methoxyethanol (2-ME, bp: 255.2° F. (124° C.)) | 100° C. | TA @ 100° C. | 5-20 min. | 16% |
| Anti-solvent washing | dimethylsulfoxide (DMSO, bp: 372.2° F. (189° C.)) and γ-butyrolactone (GBL, bp: 399.2° F. (204° C.)) | 90° C. | Antisolvent + Thermal annealing (TA) | ~10 min. | 14% |

TABLE 1-continued

Comparison of reported low-/mild-temperature processed perovskite thin films coupled with corresponding device efficiency

| Mechanism | Precursor Solvent System | Temp. | Expense on solvent removing | Time Window | Device Efficiency |
|---|---|---|---|---|---|
| Two-step-coating + $N_2$ blow + mild TA | DMF | 70° C. | Antisolvent + mild TA @ 70° C. | N/A | 11.96% |
| Solvent engineering | GBL + propylene carbonate (PC, bp: 464° F. (240° C.)) | 40° C.-90° C. | mild TA | N/A | 21.90% |
| Vacuum evacuation | NMP | N/A | gh vacuum (~10 mtorr) | 3+ min. | 8.67% |
| Mixed-solvent-vapor annealing | DMF | RT | DMF & antisolvent | 12 hrs. | 16.40% |
| Solvent-Solvent Extraction | N-methyl-2-pyrrolidone (NMP), bp: 395.6° F. (202° C.) | RT | bath in diethyl ether + $N_2$ blow | 2+ min. | 15.20% |

BRIEF SUMMARY OF THE INVENTION

Embodiments relate to manufacturing techniques for HPs that allows the whole synthesis process to be completed at room-temperature (RT) (e.g., between 20° C. and 22° C.) within ten seconds. It will be demonstrated by this disclosure that, after crystallization, the residual high-boiling-point solvent molecules remaining within the polycrystalline film induce localized lattice distortion by forming perovskite-solvent chelated intermediates. These residual chemicals within films introduce non-perovskite phases of poor electronic properties and severe scattering and recombination for photoexcited charge carriers. More volatile solvents, such as 2-methoxyethanol (with a boiling point of 125° C.) and other nonionic solvent systems, have been attempted and these exhibit rapid drying behavior at RT and reduced ionic coordination with perovskite precursors. However, a TA process is inevitable in order to foster crystallization and remove remaining solvents.

Embodiments of the disclosed method can be a fundamentally transformative HP manufacturing strategy that enables rapid crystallization (e.g. within a range from five seconds to sixty seconds) at RT without the need for TA or post-processing. Methods disclosed herein can take advantage of an alcohol-soluble metastable intermediate formed by insertion of amine (R—$NH_2$) molecules into the perovskite crystallographic lattice. Fast solvent evaporation and spontaneous escape of amine from lattice can induce a quick transition into the tetragonal β-phase perovskite crystals at RT. This approach can lead to a high-quality polycrystalline thin film with ultrahigh {00ℓ} preferred orientation, ~2.8 μm charge diffusion length and super film uniformity.

Optoelectronics, such as solar cells, for example, can be designed using these ultra-fast synthesized perovskite films exhibiting high power conversion efficiencies (PCEs>22%) in both conventional and inverted configurations. Other materials and devices can also utilize embodiments of an HP material made from the inventive methods disclosed herein. One embodiment of a film formed via an embodiment of the inventive method is discussed below and provides significant improvements over other conventional methods:

TABLE 2

Perovskite Film Using Embodiment of Inventive method

| Mechanism | Precursor Solvent System | Temp. | Expense on solvent removing | Time Window | Device Efficiency |
|---|---|---|---|---|---|
| RT isothermal crystallization | Ethanol (EtOH, bp: 173.1° F. (78.37° C.)) + ACN + amine | RT | N/A | ≤60 sec. | 23.07% |

Additional embodiments of the inventive methods, perovskite materials, perovskite structures, devices utilizing perovskite materials, and apparatuses can be appreciated from the detailed description provided herein.

In an exemplary embodiment, a method of forming a halide perovskite crystal involves dispersing a halide perovskite material exhibiting a perovskite crystallographic lattice into a solution, the solution comprising amine and a volatile solvent. The method involves forming a metastable intermediate state via amine molecules inserting into the perovskite crystallographic lattice. The method involves transitioning the perovskite material to a photo-sensitive phase via escape of the amine molecules from the perovskite crystallographic lattice. The method involves quickly and spontaneously transitioning the metastable intermediate state to a uniform halide perovskite crystal film.

In some embodiments, the steps of transitioning the perovskite material to a photo-sensitive phase and transitioning the metastable intermediate state to a uniform halide perovskite crystal film occur at a temperature within a range from 15° C. and 80° C.

In some embodiments, the steps of transitioning the perovskite material to a photo-sensitive phase and transitioning the metastable intermediate state to a halide perovskite crystal film occur within a range from 5 seconds to 60 seconds.

In some embodiments, the halide perovskite material is any one of: a single crystal, a polycrystal, or a precursor powder mixture of $(LA)_2(SA)_{n-3}BX_{3n+1}$ or $ABX_3$ perovskite, where LA, SA, A are a chemical with amine group, B is a metal element, and X is halogen.

In some embodiments, the amine is a solvent chemical with amine groups including any of: ammonia (NH2), methylamine (CH3NH2), or propylamine (CH3(CH3) 3NH3) or compounds and functional groups that contain a basic nitrogen atom with a lone pair.

In some embodiments, the volatile solvent is a volatile solvent with boiling point <100° C.

In some embodiments, the method involves ultrasonication of the halide perovskite material, or stirring of the precursor powder.

In some embodiments, transitioning the perovskite material to a photo-sensitive phase involves spontaneous escape of the amine molecules and evaporation of the volatile solvent.

In some embodiments, transitioning the metastable intermediate state to a halide perovskite crystal film occurs without post-processing procedures.

In some embodiments, transitioning the metastable intermediate state to a halide perovskite crystal film occurs without thermal annealing.

In some embodiments, the metastable intermediate state exhibits an optical bandgap larger than an optical bandgap of the halide perovskite material before forming the metastable intermediate state.

In some embodiments, the method involves increasing interplanar $\{00\ell\}$ spacing via the amine molecules inserting into the perovskite crystallographic lattice.

In some embodiments, the metastable intermediate state exhibits an $\{00\ell\}$ interplanar distance larger than an $\{00\ell\}$ interplanar distance of the halide perovskite material before forming the metastable intermediate state.

In some embodiments, the amine molecules insert between neighboring $[BX_{6]4}^-$ octahedral sheets.

In some embodiments, transitioning the perovskite material to a photo-sensitive phase involves reduction of interplanar $\{00\ell\}$ spacing to facilitate crystallographic lattice collapse to form the photo-sensitive phase.

In some embodiments, the halide perovskite crystal exhibits an $\{00\ell\}$ orientation with a Lotgering factor of 80% to 100%.

In some embodiments, the method involves generating a thin film of the halide perovskite crystal via spin-coating or blade coating.

In some embodiments, the thin film of the halide perovskite crystal exhibits a diffusion length on the order of from a nanometer to a micrometer scale.

In some embodiments, the thin film of the halide perovskite crystal exhibits densely packed hexagonal grains with an average size within a micrometer scale.

In some embodiments, the method involves generating an optoelectronic device comprising the thin film.

In some embodiments, the volatile solvent is any one of: an organic solvent, water, ethanol, or tetrahydrofuran.

Further features, aspects, objects, advantages, and possible applications of the present invention will become apparent from a study of the exemplary embodiments and examples described below, in combination with the Figures, and the appended claims.

BRIEF DESCRIPTION OF THE FIGURES

The above and other objects, aspects, features, advantages, and possible applications of the present invention will be more apparent from the following more particular description thereof, presented in conjunction with the following drawings. It should be understood that like reference numbers used in the drawings may identify like components.

FIG. 12A is an illustrative bandgap reduction and FIG. 12B is the corresponding experimental photoluminescence (PL) change upon time-development during film drying process. FIG. 12C is a time-integrated PL-map comparison between dried crystal and drying intermediate. FIG. 12D is a thermogravimetric analysis (TGA) of RT isothermal crystallization ink coupled with an in-situ mass spectroscopy (MS) investigation shown in FIG. 12E. FIG. 12F is a schematic illustration of the amine escaping from the lattice of intermediate perovskite during the drying. FIG. 12G is an XRD comparison between final crystal and intermediate perovskite.

FIG. 15A is an UV-vis absorbance spectra. FIG. 15B is the corresponding Tauc plot. FIG. 15C is a picture showing the single-crystal of $MA(A)_nPb(I_{1-x}Cl_x)_3$. FIG. 15D is an XRD spectra of $MA(A)_nPb(I_{1-x}Cl_x)_3$ thin film, displaying strong $(00\ell)$ orientation. FIGS. 15E and 15F are the corresponding PXRD and crystallographic lattice model scheme, respectively.

FIG. 20C shows exciton diffusion length versus PL lifetime quenching ratios. Conventional device performance is shown in FIGS. 20D-F. FIG. 14D is a cross-sectional SEM image of a whole n-i-p device using RT-perovskite. FIG. 20E shows: (i) J-V characteristics and (ii) static current density at maximal output power point and corresponding PCE measured as a function of time for both RT-perovskite and TA-perovskite based n-i-p device. FIG. 20F shows statistics of photovoltaic parameters of perovskite solar cells using RT-perovskite and TA-perovskite. Inverted device performance is shown in FIGS. 20G-I. FIG. 20G shows a cross-sectional SEM image of the whole p-i-n device using RT-perovskite. FIG. 20H shows: (i) J-V characteristics and (ii) static current density at maximal output power point and corresponding PCE measured as a function of time for both RT-perovskite and TA-perovskite based p-i-n device. FIG. 20I shows statistics of photovoltaic parameters of perovskite solar cells using RT-perovskite and TA-perovskite.

FIG. 30A are snapshots of optical microscopic images on the nucleation at different time. FIG. 30B shows nuclei density (obtained from counting the nuclei numbers in a specific region) vs. time. FIG. 30C shows the first derivative of nuclei density-time plot, which corresponds to the nucleation rate vs. time.

FIGS. 31A-31C show results of an in-situ study on the crystal growth of the $MAPb(I_{1-x}Cl_x)_3$. FIG. 31A is snapshots of optical microscopic images on a growing crystal at different times. FIG. 31B is a plot of $r_t/\eta_f$ vs. t, where the instant radius is measured at each time on the optical image by using image) software. FIG. 31C is a plot of log(−ln(1−V(t))) vs. log (t) to investigate the Avrami constants

DETAILED DESCRIPTION OF THE INVENTION

The following description is of an embodiment presently contemplated for carrying out the present invention. This description is not to be taken in a limiting sense but is made merely for the purpose of describing the general principles and features of the present invention. The scope of the present invention should be determined with reference to the claims.

Figure 2:
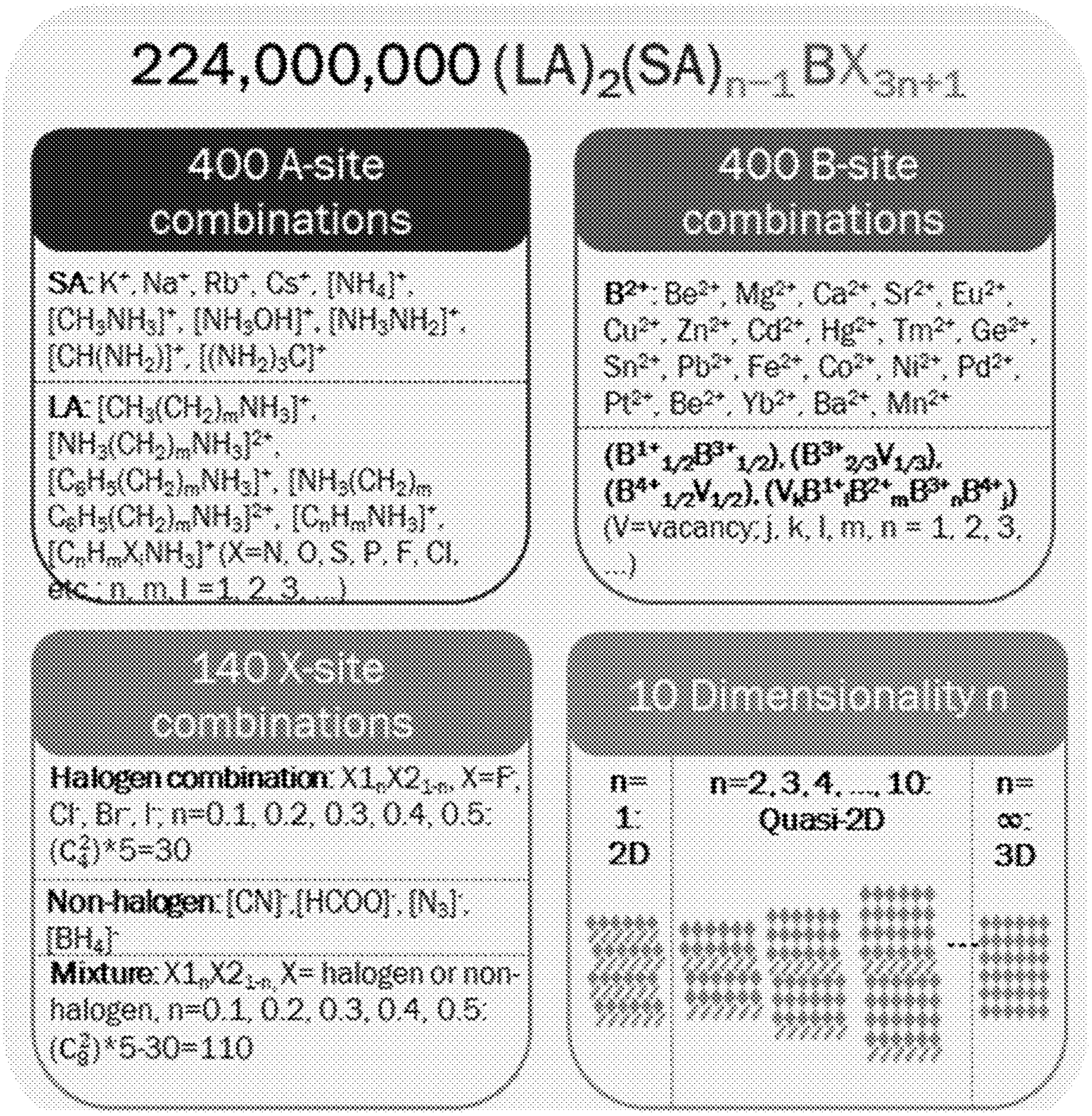
FIG. 2 shows exemplary halide perovskite material compounds.
Figure 3:
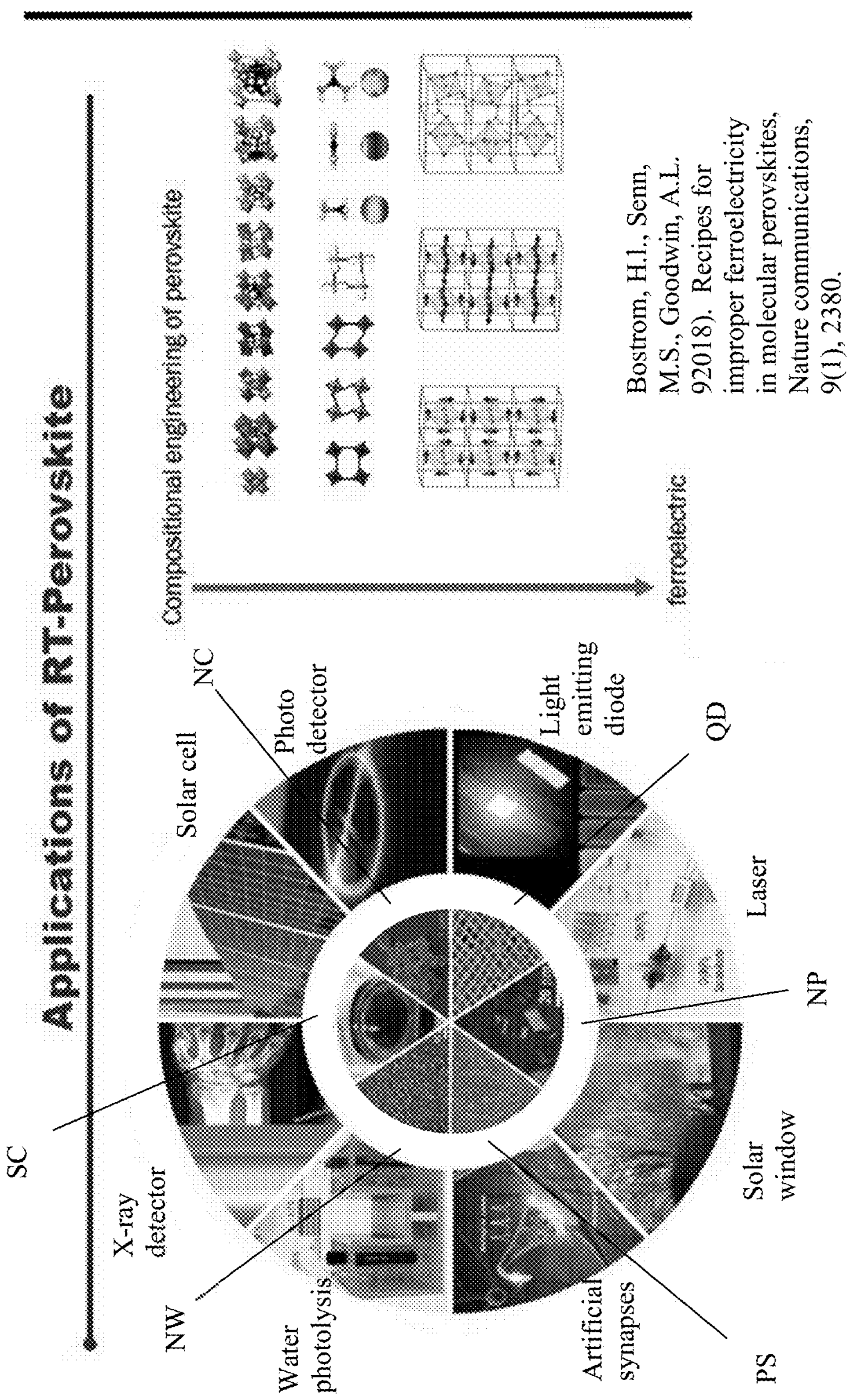
FIG. 3 shows exemplary applications of halide perovskite materials.

Embodiments relate to perovskites, perovskite structured compounds, perovskite structure compounds that include a halide perovskite material of $(LA)_2(SA)_{n-3}BX_{3n+1}$ or $ABX_3$ (with A, B, X being one or combination chosen from FIG. 2). Embodiments also relate to solar cells, photodetectors, memristors, light emitting diode (LED), lasers, X-ray and high energy sensors, artificial retina, image sensory devices and other optoelectronic devices (exemplified in FIG. 2) that utilize abovementioned perovskite structured material and methods of making and using the same.

Figure 1:
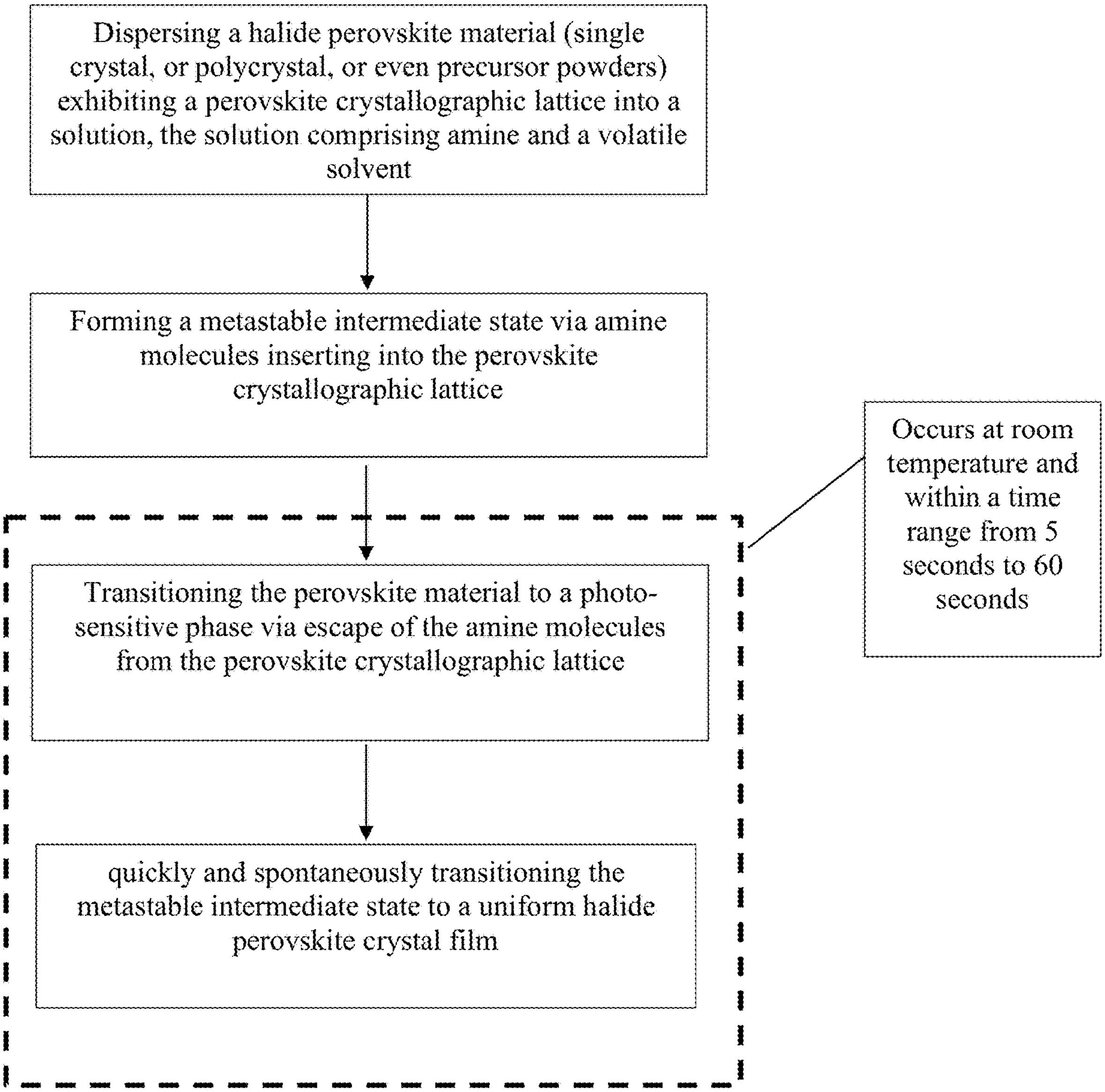
FIG. 1 shows an exemplary method for a halide perovskite crystal.

Referring to FIG. 1, an exemplary method for forming a halide perovskite crystal can involve dispersing a perovskite material exhibiting a perovskite crystallographic lattice into a solution. The perovskite material can include a single crystal, polycrystal, precursor powder, etc. The solution can include amine and a volatile solvent. The method can involve forming a metastable intermediate state via amine molecules inserting into the perovskite crystallographic lattice. The method can involve transitioning the perovskite material to a photo-sensitive phase (e.g., a tetragonal β-phase) via escape of the amine molecules from the perovskite crystallographic lattice. This transitioning step to a photo-sensitive phase can involve spontaneous escape of the amine molecules and evaporation of the volatile solvent. The method can involve transitioning the metastable intermediate state to a halide perovskite crystal, which can be a uniform halide perovskite crystal film. This transitioning step to a halide perovskite crystal can occur without post-processing procedures or without thermal annealing. The steps of transitioning the perovskite material to a photo-sensitive phase and transitioning the metastable intermediate state to a halide perovskite crystal can occur at room temperature (e.g., occur at a temperature within a range from 15° C. and 80° C.). Furthermore, the steps of transitioning the perovskite material to a photo-sensitive phase and transitioning the metastable intermediate state to a halide perovskite crystal can occur within a range from 5 seconds to 60 seconds.

As will be explained herein, the amine molecules inserting into the perovskite crystallographic lattice can increase interplanar {00ℓ} spacing. For instance, the amine molecules can insert between neighboring $[PbI_6]^{4-}$ octahedral sheets such that the metastable intermediate state can expand the interplanar {00ℓ} distance (e.g., in $MAPbI_3$ system the distance can be 12.33 Å and in other systems the distance can be even larger depending on the added amine molecules). Many variations of MAPbI3 can be simply obtained by substituting on the MA site (e.g. Cs, FA) and on the Pb-site (e.g. Sn, Bi). The transitioning of perovskite material to a photo-sensitive phase involves reduction of interplanar {00ℓ} spacing to facilitate crystallographic lattice collapse to form the photo-sensitive phase. The result can lead to a halide perovskite crystal exhibiting an {00ℓ} orientation with a Lotgering factor of 80% to 100%.

The crystal halide perovskite material can be any one of: a) single crystals or b) polycrystals or c) even precursor powder mixtures of $(LA)_2(SA)_{n-3}BX_{3n+1}$ or $ABX_3$ perovskite, where LA, SA, A are a chemical with amine group, B is a metal element, and X is halogen. There are many possibilities in this formulation as described in FIG. 2.

The amine in the ink system can be any of solvent chemicals with amine groups such as ammonia ($NH_2$), methylamine ($CH_3NH_2$), or propylamine ($CH_3(CH_3)_3NH_3$) or compounds and functional groups that contain a basic nitrogen atom with a lone pair. The volatile solvent can be any of volatile solvents with boiling point <100° C., such as water, ethanol, isopropanol, or other organic solvent such as tetrahydrofuran.

Some embodiments involve generating a thin film of the halide perovskite crystal. This can be via spin-coating or blade coating. The thin film of the halide perovskite crystal can exhibit a diffusion length on the order of nanometer scale to micrometers (e.g., using $MAPbI_3$, it could reach 2.8~2.9 μm). In addition, the thin film of the halide perovskite crystal can exhibit densely packed hexagonal grains with grain size from nanometer to micrometers (e.g., using $MAPbI_3$ an average size of ca. 700 nm can be easily obtained).

Embodiments of the thin film of halide perovskite crystal can be used to fabricate an optoelectronic device. For instance, the optoelectronic device can include a thin film of the halide perovskite crystal fabricated via the inventive method. The highly ordered lattice packing of the thin film (e.g., the halide perovskite crystal of the thin film exhibiting an {00ℓ} orientation with a Lotgering factor of at least 97%.) reduces disordered electronic states, induces a higher charge transport property for the optoelectronic device, and provides for long diffusion length for the optoelectronic device. Thus, the out-of-plane direction of the thin film has a single large grain—i.e., photogenerated carriers only transport within one single perovskite grain to reach corresponding and do not encounter grain boundary. As will be demonstrated herein, an optoelectronic device having a thin film of perovskite material made via the inventive method can exhibit a PCE of 22.10±0.49% (mean±standard deviation).

Figure 4:
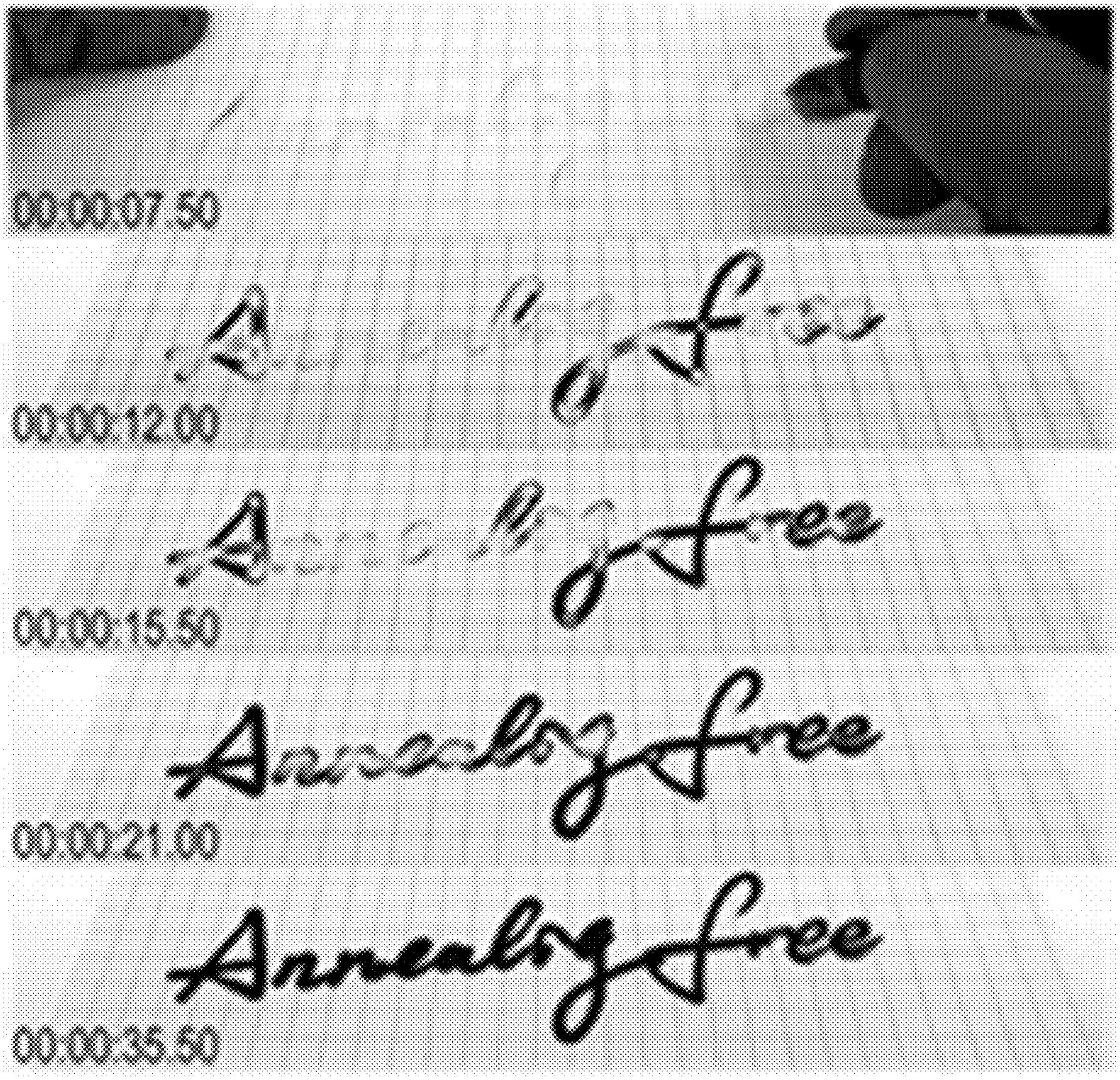
FIG. 4 illustrates snapshots showing the rapid RT-isothermal crystallization during handwriting on a paper.
Figure 5:
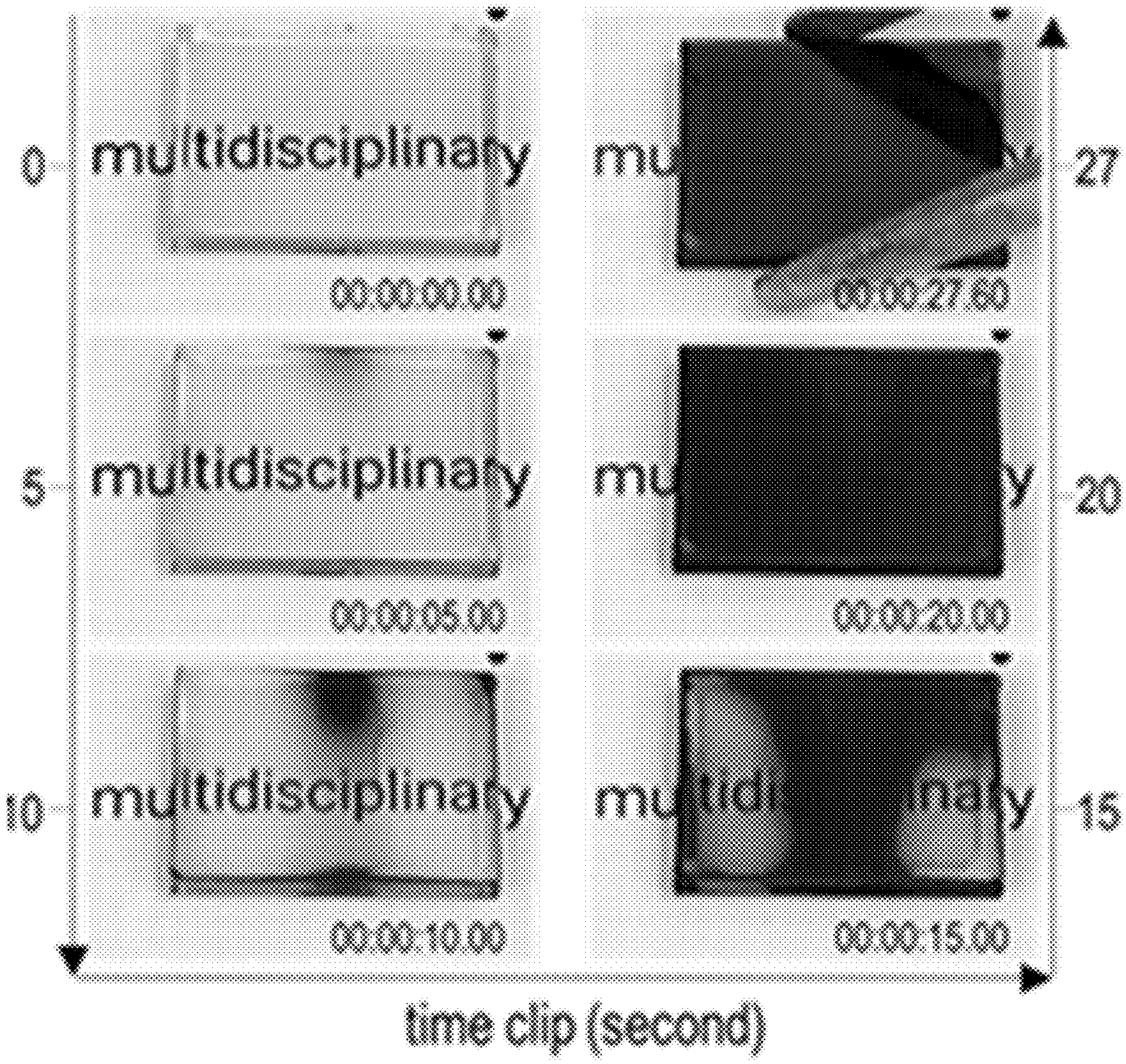
FIG. 5 illustrates snapshots showing the rapid RT-isothermal crystallization in a blade-coated film application.
Figure 8:
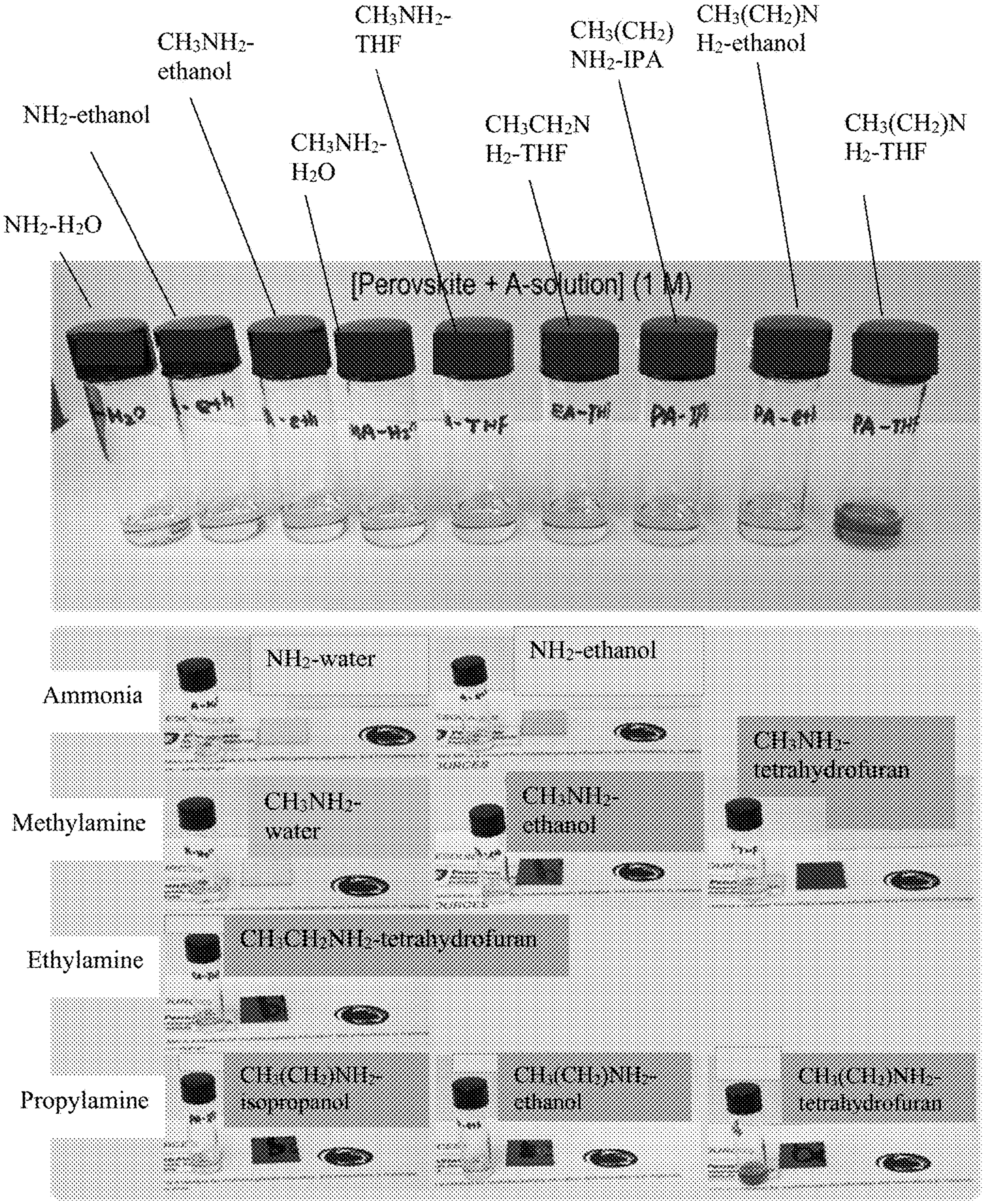
FIG. 8 shows photographs of multiple amine-based RT-ink. The top photograph shows different amine-based inks. The bottom photograph shows different RT-inks and their corresponding writing and RT-perovskite thin film results.

FIG. 4 provides the evidence of the effectiveness of the inventive synthesis process. Text can be written on paper by using this rapidly crystallizing perovskite ink at RT, and this text is crystallized within seconds. This writing can be accomplished even at high relative humidity (RH) of ~90%. Various amine (R—$NH_2$) molecules coupled with different volatile solvents can be used for preparing the ink, and the resulting ink can be used for a wide range of ink systems. The options include methylamine, ethylamine and propylamine with solvent of ethanol, isopropanol and tetrahydrofuran (see FIG. 8). Both doctor-blade-coating and spin-coating processes have been attempted and the film fabrication is found to be complete within 30 seconds (see FIG. 5).

Figure 6:
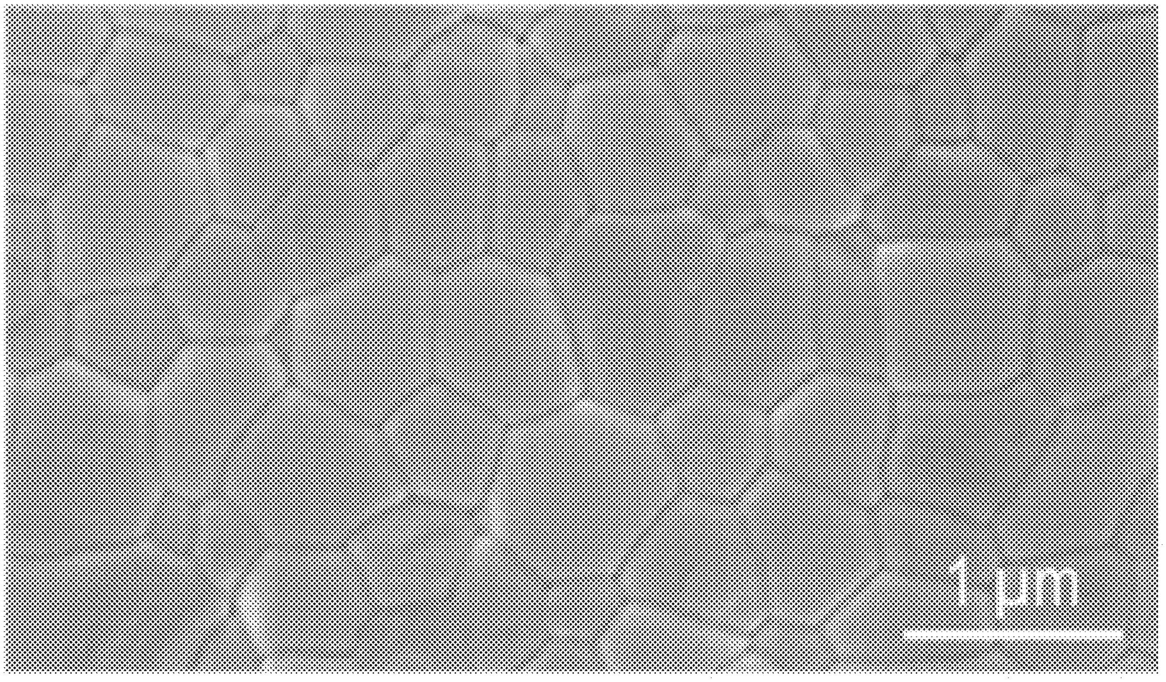
FIG. 6 shows a scanning electron microscopy top view of microscopic features of a RT isothermally crystallized film.
Figure 7:
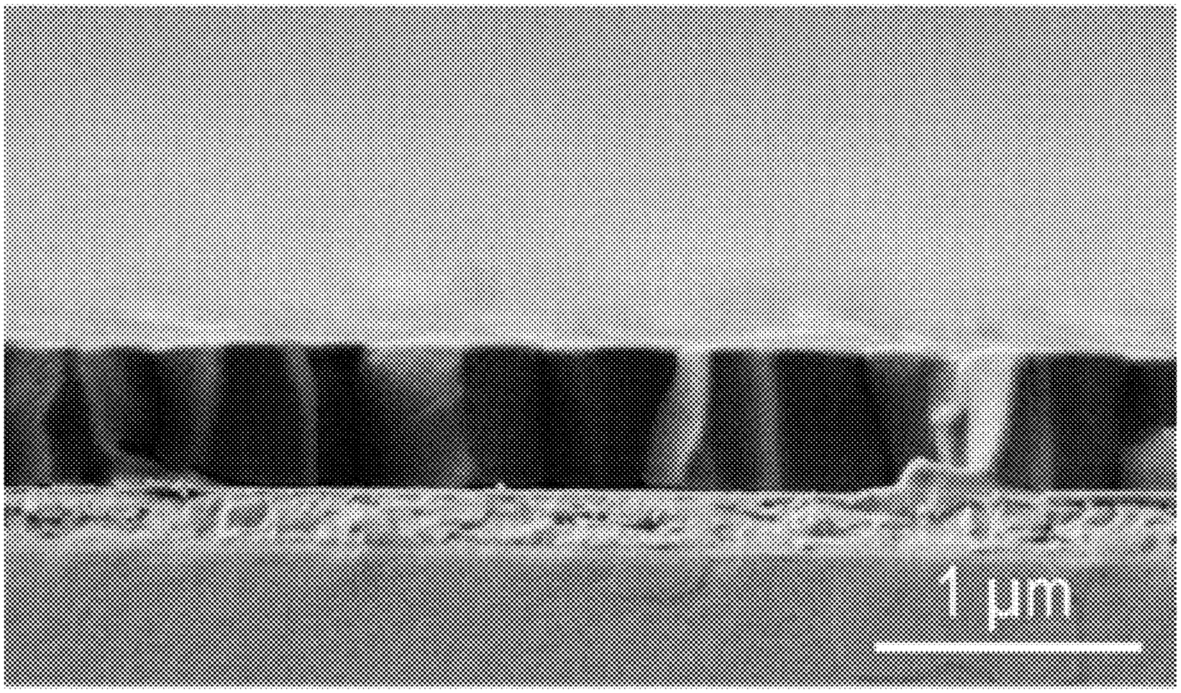
FIG. 7 shows a scanning electron microscopy cross-sectional view of microscopic features of a RT isothermally crystallized film.
Figure 9:
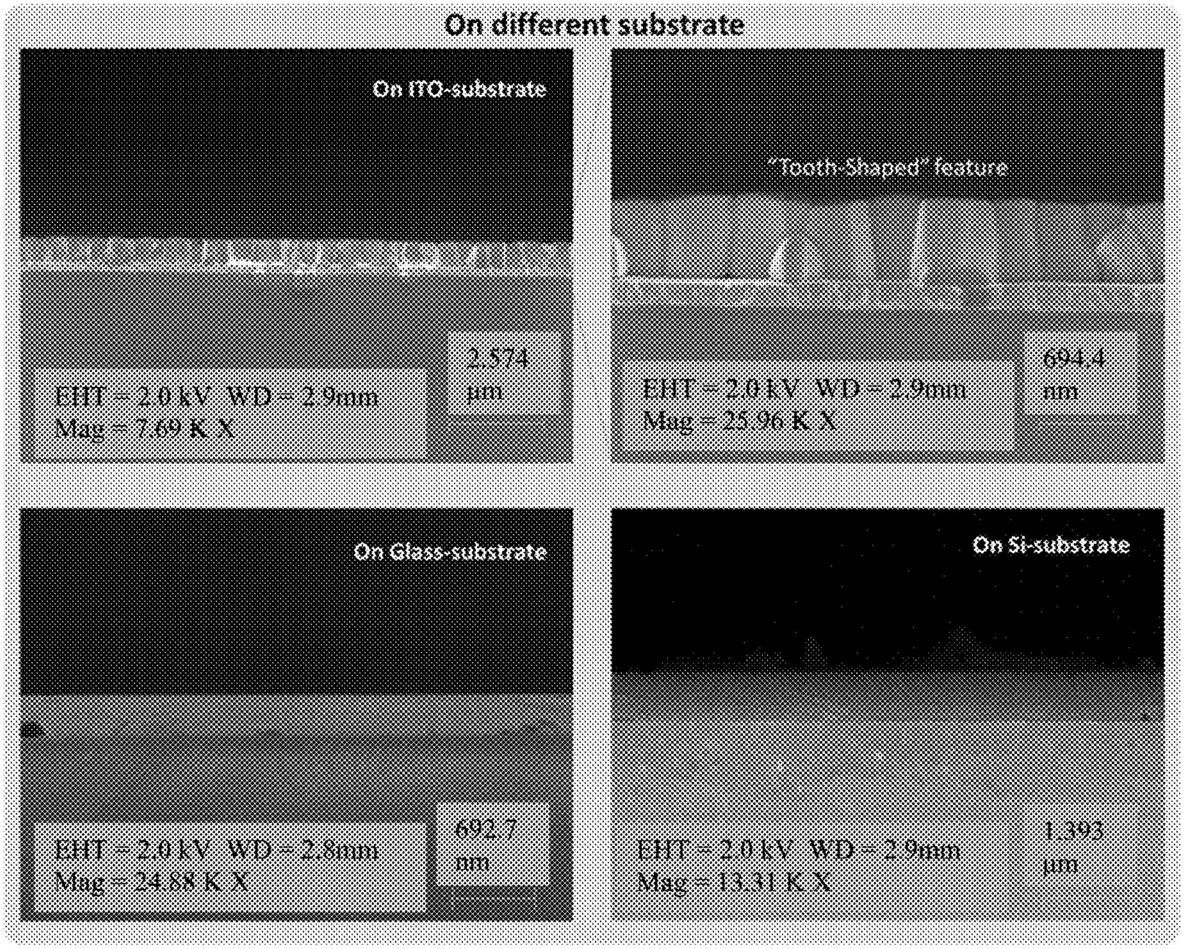
FIG. 9 shows cross-sectional images of RT-perovskite on different substrates.
Figure 10:
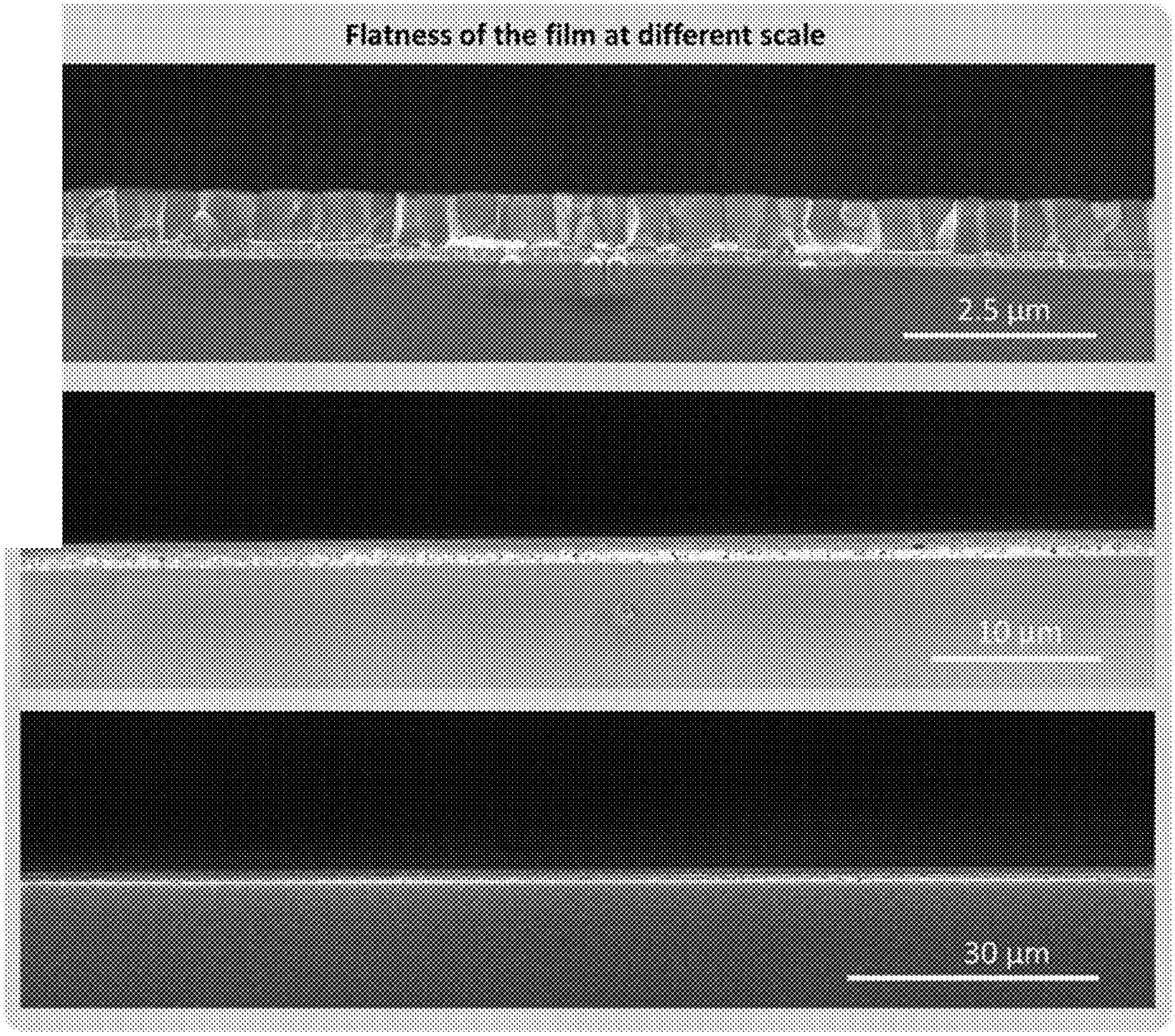
FIG. 10 is a larger scale cross-sectional SEM images of RT-perovskite thin film showing good film surface flatness and thickness uniformity.

The crystallization mechanism has been studied in detail using in-situ optical microscopic study. The RT isothermal crystallization follows the classic nucleation and crystal growth theory, and the Avrami equation developed for the isothermal conditions is used to reveal the kinetic nature of the crystallization. An Avrami constant (n) has been obtained with a value of n=3.63>3, suggesting that the crystal growth involves athree-dimensional growth with a rapid nucleation due to the fast supersaturation. Scanning electronmicroscopy (SEM) analysis shows that the RT isothermally crystallized perovskites (RT-perovskite) exhibit film morphology consisting of densely packed hexagonal grains with an average size of ca. 700 nm (see FIG. 6). In the out-of-plane direction, there is only a single large grain (see FIG. 9—note there is a high-level uniformity for the resultant RT-perovskite thin films) throughout the film (see FIG. 7), suggesting a well-aligned crystal growth during the RT isothermal process. These vertically aligned single grains in the film secure the efficient out-of-plane flow of charge carriers in two-terminal PV cells, as the photo generated carriers only transport within one single perovskite grain to reach corresponding electrodes and do not encounter grain boundary. Such avoidance of grain boundary minimizes the scattering loss by disorder states and the recombination loss by ionic impurities or traps (Shockley-Read-Hall recombination) located at grain-boundaries. At a larger scope of 10-100 μm, the RT-perovskite film displays an ultra-high uniformity as viewed from the cross-sectional SEM (see FIG. 10) and a specular surface in amacroscopic view (see FIG. 8).

Figure 11:
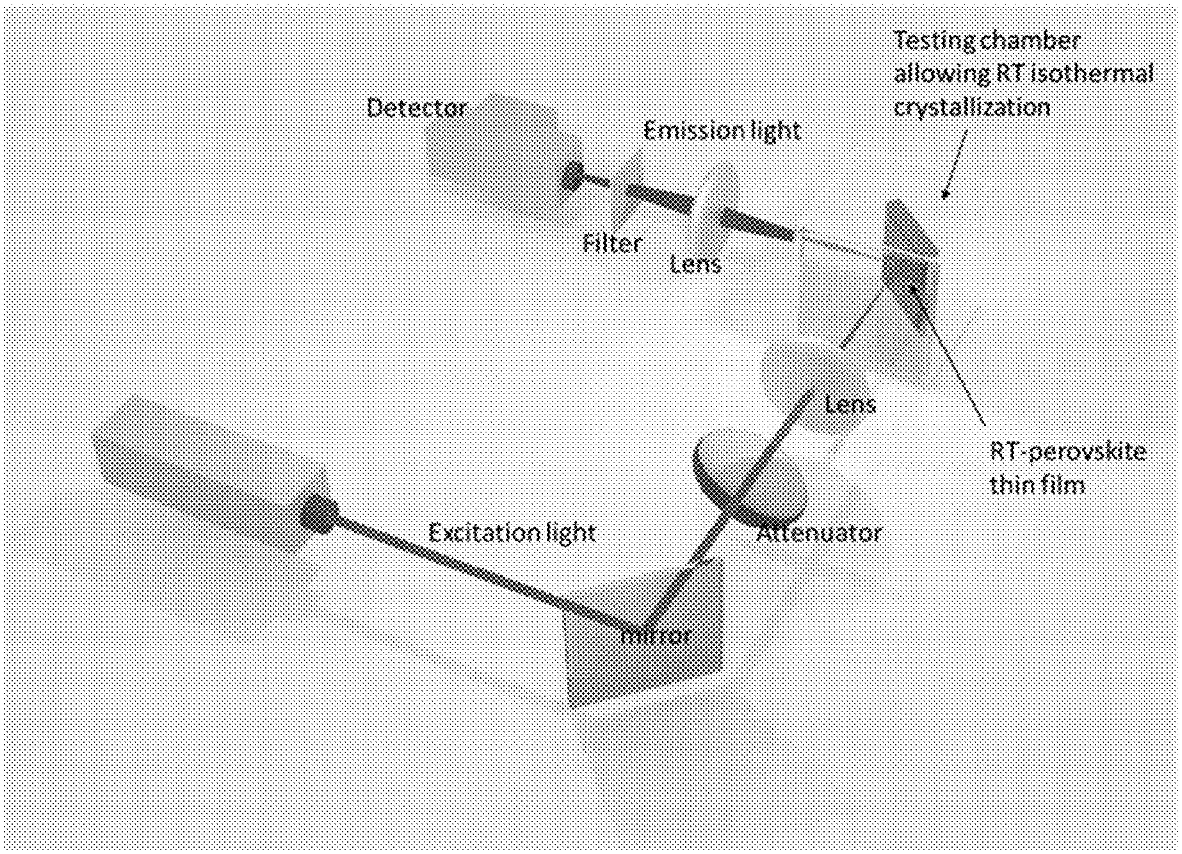
FIG. 11 is a schematic of in-situ PL tracing during the RT isothermal crystallization process.
Figure 12A:
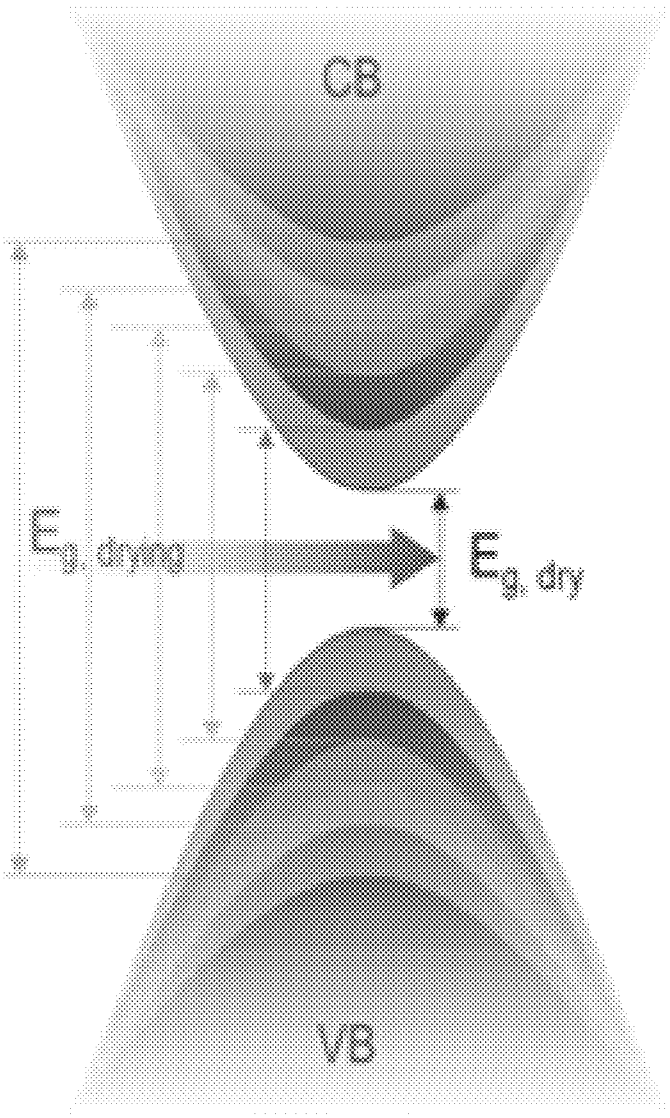
FIGS. 12A-12G show compositional evolution during RT isothermal crystallization.
Figure 12B:
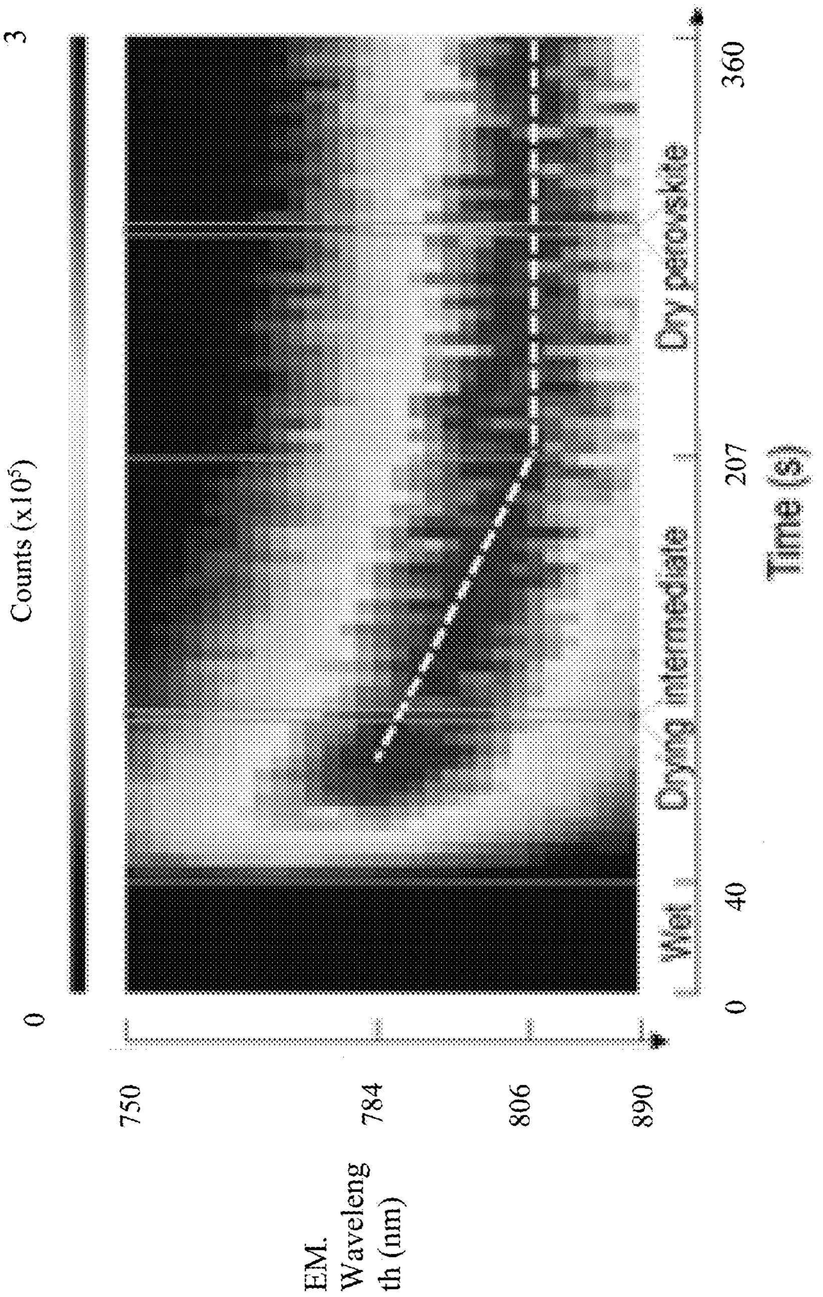

FIG. 11 is a schematic of in-situ PL tracing during the RT isothermal crystallization process. A homemade chamber is utilized to decelerate the crystallization process through filling the volatile gas component identical to those in the RT-ink such that it increases their saturation pressure and mitigates their evaporation rate. To understand the compositional evolution during an embodiment of the RT isothermal crystallization process, we employed an in-situ steady-state photoluminescence (PL) study (see FIG. 11). During the drying of the wet film, there is a notable redshift of the PL peak (see FIG. 12B), indicating a bandgap reduction as schematically depicted in FIG. 12A. As the electronic band structure in momentum space is correlated with the crystallographic structure in real space, this PL change is an indication of the crystallographic phase evolution from some metastable intermediate states to the final tetragonal β-phase states during the RT isothermal crystallization. Based upon the PL emission wavelength, the RT isothermal process can be classified into three states (see FIG. 12B): (i) wet film (from 0 to 40 s, no obvious PL emission), (ii) drying intermediate (from 40 to 207 s, PL gradually red-shifts towards 806 nm) and (iii) dry perovskite (after 207 s, PL peak fixed at 806 nm).

Figure 12C:
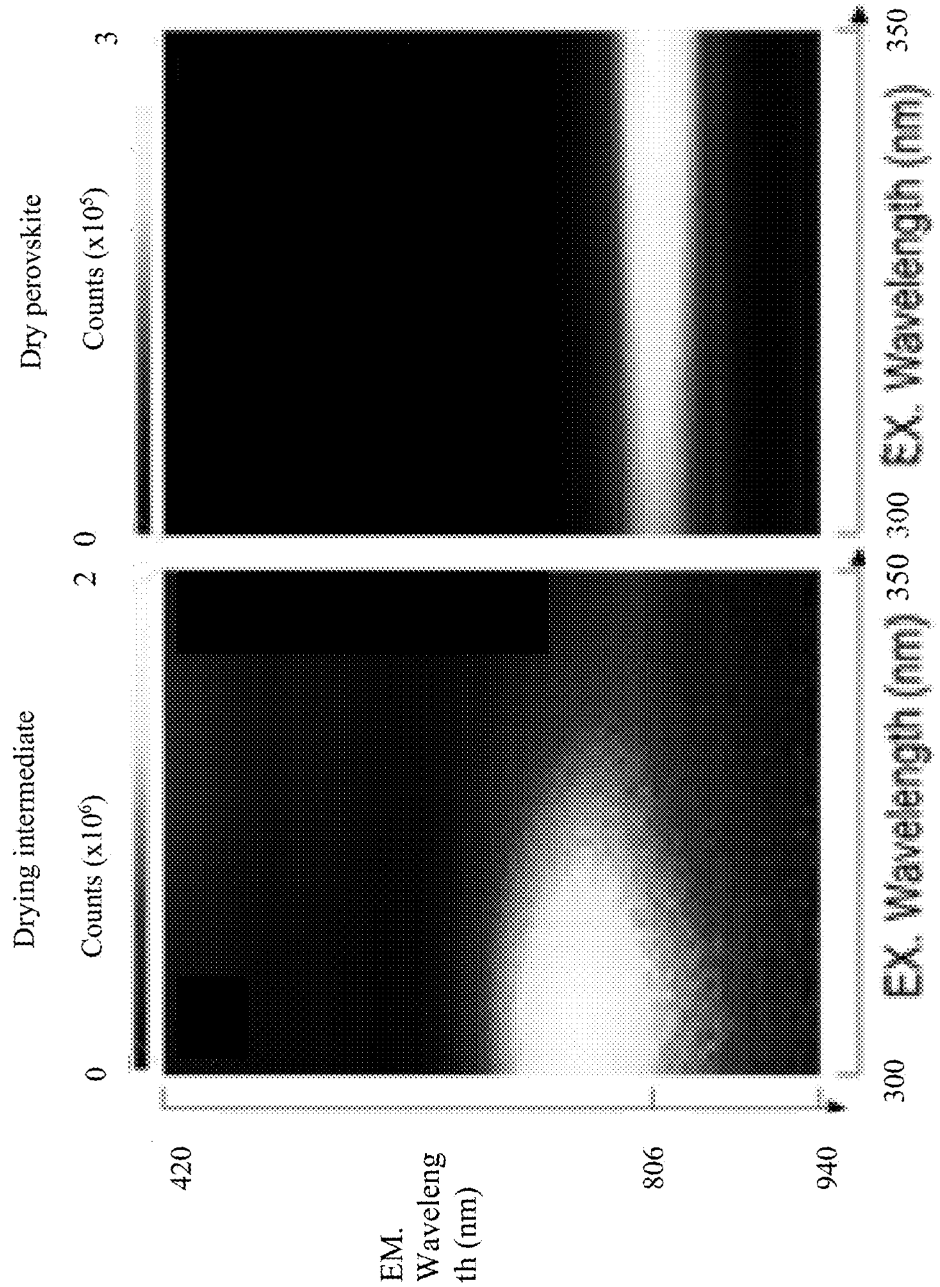

Samples of a drying intermediate and a final dry perovskite films were analyzed to compare their individual PL feature in the excitation-emission map (see FIG. 12C). By exciting with an identical light source with a wavelength range from 300 to 350 nm, the dry perovskite displaysa narrow emission peak at 806 nm. In contrast, the intermediate phase shows a wide emission range peak at a short wavelength around 750 nm, indicating a gradual metamorphosis with largerbandgap.

Figure 12D:
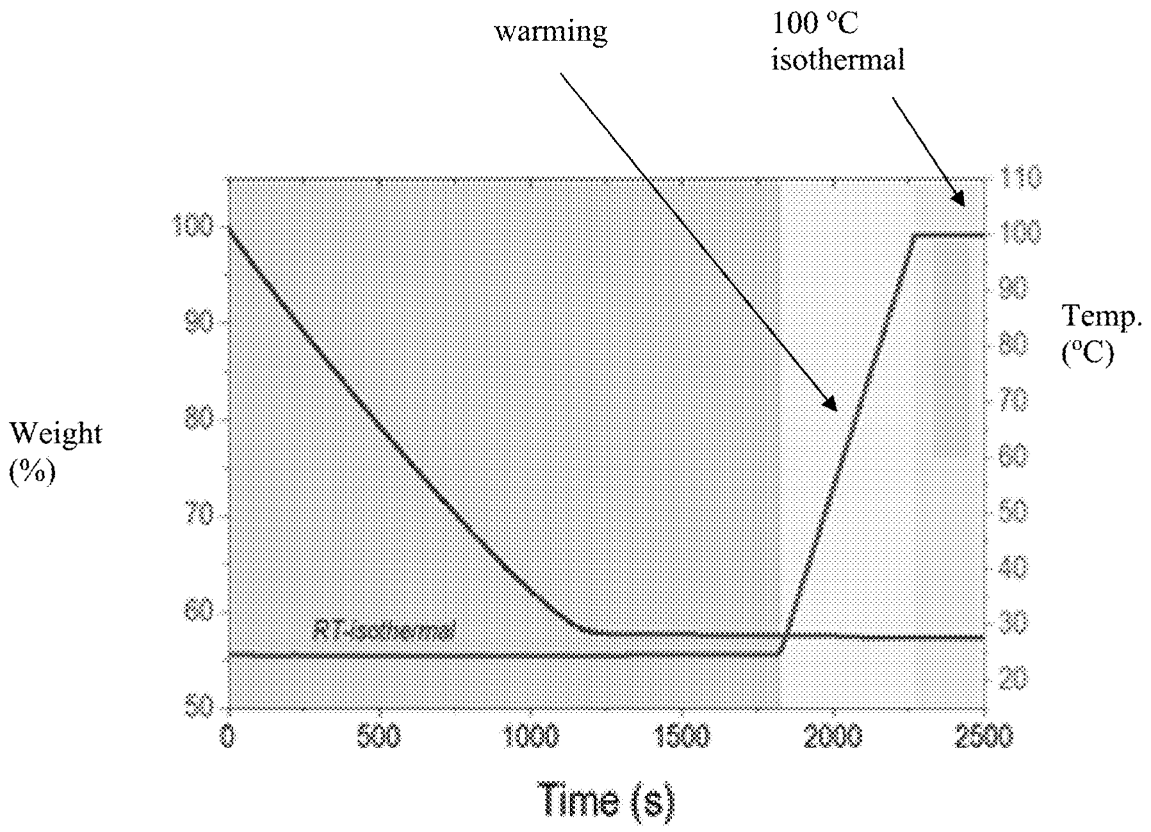
Figure 12E:
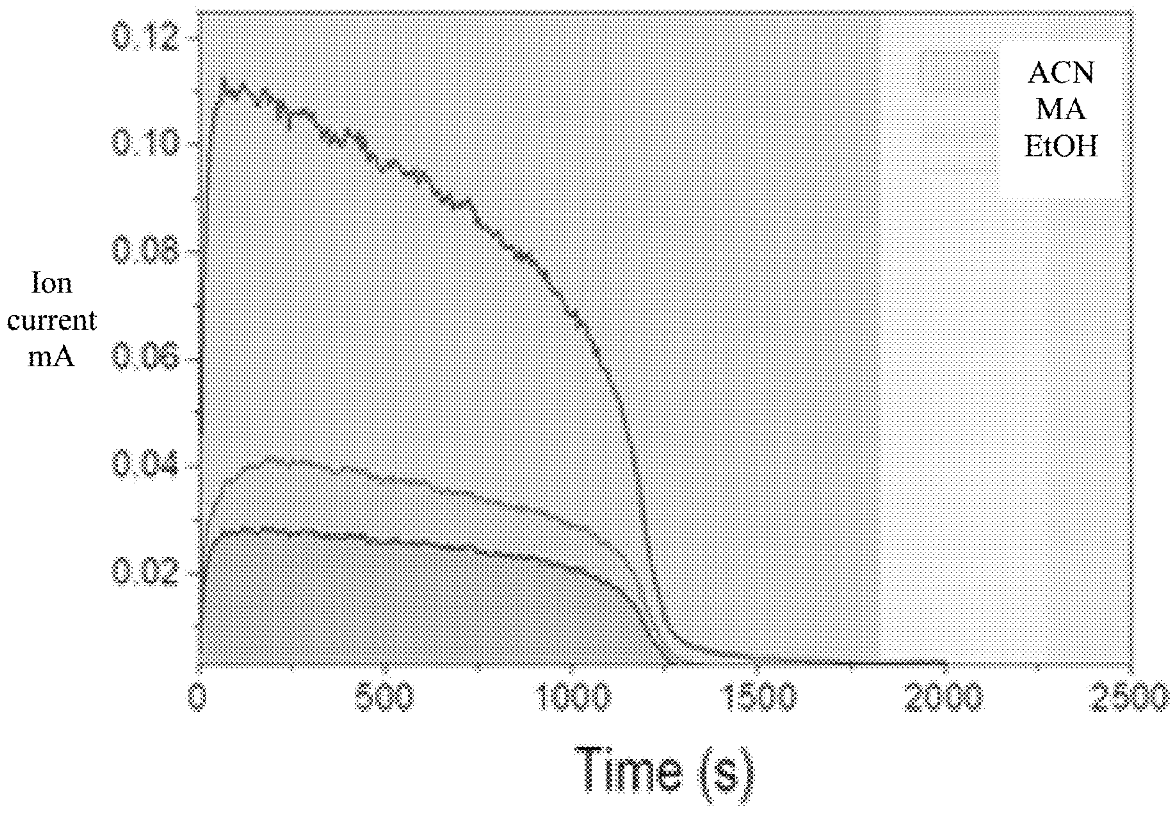

To understand this larger bandgap intermediate phase, characterization of both the chemical and structural fingerprint is done. A thermogravimetric analysis (TGA) coupled with an in-situ mass spectroscopy (MS) technique is employed to trace the whole RT isothermal crystallization process. FIG. 12D shows the TGA and temperature curve, including three thermal steps of RT-isothermal drying (before 1820 s), warming to 100° C. (1820 to 2270 s) and 100° C. isothermal treatment (after 2270 s). During the RT isothermal step, there is a spontaneous weight loss which results from the evaporation of solvents (ACN and EtOH) and the amine (MA, or methylamine), as characterized by the in-situ MS in FIG. 12E. After 1200 s in the RT isothermal process, the weight loss reaches saturation as all the volatile molecules have evaporated. The weight remains constant even after warming up to 100° C. and holding there. This indicates that all the volatile molecules have already evaporated during the RT isothermal drying process. Overall, the final weight ratio remains constant at 57.5 wt. %, which agrees well with the starting concentration of the ink (1.0 M). Such RT isothermal crystallization is quite different from that of conventional TA-perovskite.

Figure 12F:
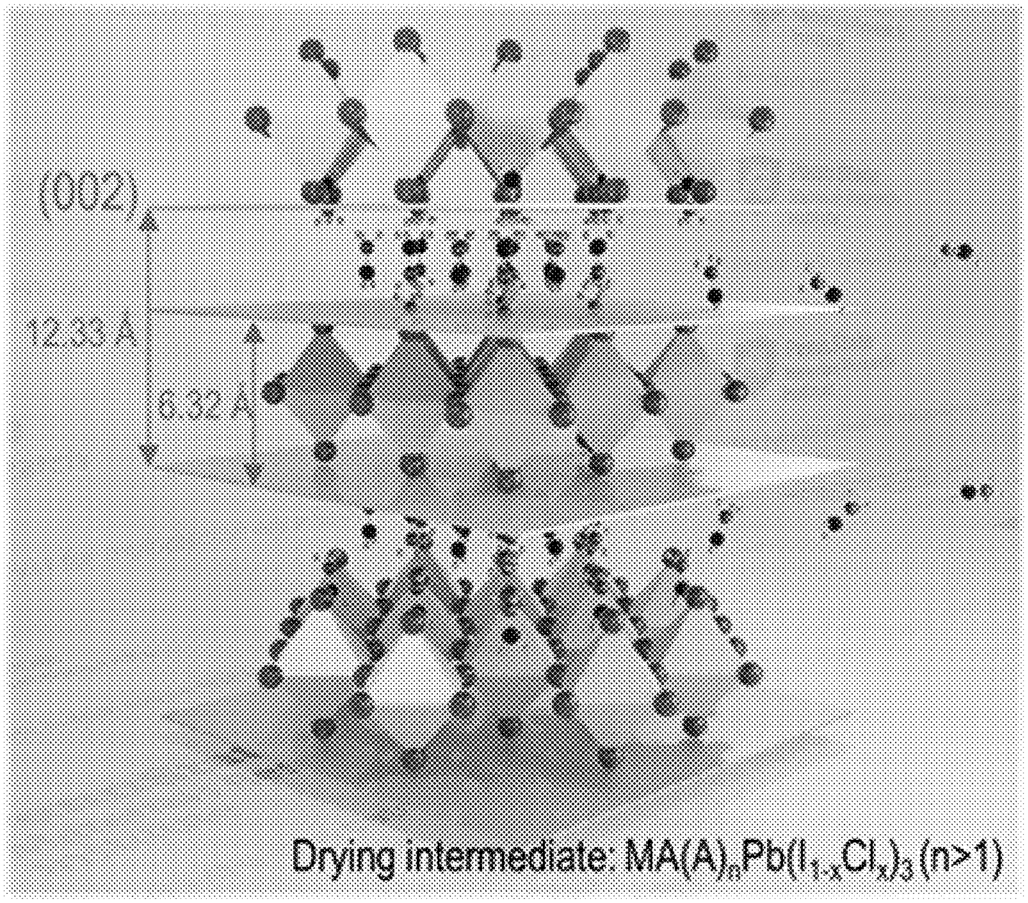
Figure 12G:
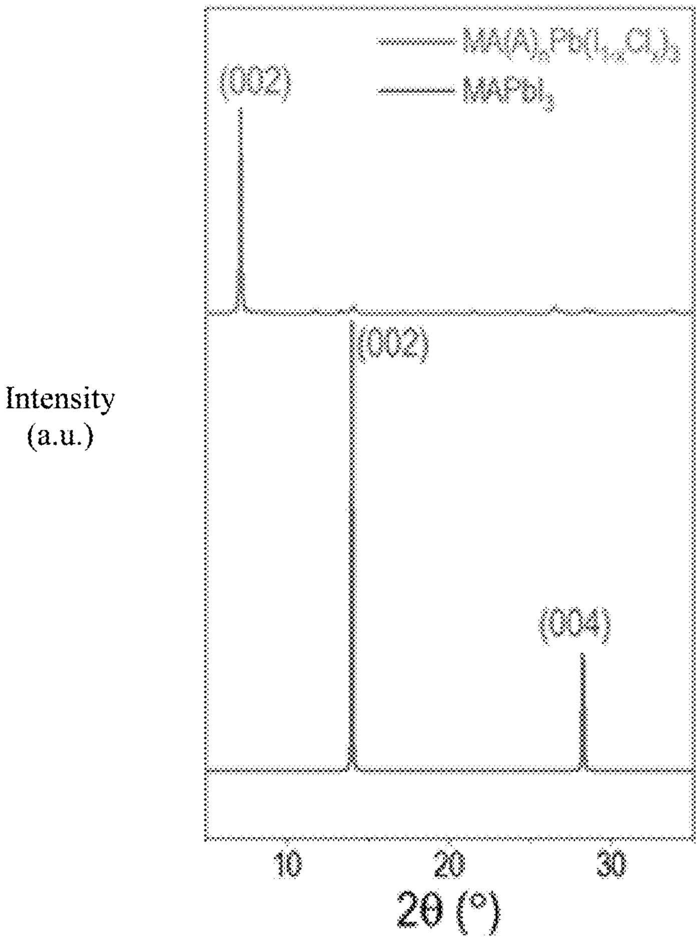
Figure 13A:
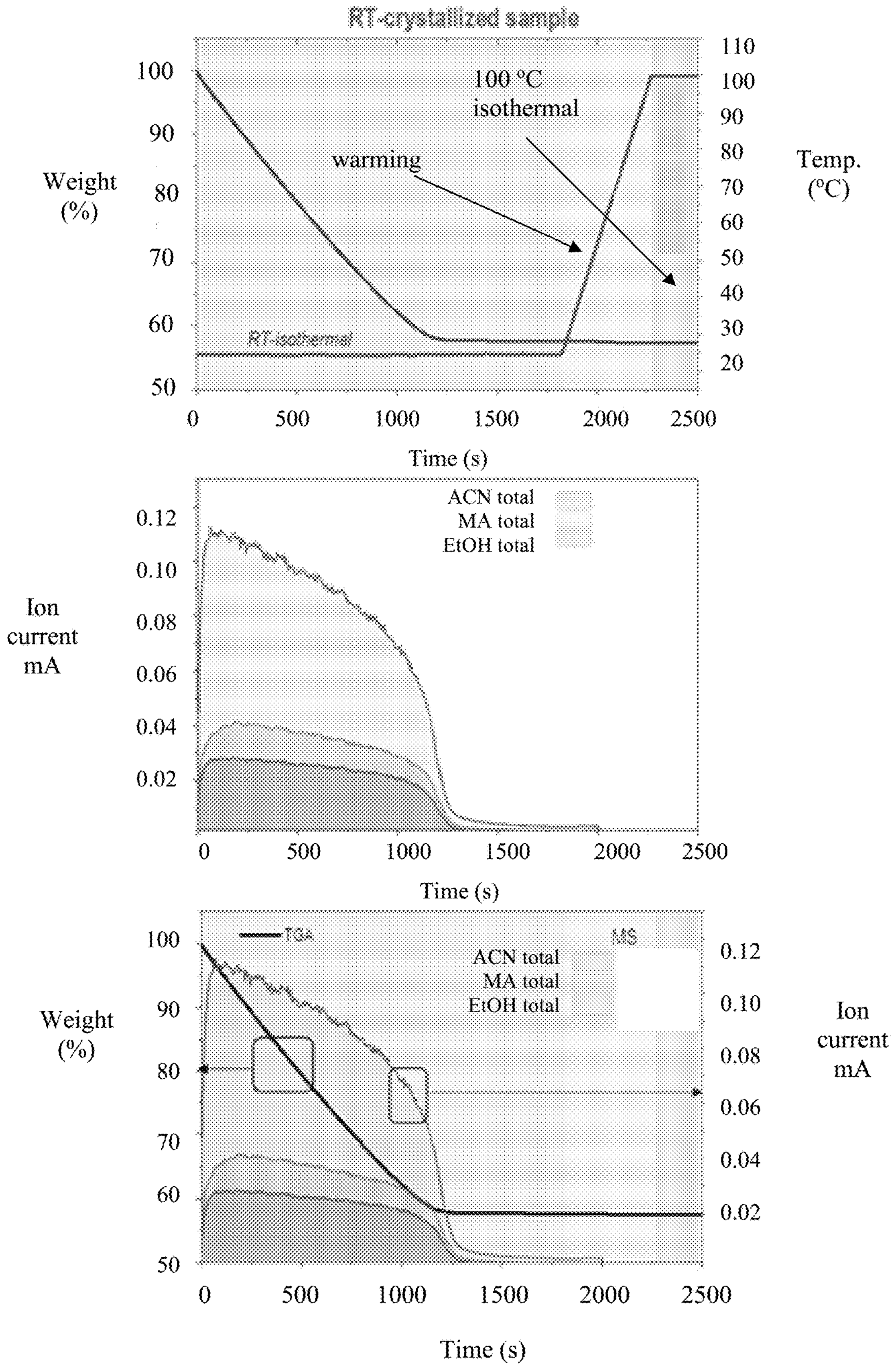
FIG. 13A shows TGA-MS results of RT-perovskite.
Figure 13B:
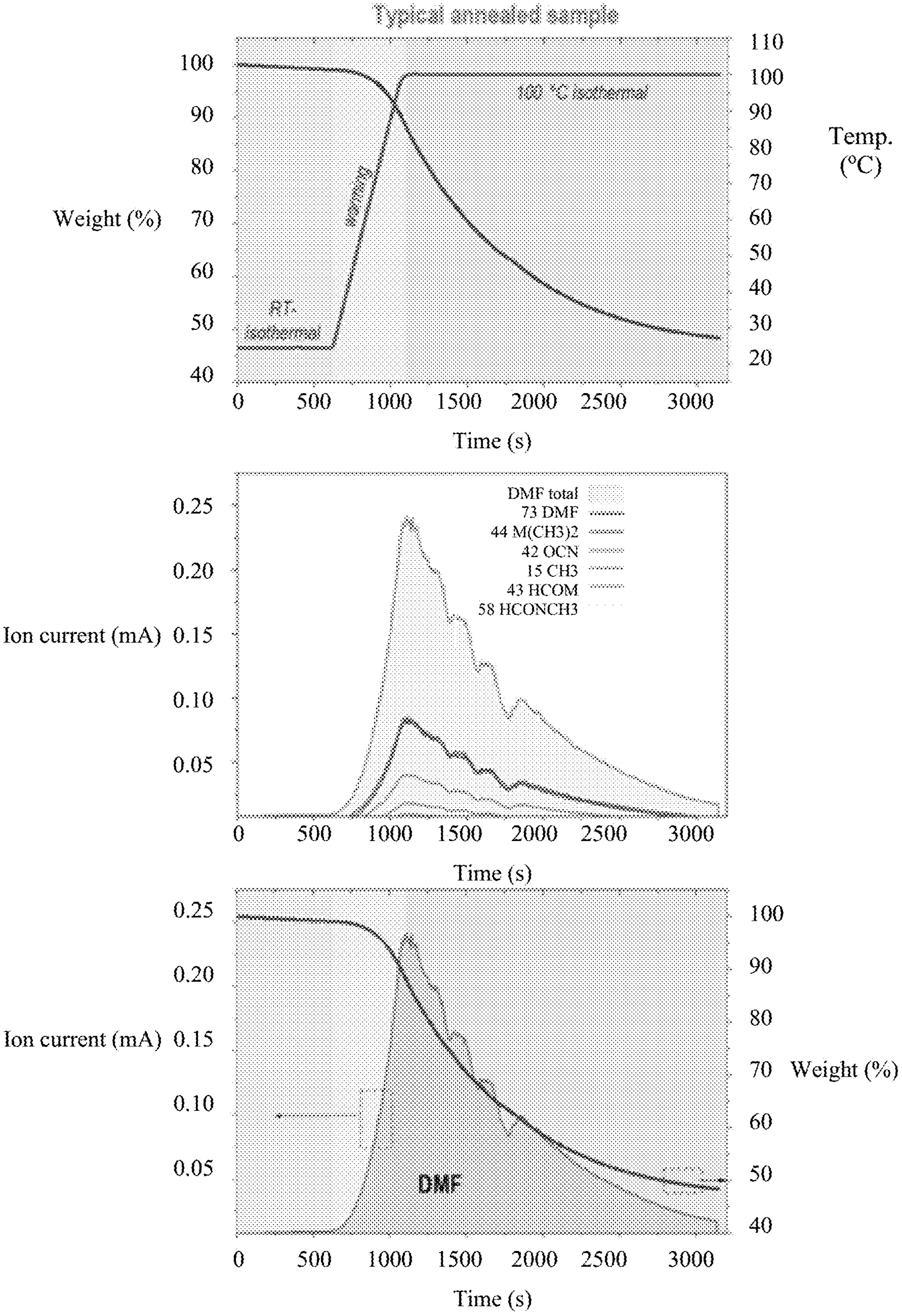
FIG. 13B shows TGA-MS results of TA-perovskite.
Figure 14:
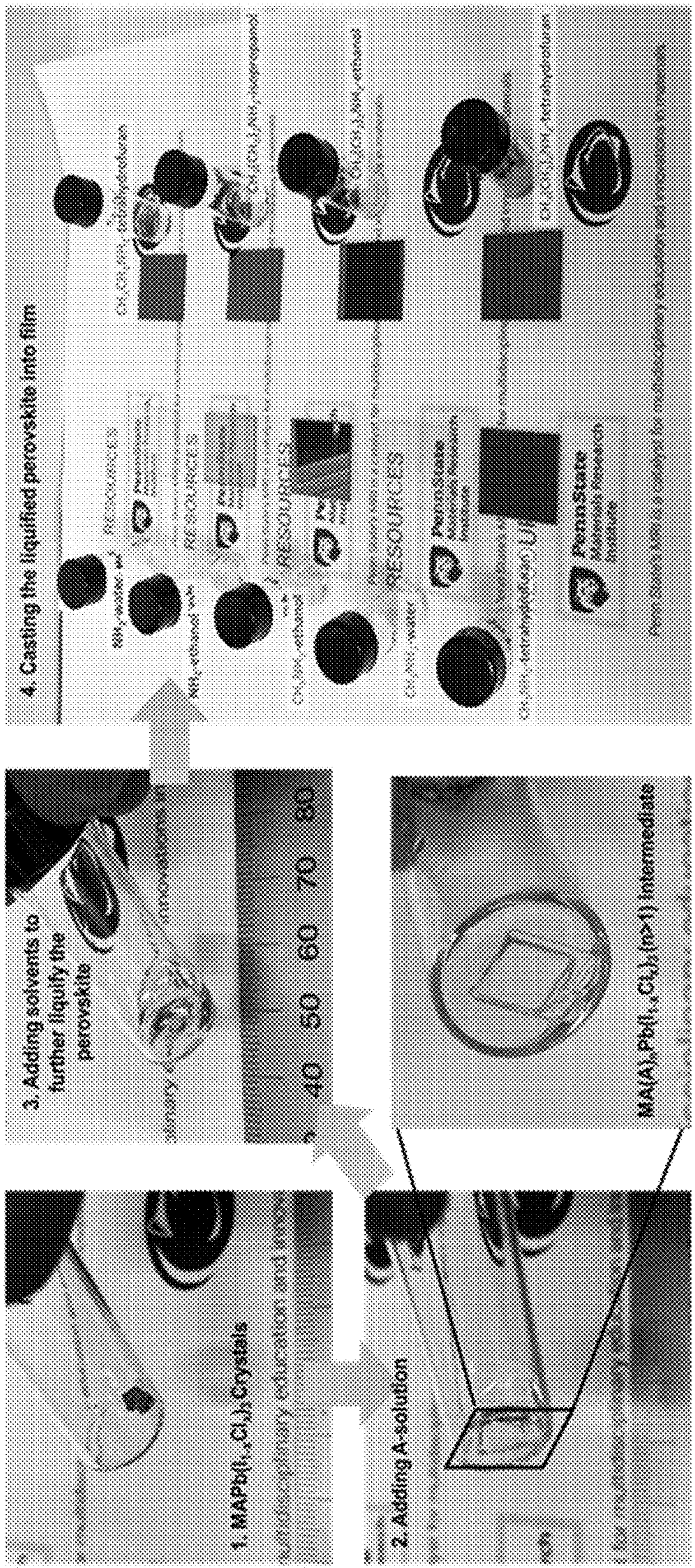
FIG. 14 are photographs showing the RT-ink processing procedures, where a single-crystallineintermediate state has been observed.
Figure 15A:
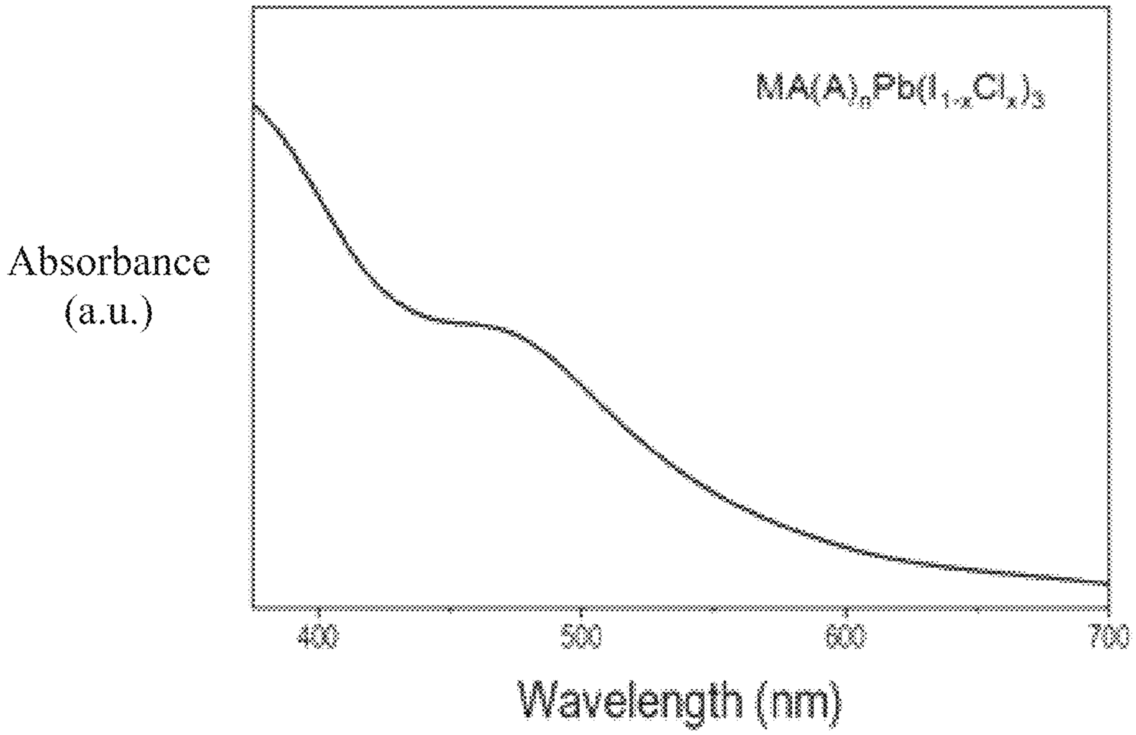
FIGS. 15A-15F show characterizations on the perovskite intermediate crystal of $MA(A)_nPb(I_{1-x}Cl_x)_3$.
Figure 15B:
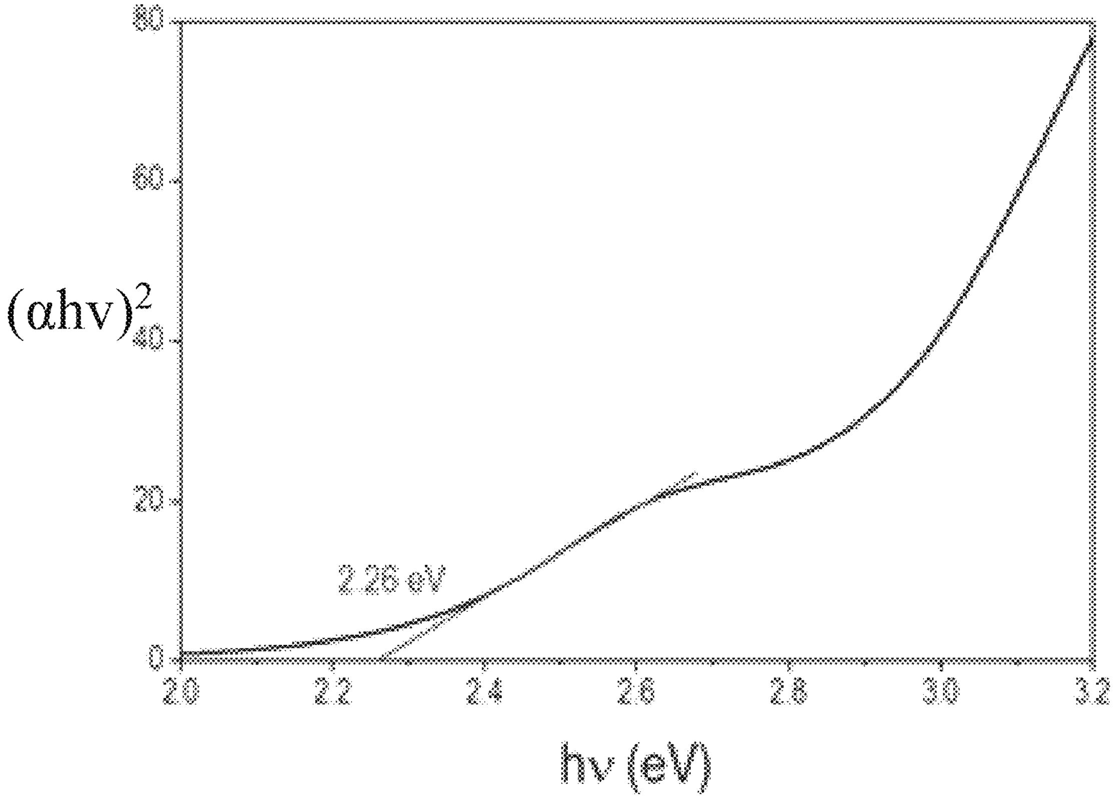
Figure 15C:
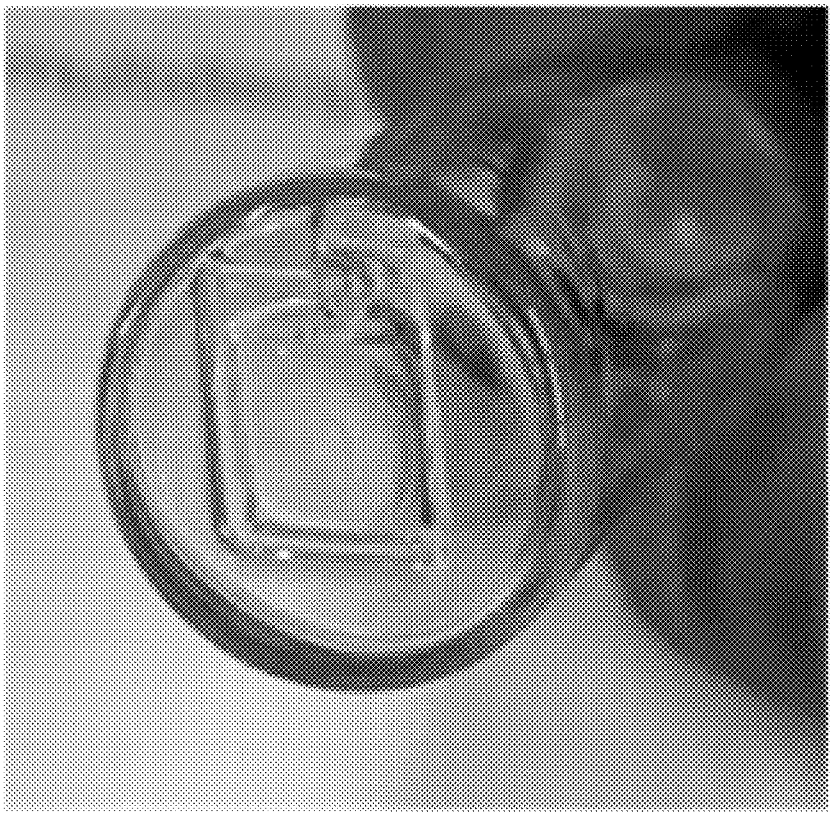
Figure 15D:
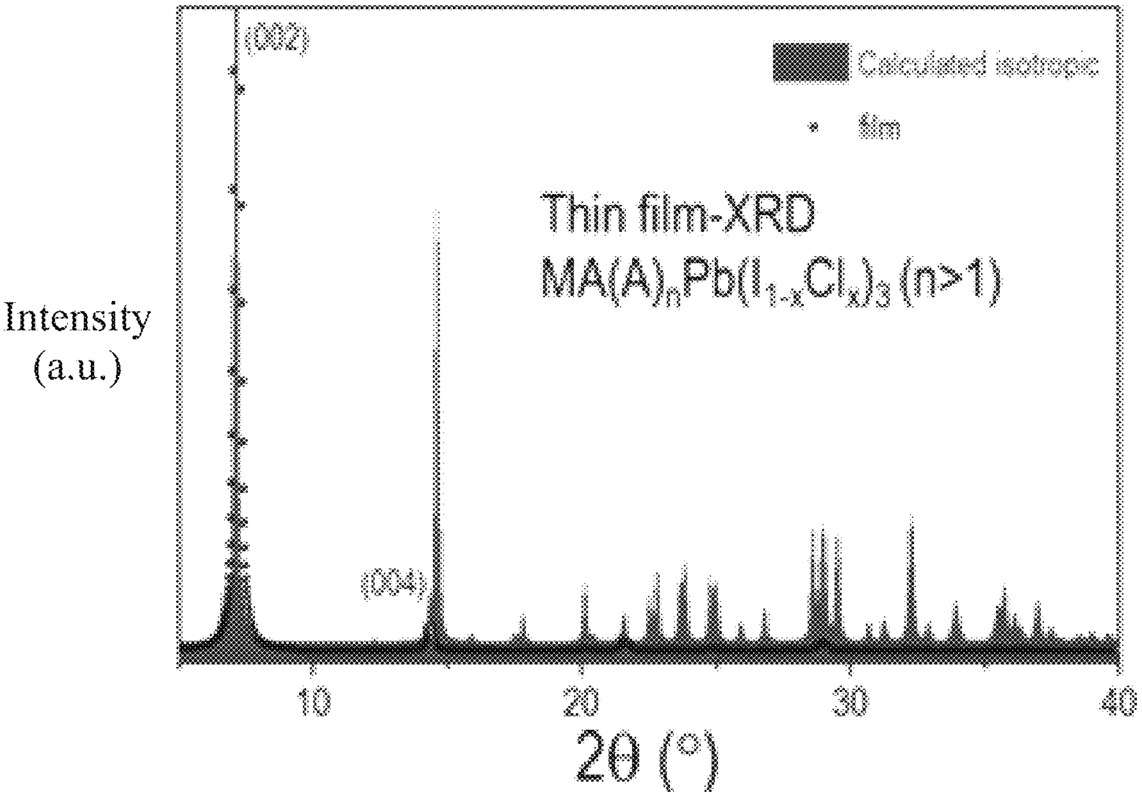
Figure 15E:
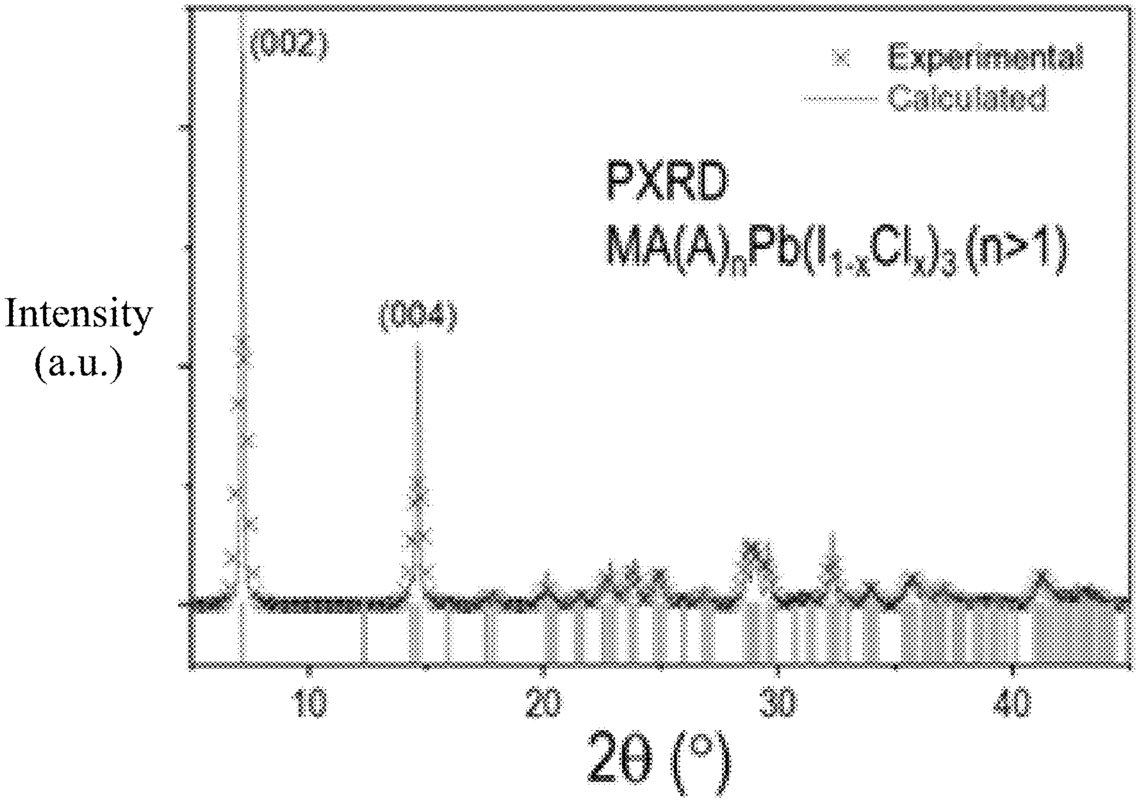
Figure 15F:
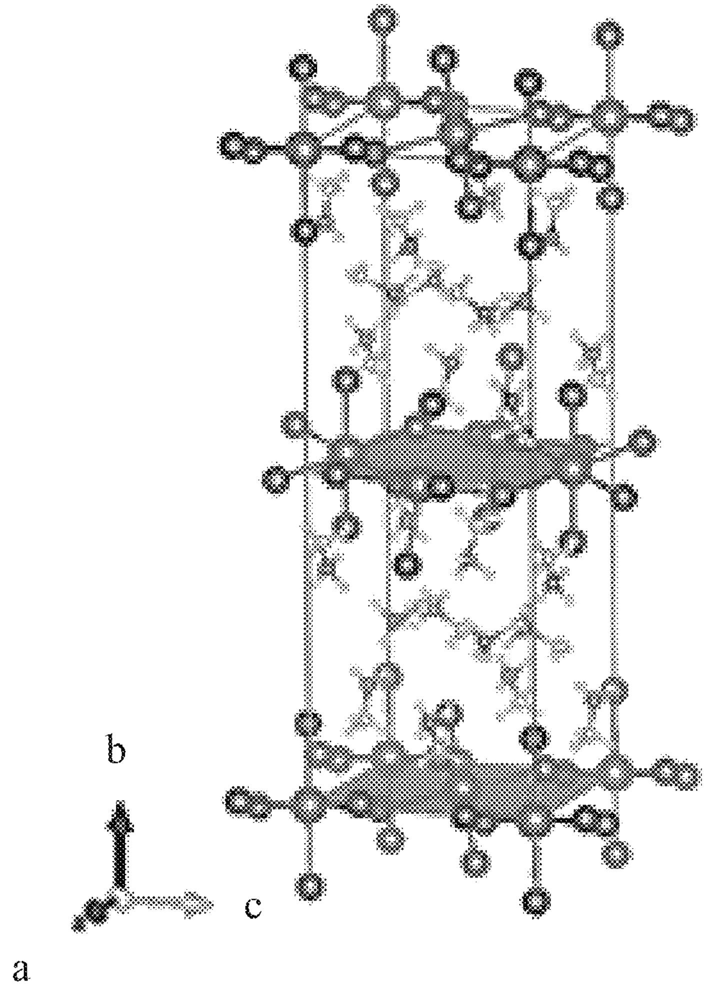
Figure 16:
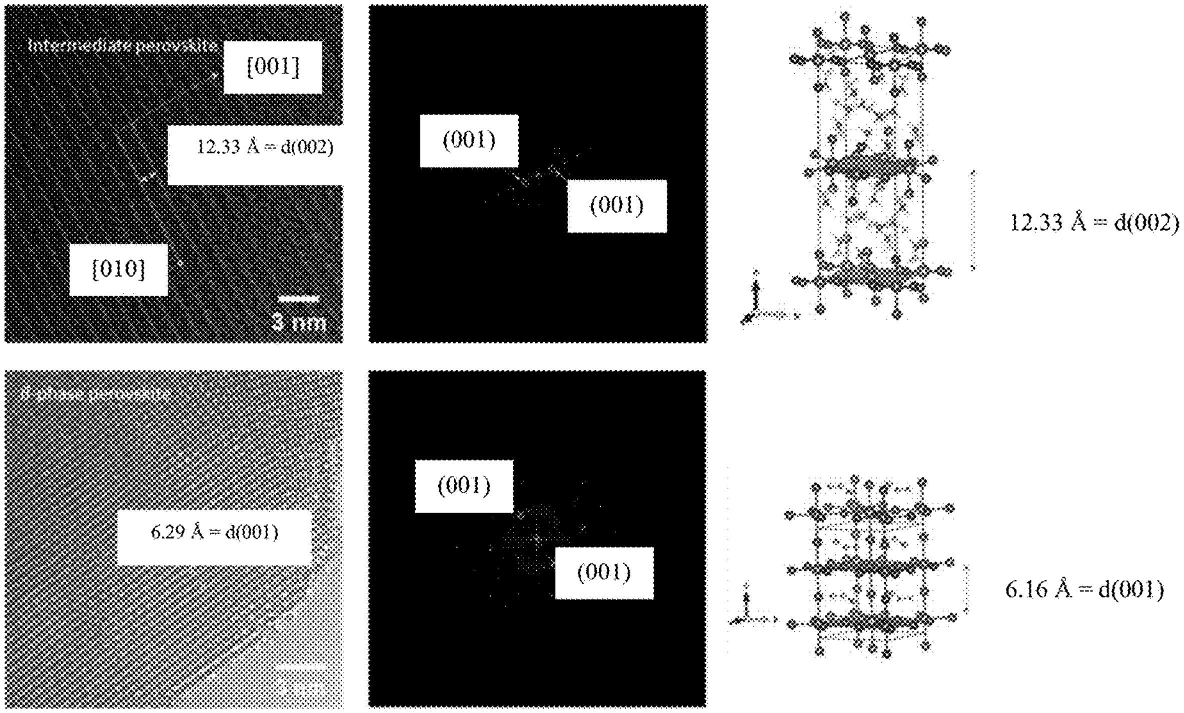
FIG. 16 shows HRTEM results of intermediate perovskite of $MA(A)_nPb(I_{1-x}Cl_x)_3$ (top panel), showing a $(00\ell)$ interplanar distance of 12.33 Å, and the final β-phase perovskite $MAPb(I_{1-x}Cl_x)_3$ (bottom panel), showing a $(00\ell)$ interplanar distance of 6.16 Å.
Figure 17:
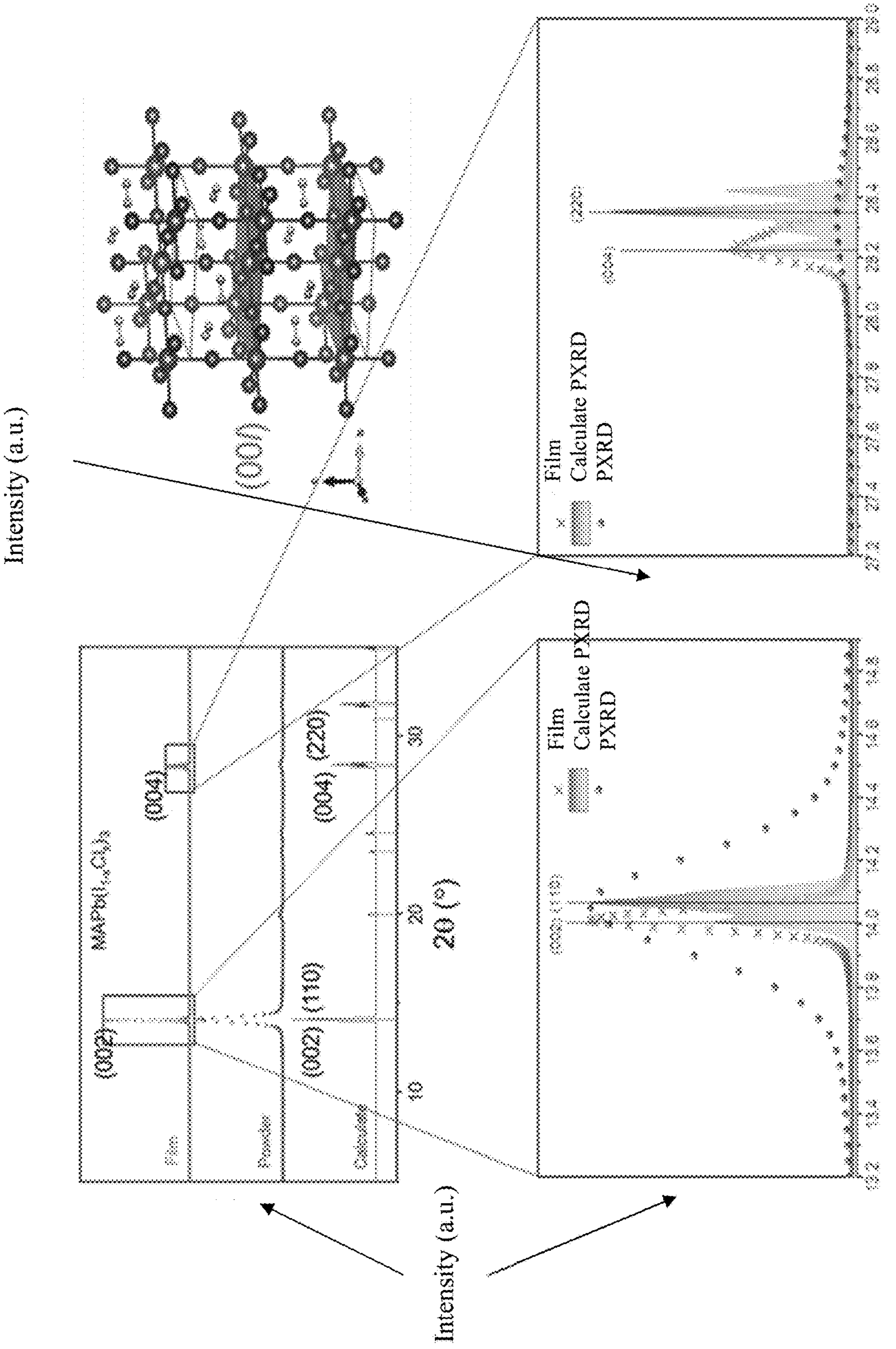
FIG. 17 shows XRD results of the final RT-perovskite film of $MAPb(I_{1-x}Cl_x)_3$, show a strong $\{00\ell\}$ orientation.

FIG. 13 shows a comparison of TGA-MS results between RT-perovskite and TA-perovskite. RT-perovskite shows rapid evaporation of acetonitrile, methylamine and ethanol at RT and no furthercomponents coming out after 1500 s even under annealing at 100° C. In contrast, TA-perovskite does not show weight loss or solvent evaporation at RT. Only at TA, the nonvolatile solvent DMF starts to come out from the ink, and it takes more than 2500 s under a 100° C. annealing to evaporate the DMF. The TGA-MS spectra of the whole crystallization process of RT- and TA-perovskite is compared in FIG. 13. It is found that in TA-perovskite the solvent evaporation of DMF only occurs at elevated temperatures and needs over 40 minutes for removal due to the much higher boiling point of DMF (153° C.). In comparison, the RT-perovskite ink displays a rapid co-evaporation of solvent molecules and amine, leading to the quick phase transition from the intermediate state to the final perovskite crystal. This intermediate phase exhibits larger bandgap and shows a quick transition to the tetragonal ft-phase perovskite at RT. To further characterize the intermediate state, the synthesis of the RT-ink is modified by dispersing the perovskite single crystal in a highly concentrated amine solution at lower temperature to obtain the intermediate state in a form of single crystal (see FIG. 14). The intermediate perovskite displays a colorless feature with a large optical bandgap of 2.26 eV (see FIGS. 15A-15F), which corresponds to the increased $\{00\ell\}$ interplanar distance in the crystallographic lattice according to the X-ray diffraction (XRD) analysis. This increase of interplanar $\{00\ell\}$ spacing can be ascribed to the insertion of amine molecules between the neighboring $[PbI_6]^{4-}$-octahedral sheets, bridging by hydrogen-bond interactions and formation of the lower-dimensional metastable intermediate of $MA(A)_nPb(I_{1-x}Cl_x)_3$, where A is amine and I and Cl are mixed halogen, as mixed halogen exhibits higher charge carrier mobility. During the RT isothermal process, amine molecules escape from the lattice leading to the interplanar distance reduction as schematically depicted in FIG. 12F. This spontaneous process at RT leads to the lattice collapse from the intermediate lamellar structure to the final tetragonal β-phase. To quantify, FIG. 12G shows the XRD result. The intermediate perovskite displays a $\{00\ell\}$ interplanar distance of 12.33 Å corresponding to a (002) XRD peak at 7.16°, while in distinct contrast the final tetragonal β-phaseperovskite displays an interplanar distance of 6.32 Å corresponding to a (002) peak at 14.01°. Theatomic scale insight of crystallographic differences between intermediate and final phase of perovskite is also visualized in a high-resolution transmission electron microscopy (HRTEM) study (see FIG. 16). Hence during the RT isothermal process, the trapped amine molecules within the perovskite intermediate could escape the lattice along with the evaporation of volatile solvents which leads to the lattice size reduction from a lower-dimensional planar structure with a larger c-axis interplanar distance to a three-dimensional structure with a c-axis shrunken lattice. This structural evaluation gives rise to the PL peak redshift in FIG. 12B. The intermediate film exhibits a strong orientation along the $(00\ell)$ direction, which has been successfully inherited to the final tetragonal β-phase. Accordingly, the resultant RT-perovskite film exhibits a strong $(00\ell)$ orientation (see FIG. 17) with an ultrahigh Lotgering factor of 97%. This highly ordered lattice packing is expected to generate reduced disordered electronic states and induce a higher charge transport property. FIG. 17 shows XRD results of the final RT-perovskite film of $MAPb(I_{1-x}Cl_x)_3$, show a strong $\{00\ell\}$ orientation. The Lotgering factor (LF) is calculated from the XRD patterns to quantify the degree of orientation, which is 97% for RT-perovskite thin film. The LF, varying from "0" for a non-oriented sample to "1" for a completely oriented sample, is calculated using the equation of $$LF = \frac{P - P_0}{1 - P_0}$$

(where P is the ratio between the summation of the integrated peak intensities corresponding to the preferred orientation planes and the summation of all diffraction peaks and $P_0$ is the ratio in a randomly orientated sample.

Figure 18:
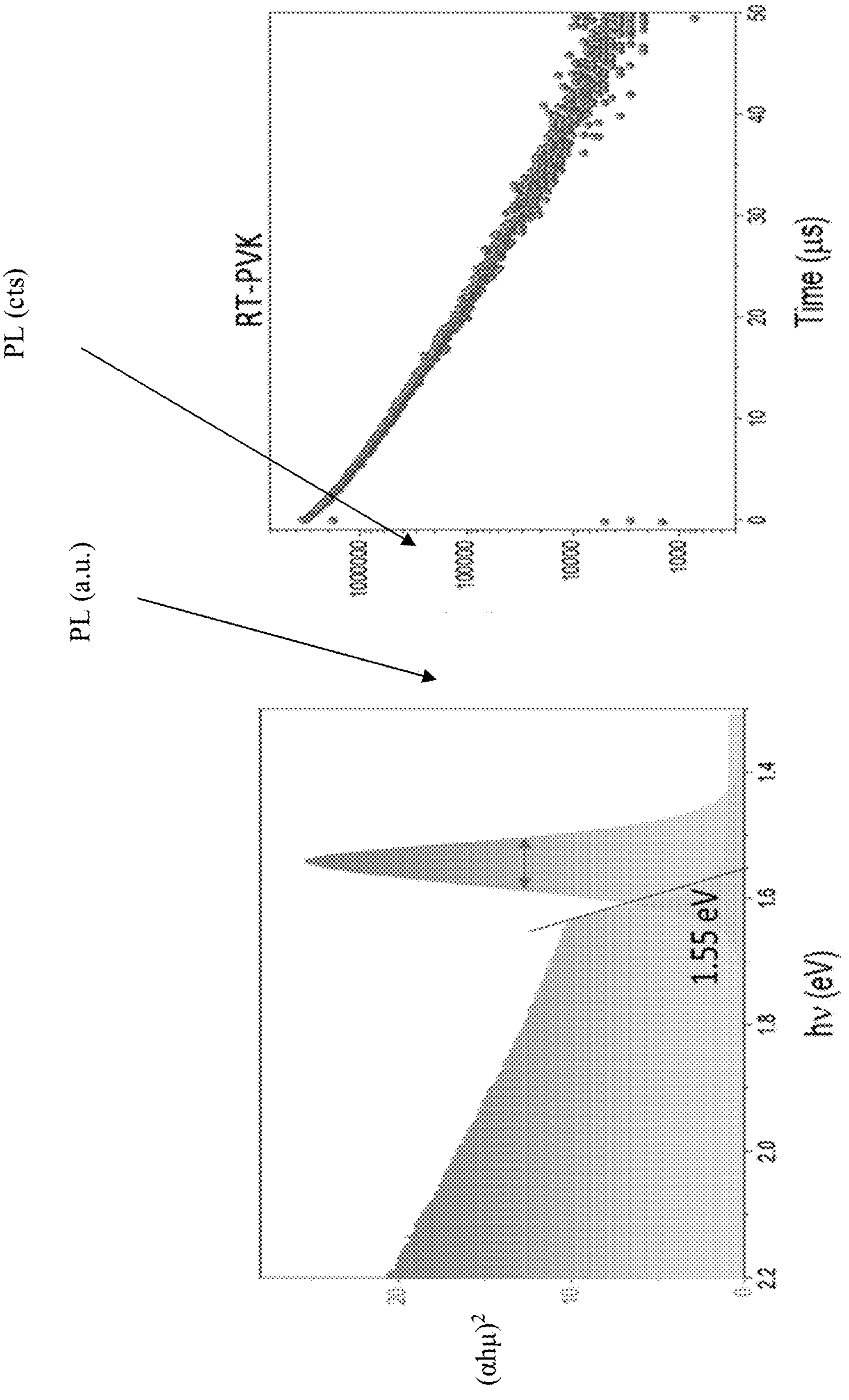
FIG. 18 shows a Tauc plot and time-integrated PL of a RT-perovskite thin film (left panel), and a time-resolved PL of a RT-perovskite thin film (right panel).
Figure 19:
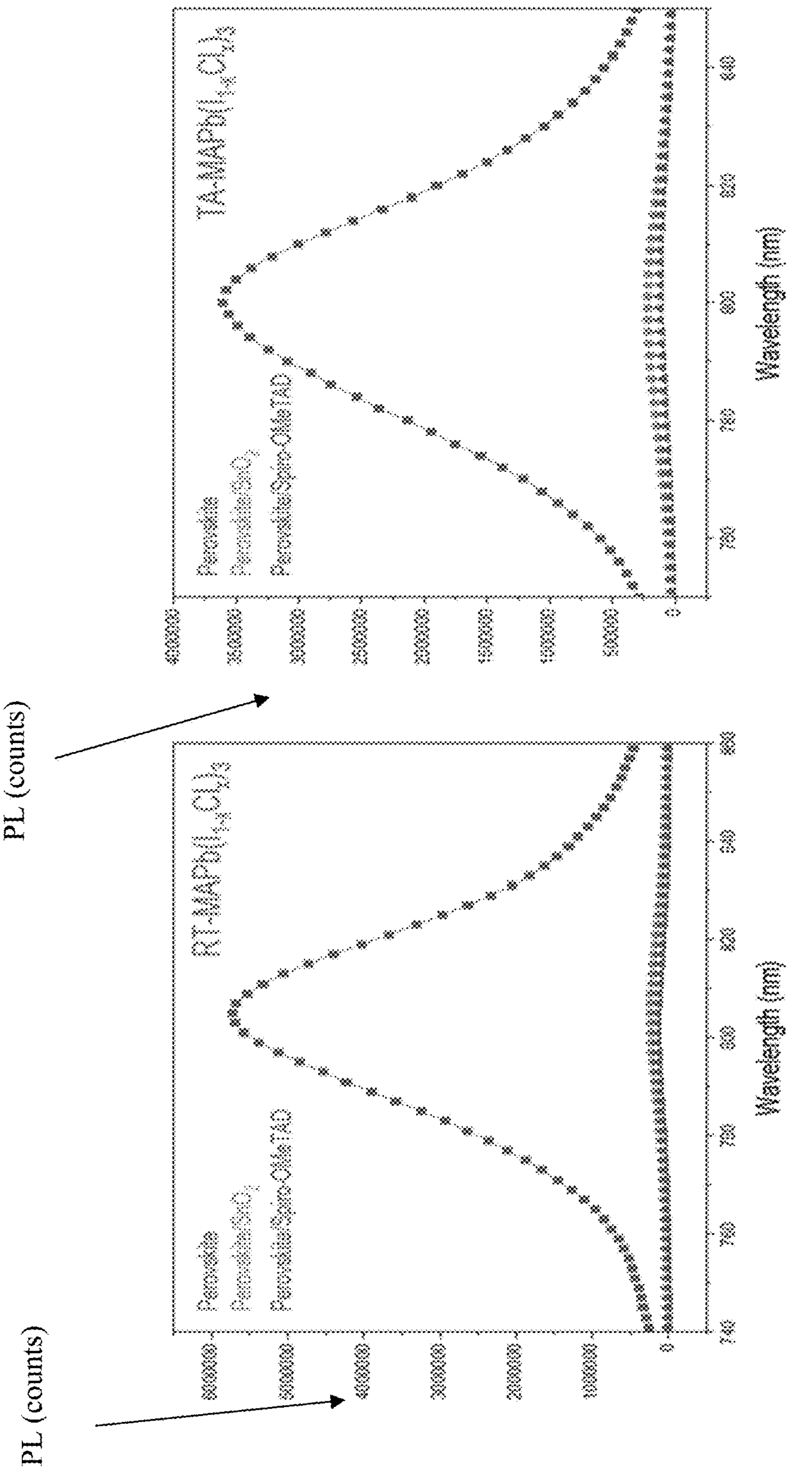
FIG. 19 shows time-integrated PL of different perovskite films with/without electron/hole quenchinglayers.
Figure 20A:
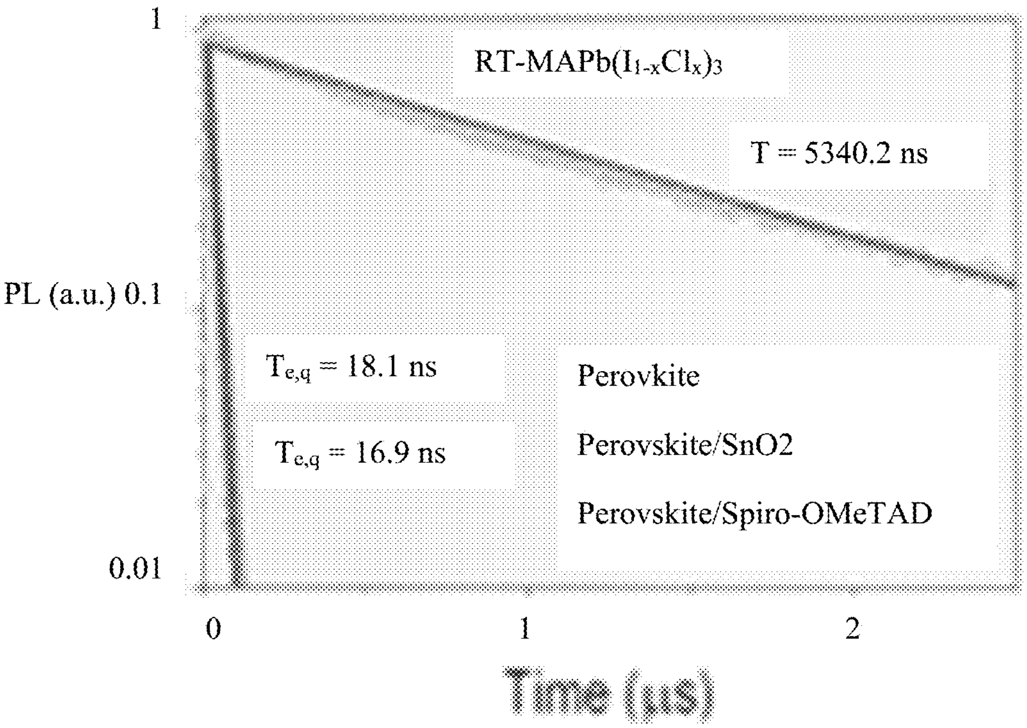
FIGS. 20A-20I show long carrier diffusion length in RT-perovskite film and their PV device performance. Diffusion model analysis for charge carrier diffusion length is shown in FIGS. 20A-C. Time-resolved PL decay transients for perovskite without the quencher layer is shown in blue, with the electron quencher layer shown in green, and with the hole quencher layer shown in red. The perovskite is RT-perovskite (FIG. 20A) and TA-perovskite (FIG. 20B), respectively.
Figure 20B:
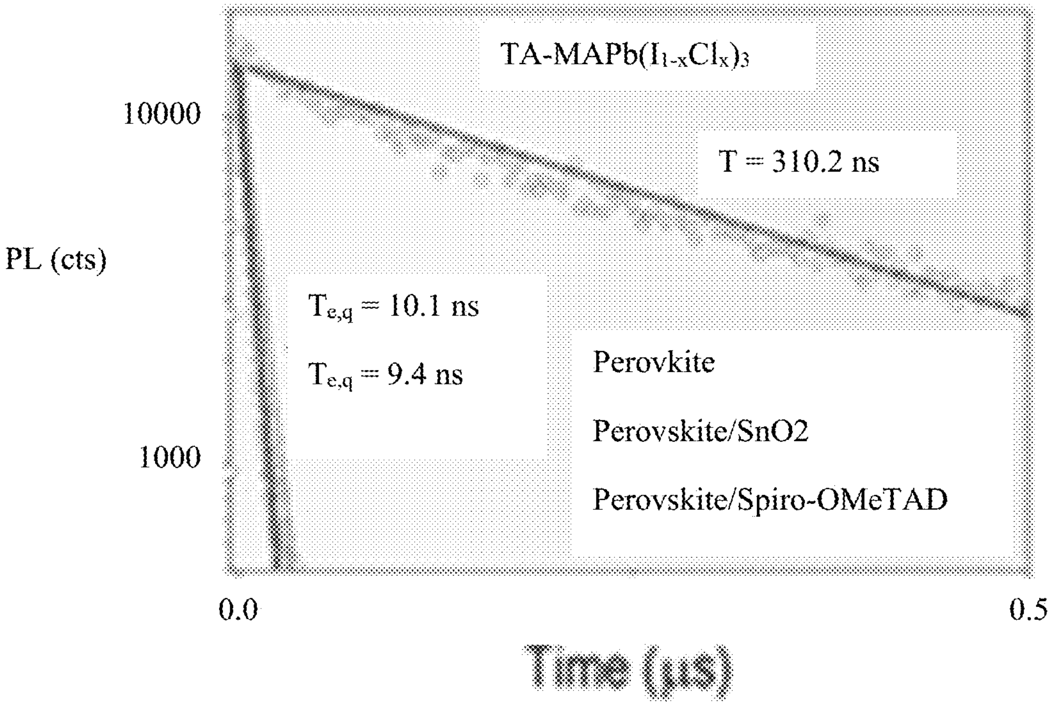

The optoelectronic study was then to characterize the electrical transport property of the RT-perovskite. Tauc plot (in accordance of direct transitions) reveals an optical bandgap of 1.55 eV and the time-integrated PL display a narrow full width at half maximum (FWHM) of 72 meV (see FIG. 18), close to that of single crystals. This bandgap is generally smaller than that of 1.6 eV from typical TA-perovskites with identical composition, as the degree of crystallinity, orientation, and grain structure have a strong influence on their optical and electronic properties. The electronic properties (such as the charge carrier diffusion length defined as the average distance that an excited carrier will travel before recombining) are important in determining the overall performance of optoelectronics. Longer diffusion lengths are indicative of efficient transport and better device performance, which could also be originated from a higher crystal quality. The carrier diffusion length is measured through the PL spectroscopy on perovskite in presence or absence of a quenching layer. $SnO_2$ and Spiro-OMeTAD have been used as electron and hole quenchers, respectively, due to their picosecond charge extraction ability when interfacing with perovskite. By comparing time-resolved and time-integrated PL on bare perovskite against perovskite/$SnO_2$ and perovskite/Spiro-OMeTAD, carrier diffusion signatures of different perovskites can be achieved. For RT-perovskite, the time-integrated PL shows significant quenching after interfacing with either $SnO_2$ or Spiro-OMeTAD. FIG. 19 shows a quenching factor of 24 and 40 upon $SnO_2$ and Spiro-OMeTAD, respectively. These high-degree quenching characteristics, which are comparable to that in donor-acceptor bulk heterojunction (BHJ) systems, suggests sufficient charge extraction. Time-resolved PL reveals substantially shortened lifetimes of 18.1 and 16.9 ns upon interfacing with $SnO_2$ and Spiro-OMeTAD, respectively, in distinct contrast to the bare perovskite of 5.3 μs (see FIG. 20A). Similar trends are found in the reference film of TA-perovskite in FIG. 20B. Notably, RT-perovskite exhibits a much longer carrier lifetime of 5.3 μs than that of 310.2 ns in TA-perovskite. This could be ascribed to the higher crystalline quality of the RT-perovskite film and indicates reduced scattering loss. Overall, both perovskites exhibit sufficiently quenched PL yield and mono-exponentially decayed lifetime with significantly shortened number upon interfacing quenching layers. These results are compared with the carrier diffusion length obtainedby the following equation derived from Continuum theory using a diffusion model:

$$\frac{L_D}{L} = \frac{2}{\pi}\sqrt{\frac{1}{\tau_D/\tau_0} - 1}$$

Figure 20C:
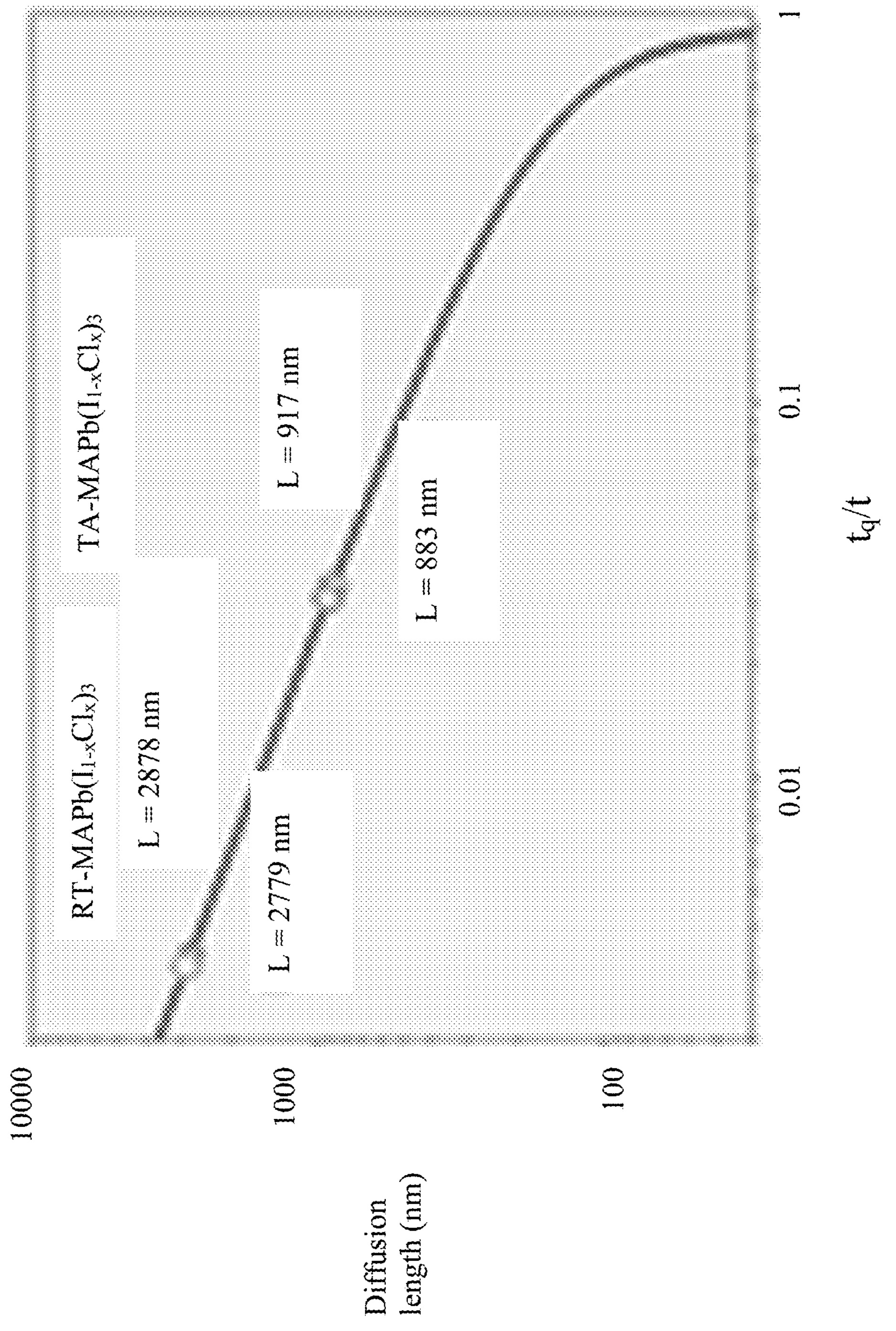

$L_D$ is the diffusion length, L is the film thickness, and $r_D$ and $r_0$ are the mono-exponentially fitted lifetimes in presence or absence of quencher, respectively. FIG. 20C displays the plot of $L_D$ against $r_D/r_0$ where the diffusion length of 2.9 and 2.8 μm of hole and electron respectively are found in RT-$MAPb(I_{1-x}Cl_x)_3$ perovskite film with 3-fold larger than those of 917 and 883 nm in TA-$MAPb(I_{1-x}Cl_x)_3$ perovskite. The μm-scale diffusion length in these Cl-doped I-based TA-perovskite is ascribed to the halogen ionic-radii difference that stabilizes the phase of the continuous solid solution, or slower MA rotational dynamics evidenced in quasielastic neutron scattering (QENS) investigations or other mechanisms. Higher crystallinity leads to more efficient charge transport and in the limited case of single-crystalline $MAPb(I_{1-x}Cl_x)_3$, the diffusion length exceeds 380 μm. The RT-perovskites display long diffusion length on the order of 2.8~2.9 μm, which can be related to the highly ordered crystalline packing and {00ℓ} orientation inherited from the intermediate state during the RT isothermal crystallization. The balanced electron and hole diffusion also imply a balanced charge transfer in device.

Figure 20D:
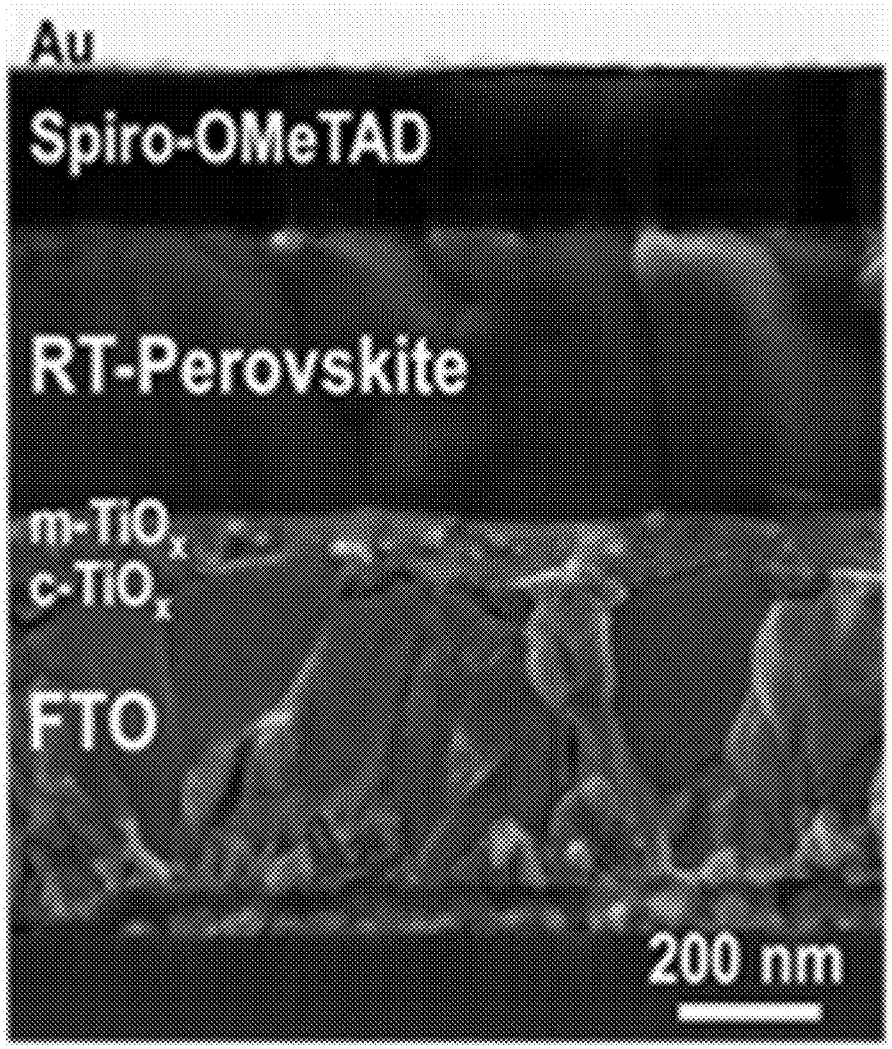
Figure 20E:
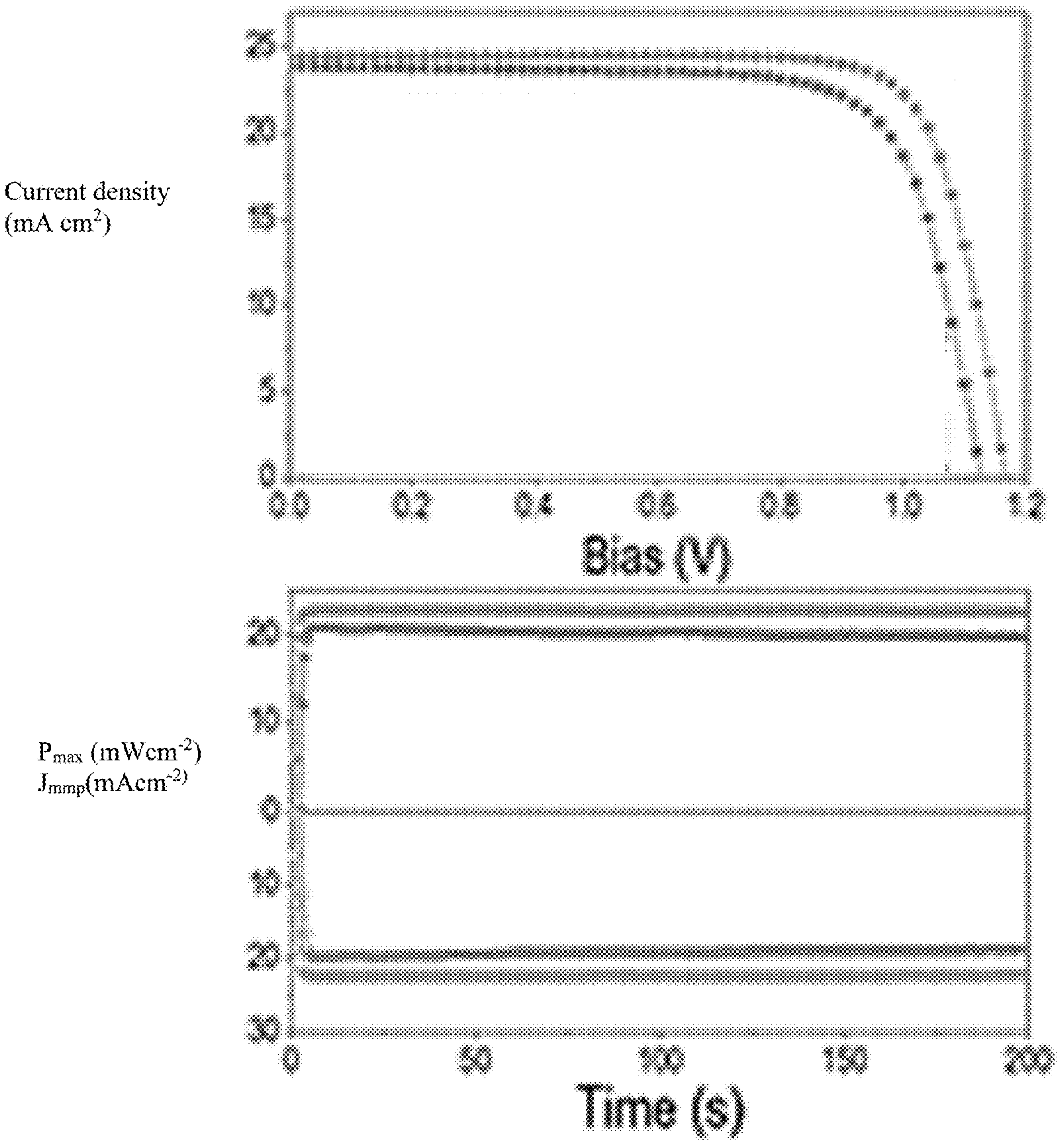
Figure 20F:
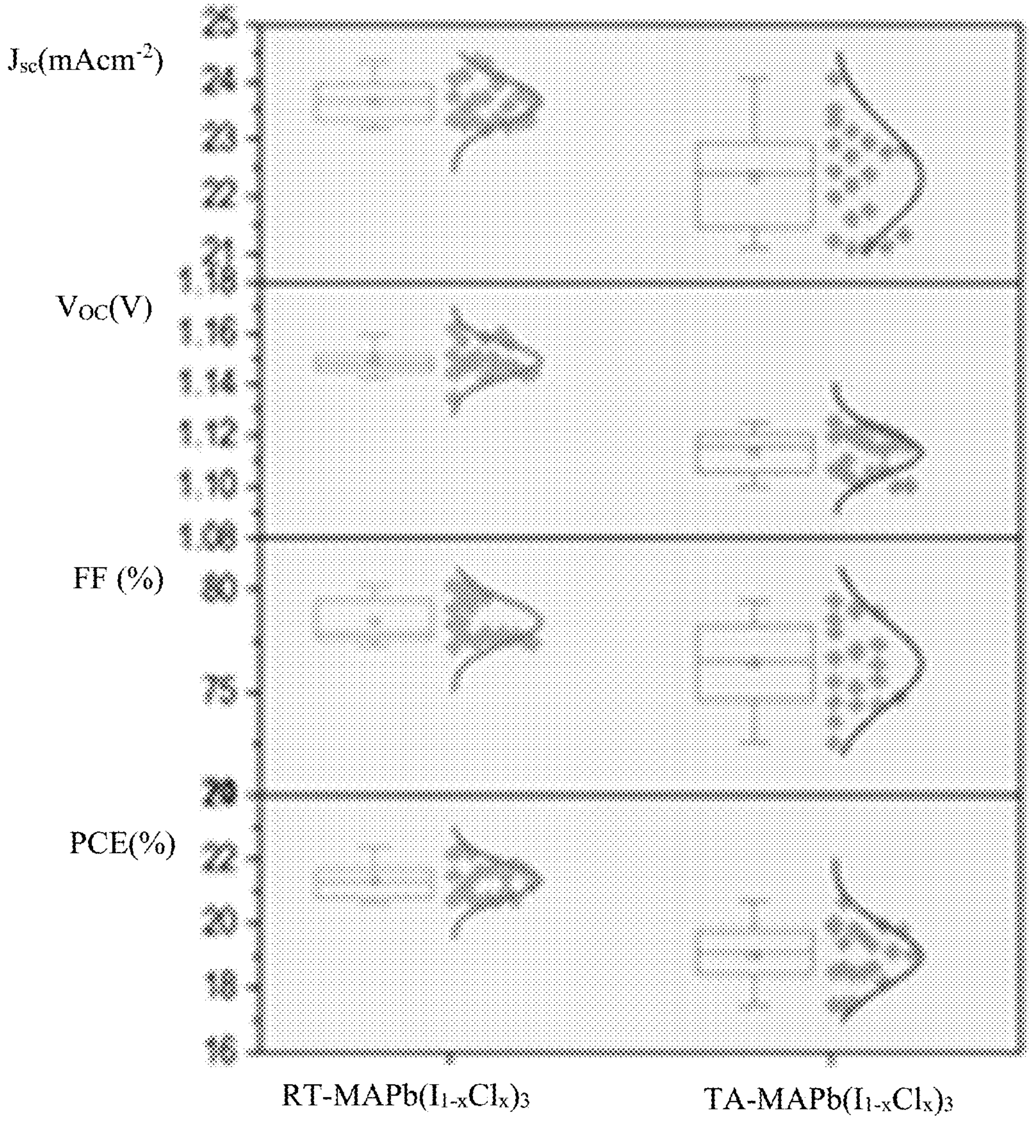
Figure 21:
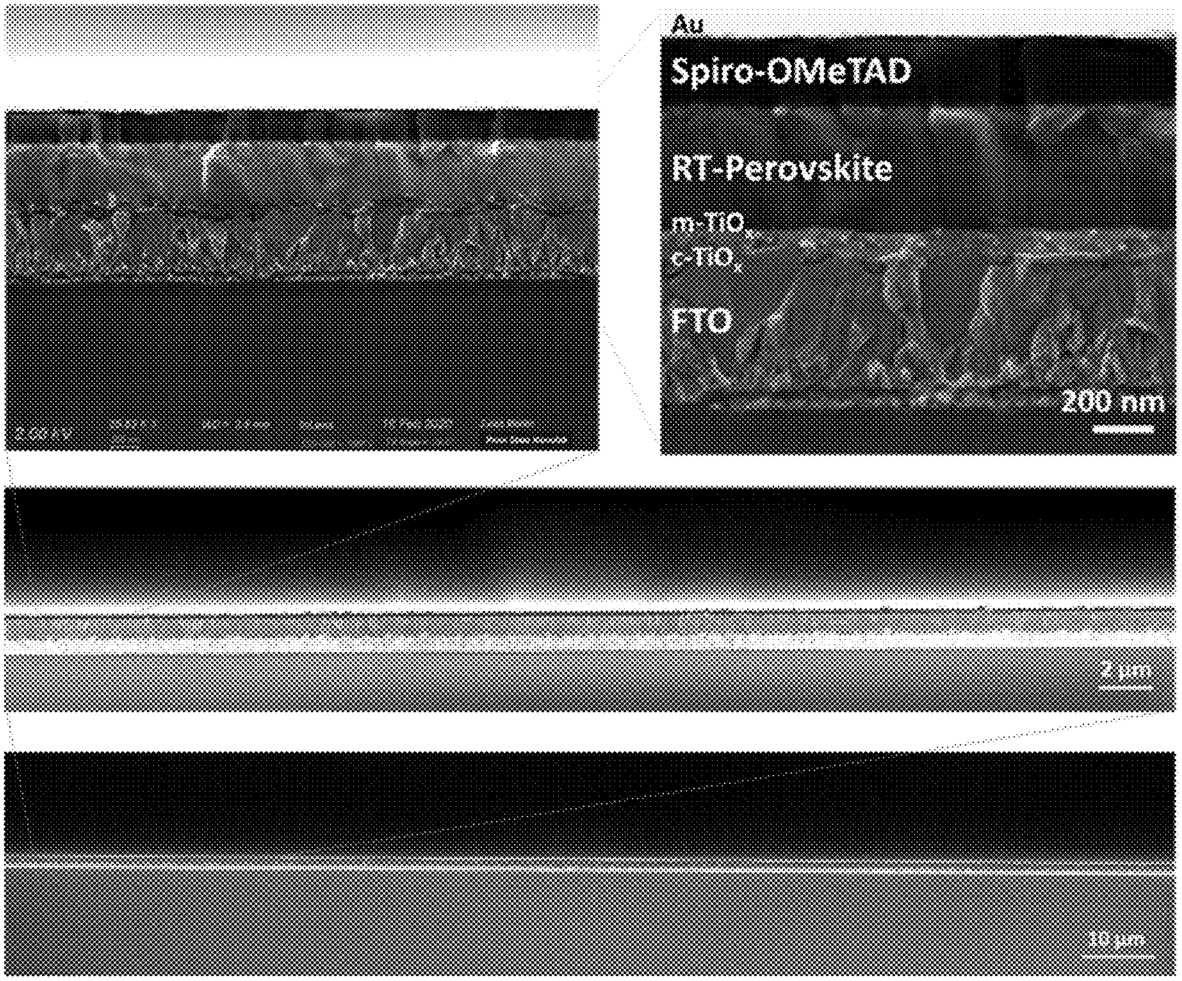
FIG. 21 is cross-sectional SEM images showing the conventional (n-i-p) structured perovskite solar cell at different magnification scope.
Figure 22:
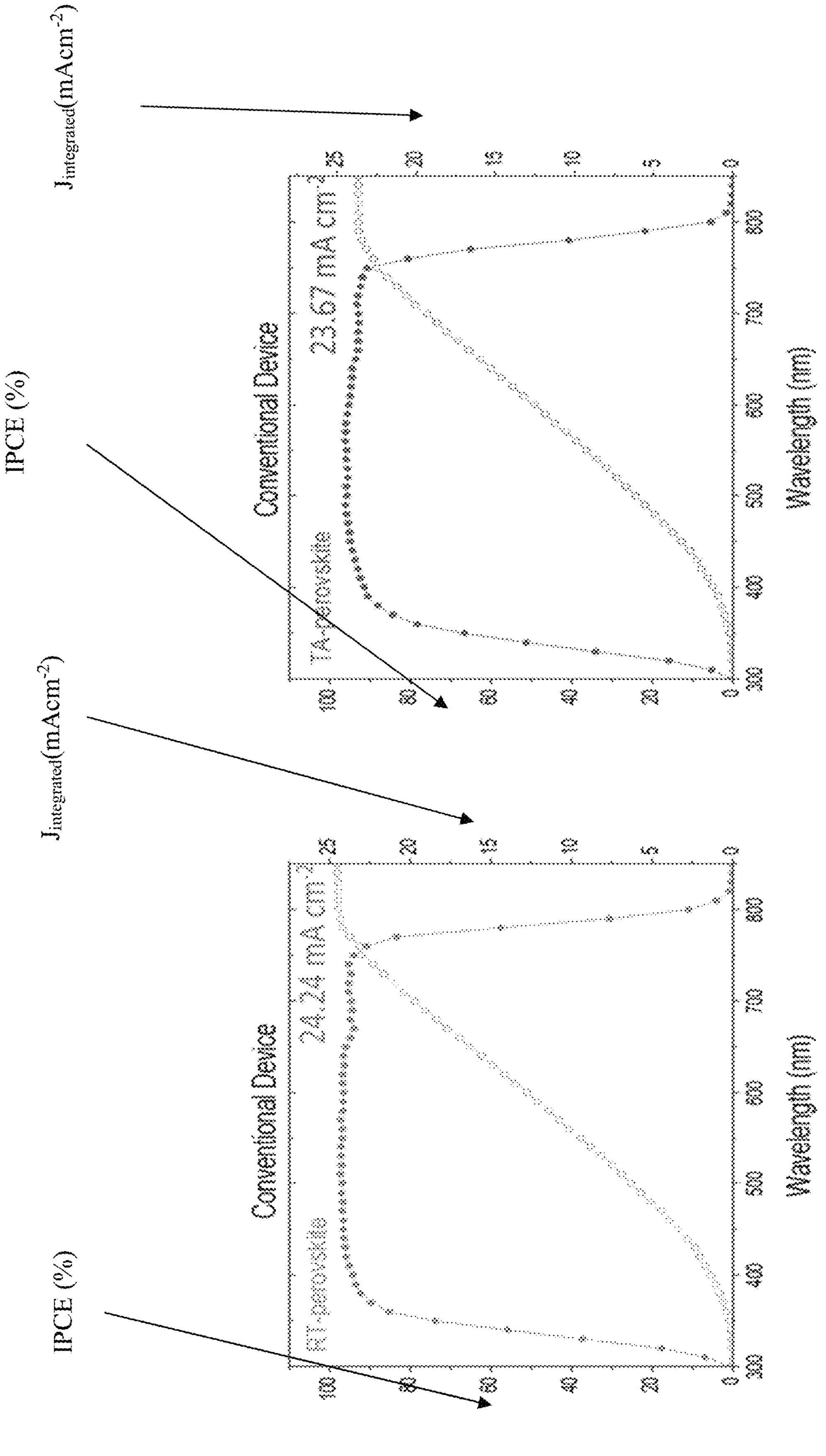
FIG. 22 shows IPCE spectra of conventional perovskite solar cells using RT- and TA-perovskite, wherein the current integration is also presented to give a reference number of photocurrents.
Figure 23:
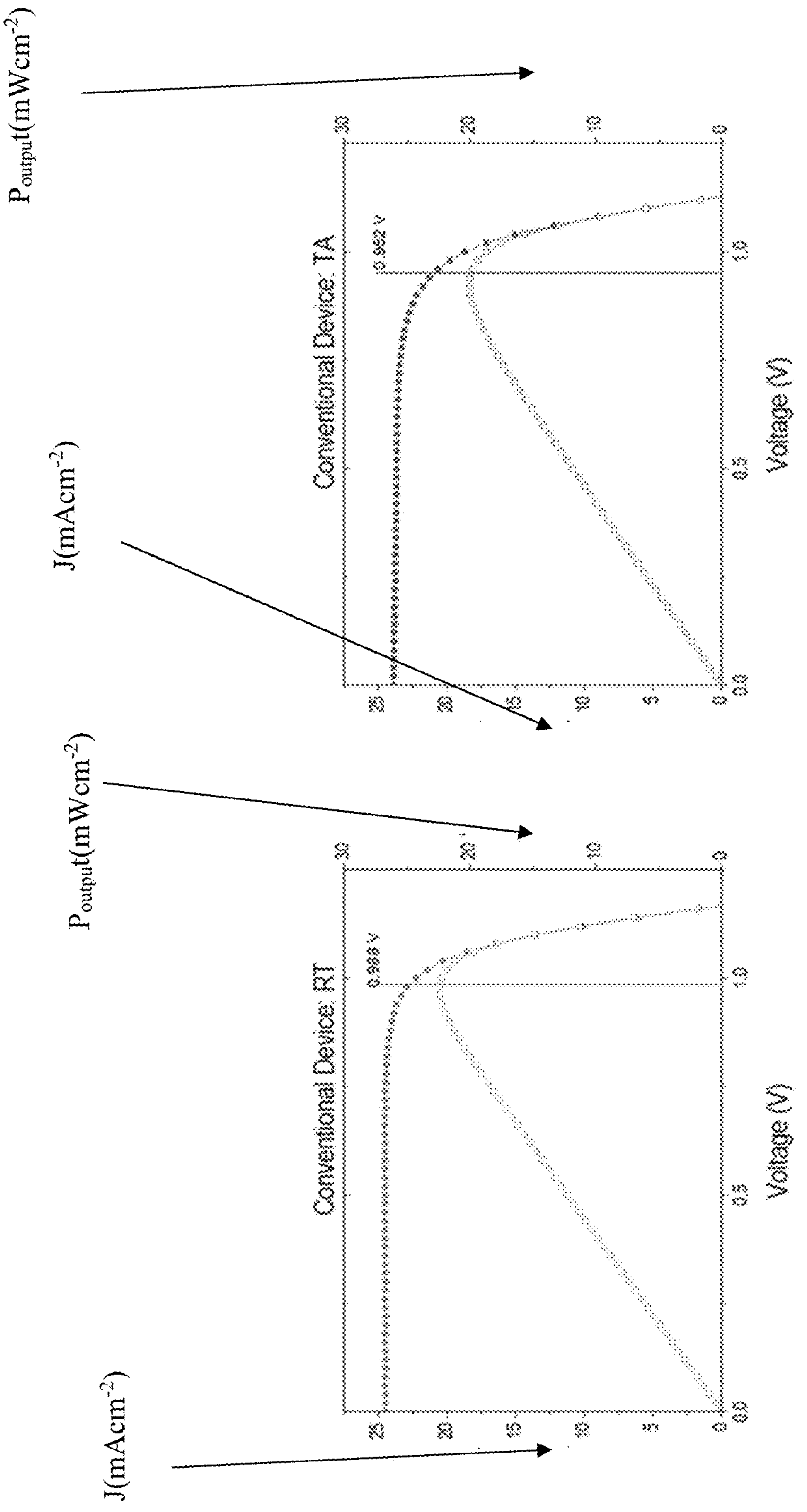
FIG. 23 shows J-V curve and output power-voltage curve of conventional perovskite solar cells using RT- and TA-perovskite, wherein the maximal output power point is obtained and noted in each figure.

To evaluate the photovoltaic performance of solar cells based on these RT-perovskites and qualify their performance in devices, both conventional (p-i-n) and inverted (n-i-p) structured PVs were prepared. The conventional device consists of fluorine-doped tin oxide (FTO)/compact-$TiO_x$(c-$TiO_x$)/mesoporous-$TiO_x$ (m-$TiO_x$)/RT-perovskite/Spiro-OMeTAD/gold (Au), with FTO being the front cathode collecting electrons and Au being the back anode collecting holes respectively. FIG. 20D shows a cross-sectional SEM image of the conventional device, visualizing the layer-by-layer device structure. The RT-perovskite layer displays a uniform thickness of ca. 420 nm and an ultra-flat surface, even when viewed over a larger surface area (see FIG. 21—highly homogeneous films with ultra-flat surface can be observed). This enables a homogeneous electrical contact with top buffer and back electrode. Under AM 1.5 illumination, the RT-perovskite based conventional device exhibits a PCE of 22.32% (which was independently certified at 22.28%) with a short-circuit current ($J_{SC}$) of 24.33 mA $cm^{-2}$, open-circuit voltage ($V_{OC}$) of 1.16 V and fill factor (FF) of 79.1% (see FIG. 20E(i)). In comparison, the TA-perovskite device exhibits a relatively lower PCE of 20.03%. Incident photon-to-electron conversion efficiency (IPCE) spectroscopy coupled with photocurrent integration reveals an integrated current of 24.24 and 23.67 mA $cm^{-2}$ for RT- and TA-perovskite based device respectively (see FIG. 22), in good agreement with numbers (24.33 and 23.91 mA $cm^{-2}$ respectively) extracted from photocurrent density-voltage (J-V) characteristics. Notably, the RT-perovskite device displays a noticeable increase in FF, with a higher shunt resistance ($R_{sh}$) of 4.9 kΩ $cm^2$ and smaller series resistance ($R_s$) of 3.8 Ωcm2, respectively, compared to that of Rsh=0.93 $cm^2$ and $R_s$=5.7 S2 cm2 from TA-perovskite based device. This is consistent with the long carrier diffusion length of RT-perovskite and is indicative of efficient charge transport behavior throughout the device. Particularly at the perovskite/spiro-OMeTAD interface, the flat surface of perovskite secures a synchronized charge transfer from the perovskite to the spiro-OMeTAD buffer in terms of the whole interface thereby less higher order carrier recombination. FIG. 20E (ii) compares the static photocurrent of devices biased at their corresponding maximum power points ($V_{mp}$). The $V_{mp}$ for each device is individually calculated (see FIG. 23). The RT-perovskite device displays a stabilized maximal output power of 22.36 mW $cm^{-2}$ corresponding to a PCE of 22.36% consistent with the number of 22.32% obtained from J-V characteristics. In comparison, the TA-perovskite exhibits a mild value of 19.88 mW $cm^{-2}$ (corresponding to a PCE of 19.88%), which is consistent with the typical state-of-the-art values. The statistics of a conventional device were also investigated using either RT- or TA-perovskite in FIG. 20F by measuring photovoltaic parameters from 20 individual devices. The data for the RT-perovskite based devices exhibit a narrower distribution, as indicated by a smaller standard deviation (a) shown in Table 3 ($\sigma_{RT,PCE}$=0.48% vs. $\sigma_{TA,PCE}$=0.82%).

TABLE 3

Photovoltaic parameters of conventional (n-i-p) structured solar cells using RT- and TA-MAPb(I1-xClx)3 perovskite.

| Methods | $J_{SC}$ (mA cm )$^{-2}$ | $V_{OC}$ (V) | FF (%) | PCE (%) |
|---|---|---|---|---|
| RT-avg. ± Std. dev. | 23.68 ± 0.38 | 1.149 ± 0.007 | 78.54 ± 1.03 | 21.37 ± 0.48 |
| RT-champion | 24.38 | 1.148 | 80.06 | 22.40 |
| TA-avg. ± Std. dev. | 22.24 ± 0.77 | 1.113 ± 0.009 | 76.35 ± 2.02 | 18.91 ± 0.82 |
| TA-champion | 23.96 | 1.116 | 75.10 | 20.08 |

Figure 20G:
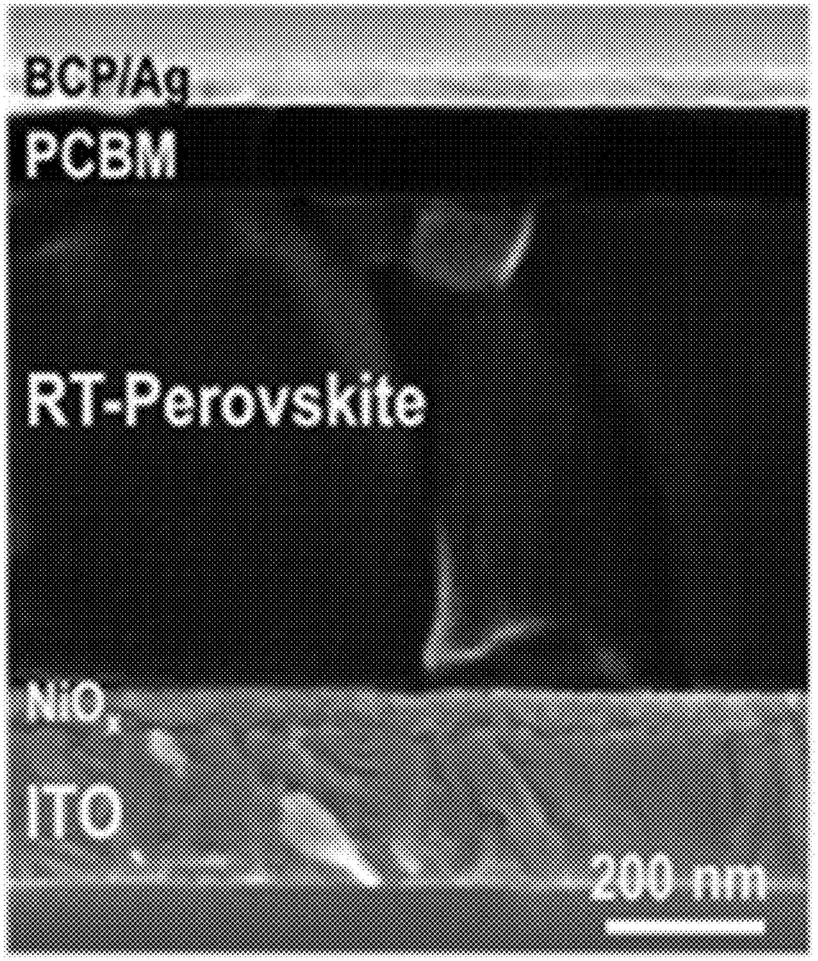
Figure 24:
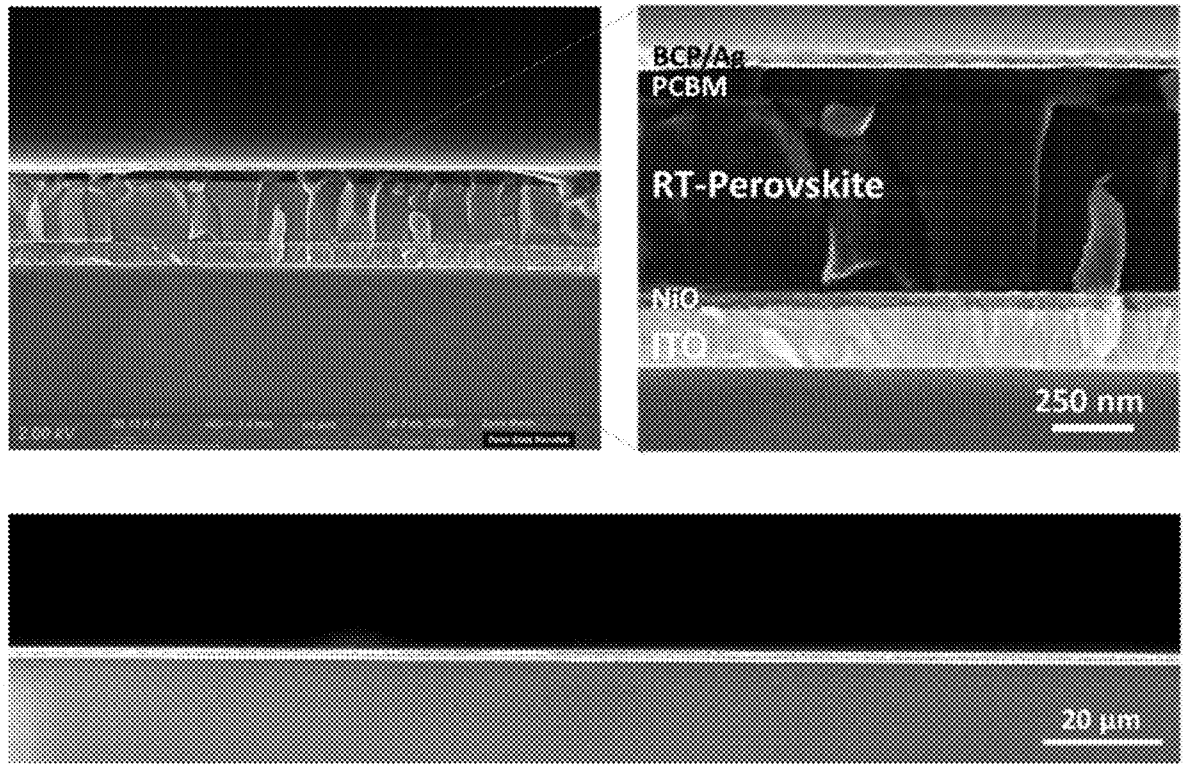
FIG. 24 is cross-sectional SEM images showing the inverted (p-i-n) structured perovskite solar cell at different magnification scope, wherein highly homogeneous films with ultra-flat surface can be observed.

Inverted solar cells that include indium tin oxide (ITO)/$NiO_x$/RT-perovskite/phenyl-$C_{61}$-butyric acid methyl ester (PCBM)/bathocuproine (BCP)/silver (Ag) have been prepared and characterized to further evaluate the performance of RT-perovskite. FIG. 20G displays the cross-sectional SEM images of the fabricated devices. Similar to the conventional device, the inverted structure with RT-perovskite thin film coated on top of $NiO_x$ also exhibits excellent uniformity and ultrahigh flatness as seen in FIG. 24. This homogeneity is important for the efficient charge transfer across the backside contact from microscale and correlates to a higher performance at device scale, as leakage, shunting and other meso-structural defects are minimized due to the highfilm uniformity. Accordingly, the crystallinity, homogeneity and charge transport property of the RT-perovskite enables a high PCE of 23.07% in the inverted device, coupled by simultaneously improved $J_{SC}$, $V_{OC}$ and FF of 23.52 mA $cm^{-2}$, 1.158 V and 84.7%, respectively (see FIG. 20H(i)). In comparison, the TA-perovskite devices exhibit substantially lower PCE of 20.85%. A significant improvement in FF from 78.9% to 84.7% is noticed owing to the superior charge transport property of the RT-$MAPb(I_{1-x}Cl_x)_3$ perovskite and an obvious voltage change from 1.142 to 1.158 V. Such a change is also present in conventional structured devices (see FIG. 20E(i)).

Figure 20H:
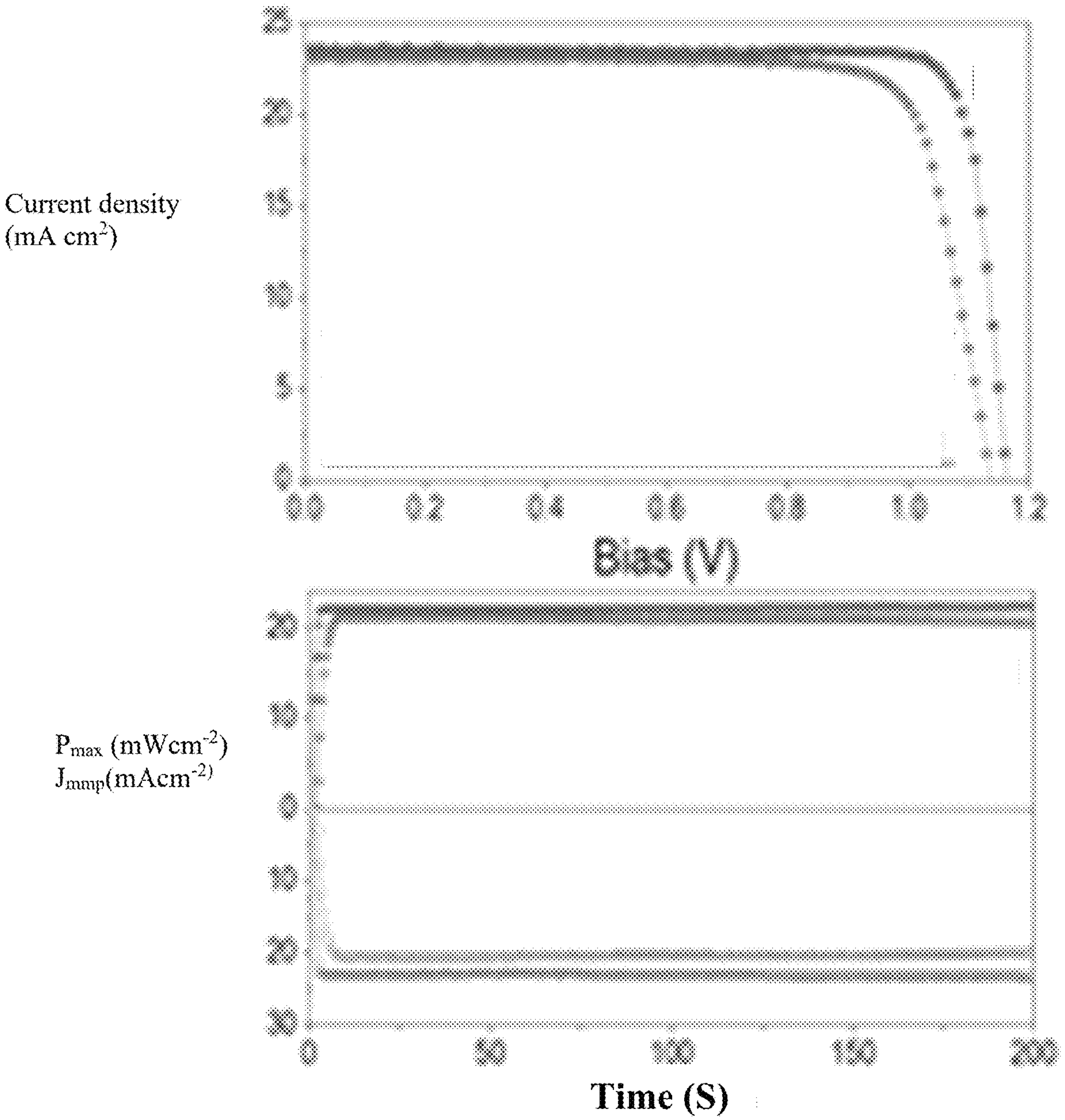
Figure 20I:
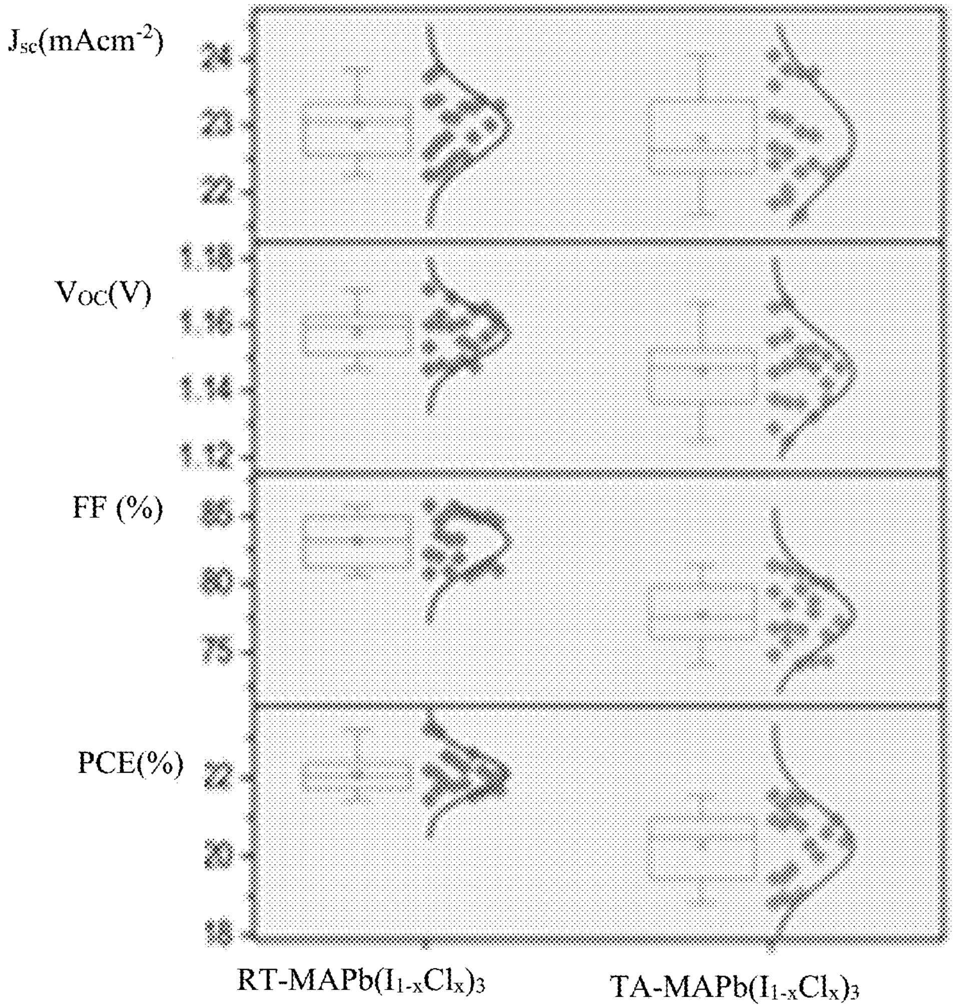
Figure 25:
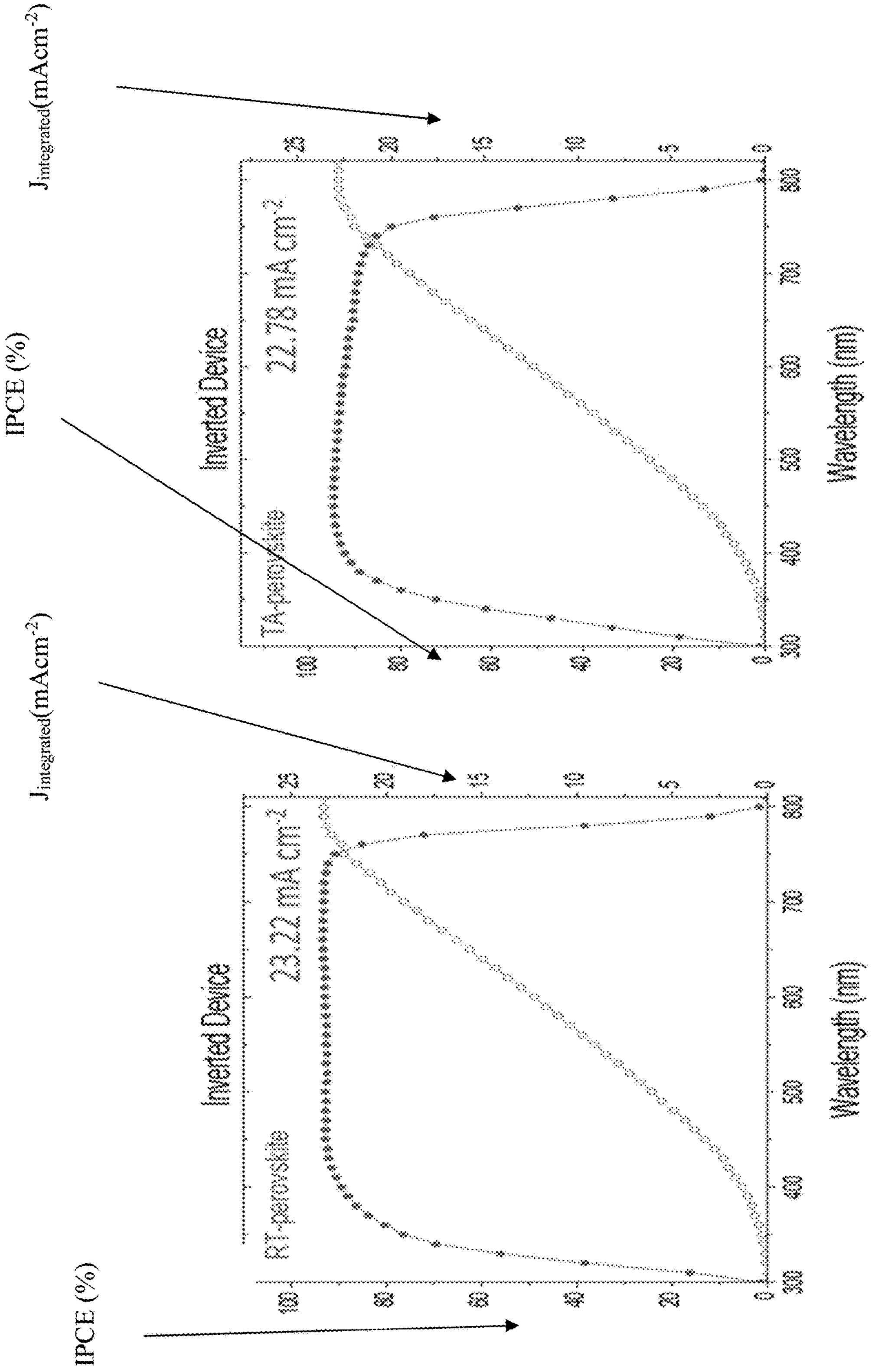
FIG. 25 is an IPCE spectra of inverted perovskite solar cells using RT- and TA-perovskite, wherein the current integration is also presented to give a reference number of photocurrents.
Figure 26:
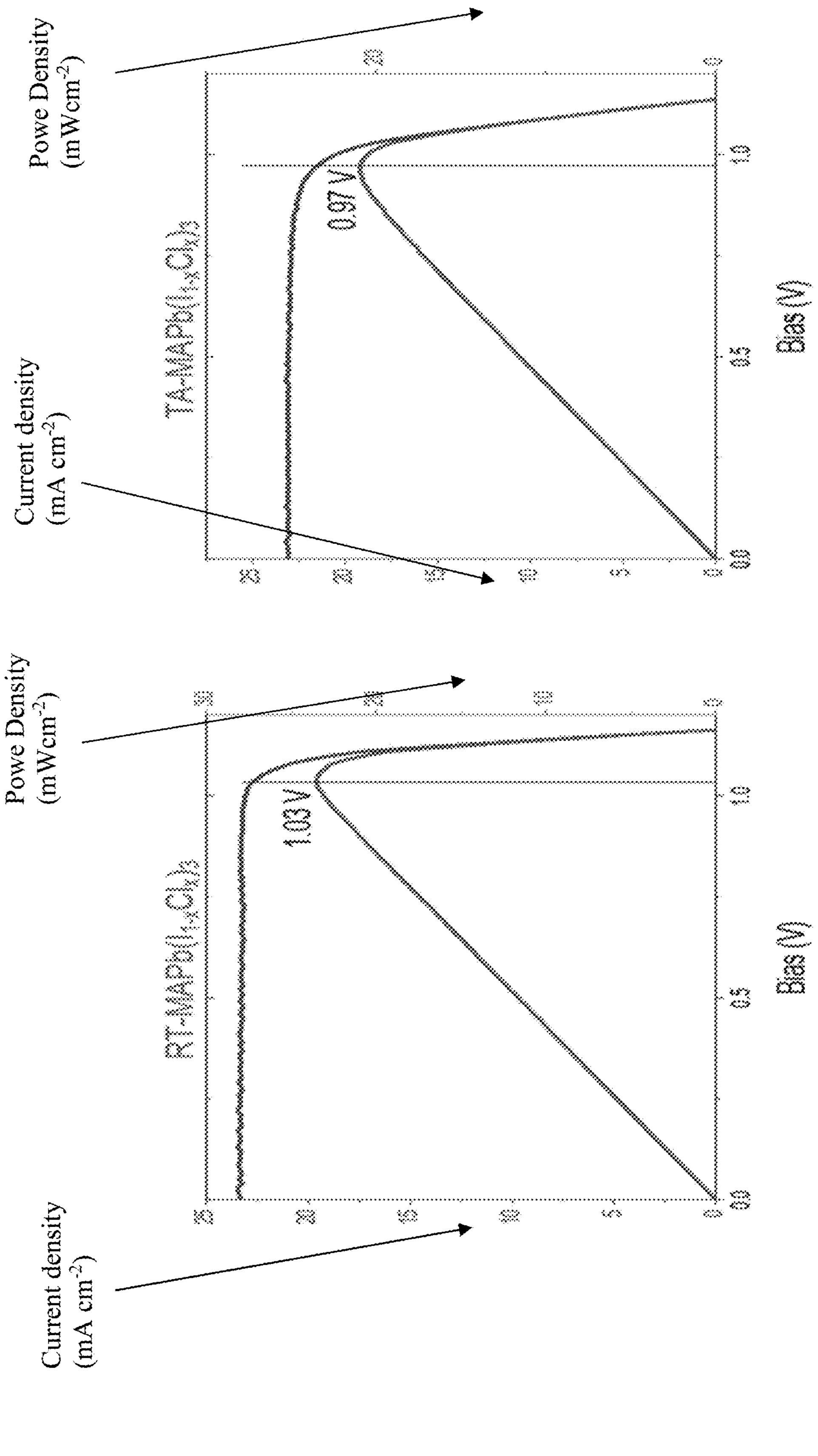
FIG. 26 shows a J-V curve and output power-voltage curve of inverted perovskite solar cells using RT- and TA-perovskite, wherein the maximal output power point is obtained and noted in each figure.

In solar cells $V_{OC}$ is determined by the quasi-Fermi level (quasi-FL) separation at the contacts and in ideal case it corresponds to the quasi-FL separation in the absorber, assuming infinite carrier mobility and well-aligned bands. In practice, the finite electron and hole conductivities limit the carrier transport by a potential loss, which is reflected in the quasi-FL gradients and finally an internal voltage drop. More efficient charge transport corresponds to lowercharge losses (multiple recombination mechanisms including Shockley-Read-Hall recombination and higher order non-geminate recombination etc.) and less potential losses within the device and hence simultaneously enlarged FF and $V_{OC}$. Another result of efficient charge transfer is a higher external quantum efficiency of photon to current conversion. The corresponding IPCE spectra also verifies a higher quantum efficiency in the RT-perovskite device, showing an integrated current density of 23.22 mA cm', which is larger than that of 22.78 mA $cm^{-2}$ in TA-perovskite device (see FIG. 25). FIG. 20H (ii) compares the static efficiency of the inverted devices biased at their own corresponding $V_{mp}$ extracted from power-bias curve in FIG. 26. The RT-perovskite device shows a steady maximal output power of 23.06 mW $cm^{-2}$, corresponding to a PCE of 23.06% higher than the TA-counterparts of 20.55 mW $cm^{-2}$ and a higher consistency with the PCE values obtained from J-V characteristics. The statistics of inverted devices were also compared using the data obtained from 20 individual devices. As shown in FIG. 20I, the solar cells fabricated using RT-perovskite exhibit higher average parameters and a narrower distribution compared to their TA-counterparts. Specifically, the RT-perovskite device displays a PCE of 22.10±0.49% (mean±standard deviation) compared to that of 20.29±0.93% from TA-perovskite device. The smaller standard deviation (σ) implies a higher reproducibility ascribed to the excellent film uniformity and high surface flatness.

Figure 27:
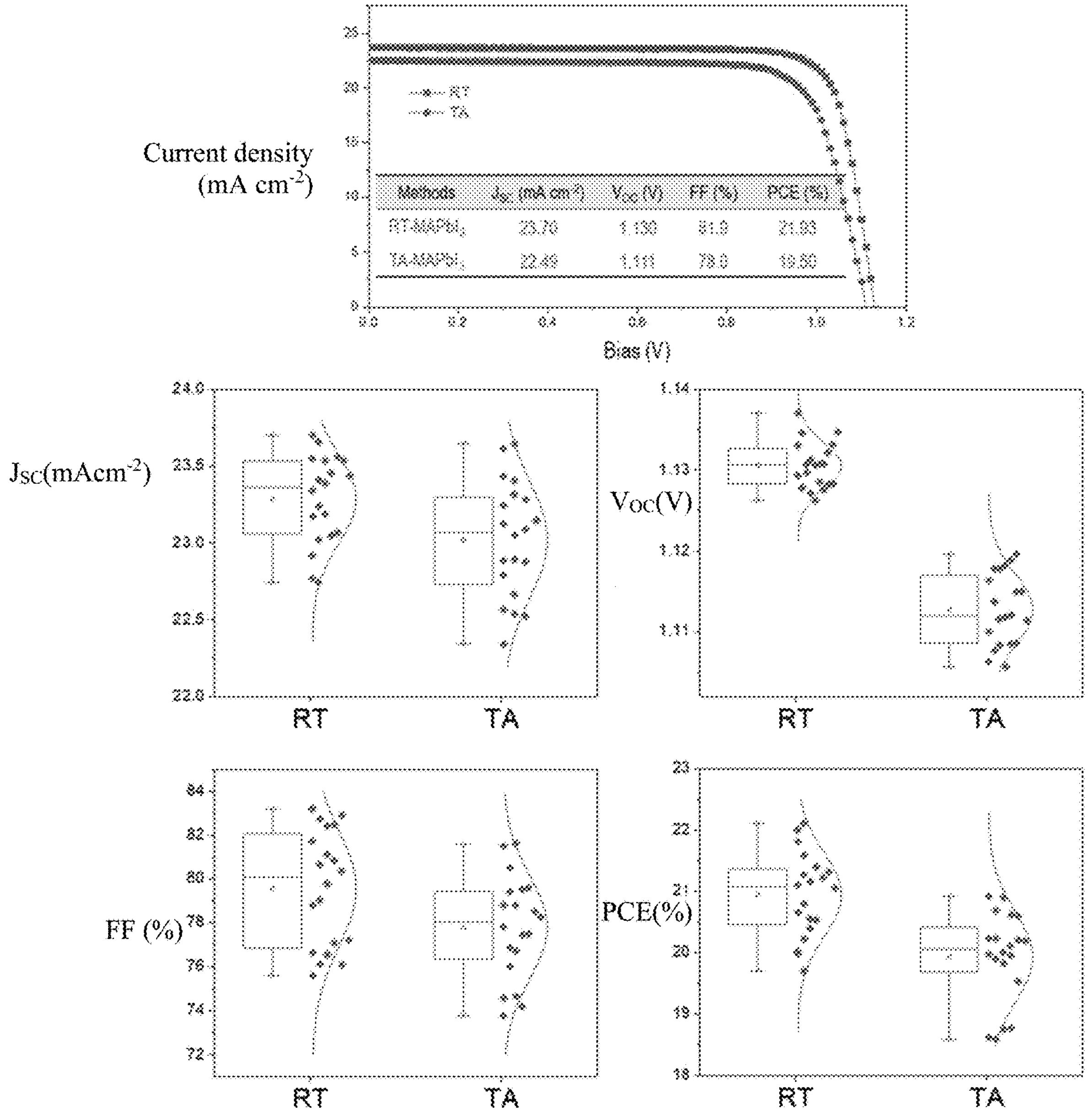
FIG. 27 shows inverted device performance using alternative perovskite composition: $MAPbI_3$, wherein the RT-device exhibits an average efficiency of 21.93% than that of 19.50% from TA-device and the statisticsdata also show a narrower distribution of photovoltaic parameters for the RT-device.
Figure 28:
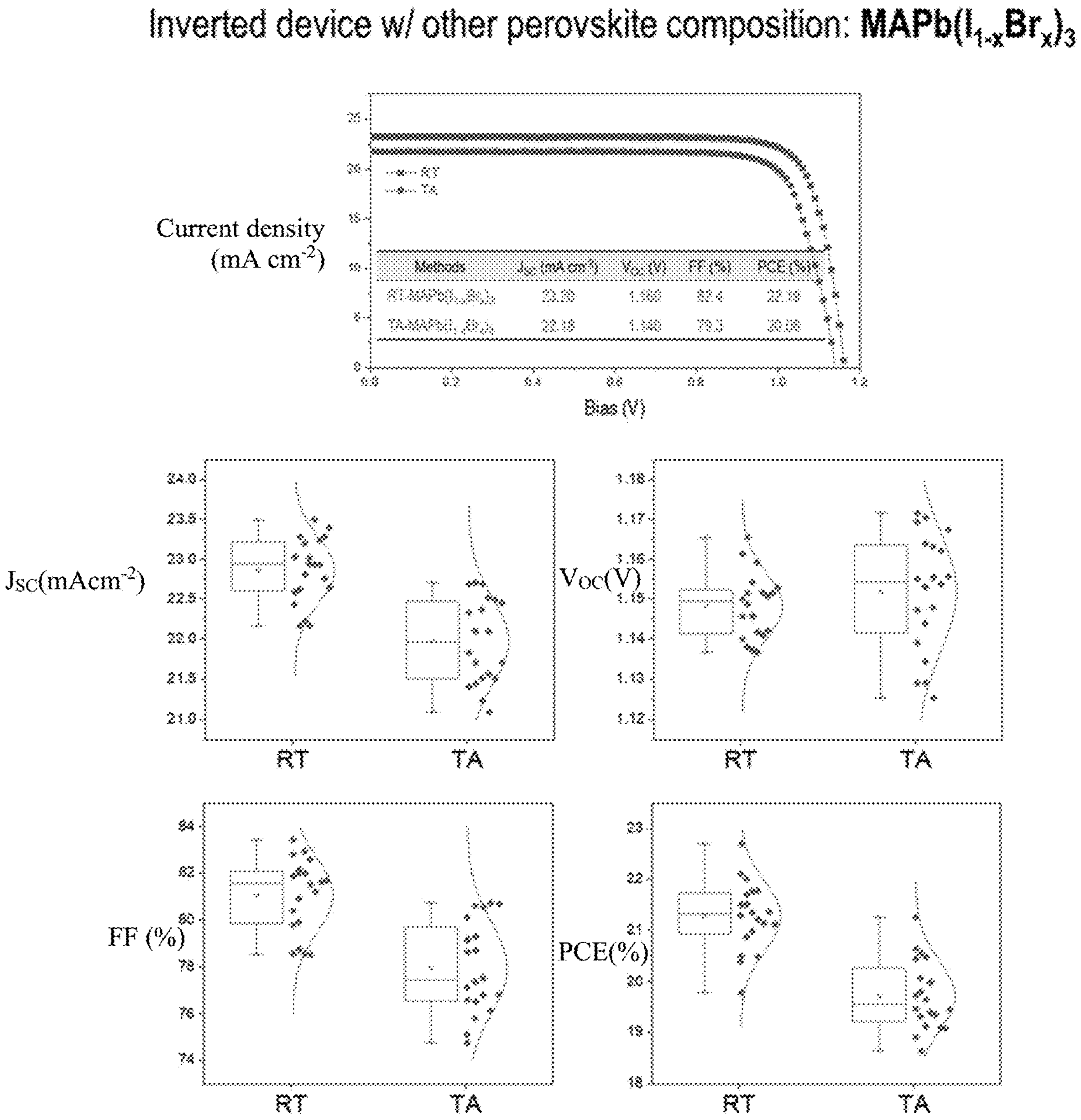
FIG. 28 shows inverted device performance using alternative perovskite composition: $MAPb(I_{1-x}Cl_x)_3$, wherein the RT-device exhibits an average efficiency of 22.19% than that of 20.06% from TA-device and thestatistics data also show a narrower distribution of photovoltaic parameters for the RT-device.

In addition to the $MAPb(I_{1-x}Cl_x)_3$ RT-perovskite, RT-perovskite with compositions of $MAPbI_3$ $MAPb(I_{1-x}Cl_x)_3$ were synthesized and the corresponding device performances were characterized. Both perovskites exhibit fast crystallization isothermally at RT with a specular film surface. The corresponding device also shows an enhanced efficiency: RT-$MAPbI_3$ based device shows a PCE of 21.93% compared to that of 19.50% from its TA-counterpart (see FIG. 27); RT-$MAPb(I_{1-x}Cl_x)_3$ based devices show a PCE of 22.19% compared to that of 20.06% from its TA-counterpart (see FIG. 28). These results clearly demonstrate the effectiveness and high performance of the isothermally crystallized RT perovskite ink for fabrication of efficient solar cells. This exciting achievement can be attributed to the volatile solvent and metastable intermediate state that synergistically foster a rapid phase transition at RT.

MATERIALS AND METHODS

Materials

Lead (II) bromide ($PbBr_2$, 99.99%), Lead (II) iodide ($PbI_2$, 99.99%) and Lead (II) iodide ($PbI_2$, 99.99%) were purchased from Alfa Aesar. Spiro-OMeTAD, $TiO_2$ paste (18NR-T), FTO/glass (ITO/glass) were purchased from Luminescence Technology Corp, Dyesol, and Nippon Sheet Glass, respectively. Other chemicals were purchased from Sigma-Aldrich and used withoutfurther purification. These chemicals include: methylammonium iodide (MAI), methylammoniumbromide (MABr), methylammonium chloride (MACl), amine solutions including ammonia solution (28-30 wt. % in water and 2.0 M in ethanol), methylamine solution (33 wt. % in absolute ethanol, 40 wt. % in water and 2.0 M in tetrahydrofuran), ethylamine solution (2.0 M in tetrahydrofuran) and propylamine (≥99%) and solvents such as dimethylformanmide (DMF, extradry, 99%), dimethyl sulfoxide (DMSO, extra dry, 99%), 1,2-dichlorobenzene (DCB, extra dry, >98%), chlorobenzene (CB, extra dry, 99.8%), and isopropanol (extra dry, 99.8%).

Single-Crystal Synthesis

Single-crystals of $MAPbI_3$, $MAPb(I_{1-x}Cl_x)_3$ and $MAPb(I_{1-x}Br_x)_3$ were synthesized. Taking $MAPbI_3$ as an example, a precursor solution containing 5.54 g $PbI_2$ and 1.91 g MAI in 10 mL GBL was prepared at 70° C., followed by filtration with a PVDF filter with pore size of 0.2 μm. The resultant pale-yellow solution was transferred into an oil bath with a gradual temperature increase from RT to 110° C. within 2 hrs. and maintained at 110° C. for 3 hrs. After that, single crystals of black $MAPbI_3$ perovskite were obtained, which were further cleaned by diethyl ether washing and then dried in a vacuum oven overnight. For $MAPb(I_{1-x}Cl_x)_3$ $MAPb(I_{1-x}Br_x)_3$ perovskite, small amount (3 mol % to 5 mol %) of $PbX_2$ and MAX (X is either Cl or Br) were added to above $PbI_2$ and MAI precursors and 2.5 vol % DMSO was added as an secondary solvent. Other steps are similar to that for $MAPbI_3$.

Room-temperature isothermally crystallized perovskite ink (RT-ink) preparation.

The RT isothermally crystallized perovskite ink was prepared by dispersing above single crystals into a series of amine-solutions, where the amine could be ammonia ($NH_2$), methylamine ($CH_3NH_2$) andpropylamine ($CH_3(CH_3)_3NH_3$), etc., and solvent could be water, ethanol, isopropanol, tetrahydrofuran, etc. Additionally, solvent of acetonitrile was further added into above system to dilute the solution towards a final concentration of 1.0 to 1.2M. For example, for the $MAPb(I_{1-x}Cl_x)_3$ RT-ink (using CH3NH2/EtOH), 734 mg $MAPb(I_{1-x}Cl_x)_3$ single crystal was added in 600 $CH_3NH_2$/EtOH (33 wt. %) and further diluted by 400 μL acetonitrile to synthesize a 1.2 M ink. After ultrasonication for 10 minutes, yellowish solution was obtained to be used for RT isothermal crystallization. It should be noted that all the amines and solvents for this system have low boiling point.

Spin-coating room-temperature isothermally crystallized perovskite (RT-perovskite) thin film.

The RT-perovskite thin film was spin-casted from RT-ink with a spin-rate of 4,000 to 6,000 r.p.m. for 60 s through a dynamic spin-coating process. Here the dynamic spin-coating process refers to a process where the ink is dropped on an already steadily spinning substrate. The film exhibited a quick color change into a black film within several seconds. A relative long spinning period of 60 s was used to adequately remove the solvent. This spin-coating method was used to prepare the RT-perovskite film for solar cells.

Doctor-blading RT-perovskite thin film.

The RT-ink also exhibited good compatibility for RT-processed blade coating on a glass substrate. In this preliminary blade process, a glass rod was used to spread the ink on a UV-plasma treated FTO/glass substrate. The RT-ink displayed good wettability on the substrate and the wet film also exhibited a quick darkening upon solvent evaporation within several seconds.

Solar cell fabrication.

Conventional (n-i-p) structure: The n-i-p device with an architecture of FTO/c-$TiO_x$/m-$TiO_x$/RT-perovskite/Spiro-OMeTAD/Au was used to evaluate the photovoltaic performance of the RT-perovskite. The FTO/glass substrates were first ultrasonicated in bath of detergent, deionized water, acetone and isopropanol successively, followed by drying in an oven overnight. After that, the dried substrate was further cleaned by UV ozone plasma for 45 min. A compact layer of $TiO_x$ was then spin-coated on these precleaned FTO/glass substrates from a mildly acidic titanium isopropoxide solution (prepared by slowly adding mixed solution containing 35 μL 2M HCl and 2.53 mL ethanol into another mixed solution of 369 μL titanium isopropoxide and 2.53 mL ethanol) with a spin-rate of 2,000 r.p.m., followed by thermal annealingat 150° C. for 10 min. A mesoporous $TiO_x$ layer was then spin-coated on top of the compact layer at a spin-rate of 6,000 r.p.m., from an ethanol solution containing TiO2 paste (18NR-T), α-terpineoland ethanol ($TiO_2$: α-terpineol: ethanol=1:3:1.5 wt %). After that, the substrate coated with both $TiO_x$ layers were annealed at 500° C. for 1 hr. After cooling down to RT, the substrates were further treated by UV ozone plasma for 15 min. The RT-perovskite layers were then spin-coated on top according to above methods. Notably, the RT-perovskite experienced a quick phase transition and no additional processing (neither anti-solvent process nor post-solvent annealing) was needed. A Spiro-OMeTAD layer was then spin-casted on top with a spin-rate of 4,000 r.p.m. Finally, a 75 nm gold electrode was thermally deposited to finalize the device.

Inverted (p-i-n) structure: The p-i-n device with an architecture of ITO/$NiO_x$/RT-perovskite/PCBM/BCP/Ag was used to evaluate the photovoltaic performance of the RT-perovskite. The pre-cleaned ITO/glass substrates (through ultrasonication in bath of detergent, deionized water, acetone and isopropanol sequentially) were treated by UV-ozone plasma for 40 minutes before use. A ~40 nm thick $NiO_x$ was spin-casted from $NiO_x$ nanocrystal solution at a spin-rate of 3000 rpm for 40 s according to prior reports. The RT-perovskite photoactive layer was spin-coated on top of $NiO_x$ according to above method using the RT-ink. After that, a PCBM electron transfer layer was spin-coated on top of perovskite using a PCBM/chlorobenzene solution(10 wt. %) at a spin-rate of 1000 r.p.m. for 50 s. Lastly, a 5 nm thick bathocuproine (BCP) and 100 nm thick aluminum (Al) film were sequentially deposited on top through a shadow mask in the vacuum of $<5\times10^{-6}$ mbar to finalize the device.

Material characterization.

All the scanning electron microscope (SEM) images were obtained from a LEO 1530 MERLIN (FESEM) in the Nanofabrication lab in Material Research Institute (MRI) at Penn State. For perovskite material, the acceleration voltage was determined to be 5 kV. Both secondary electron (SE) and backscattered electron (BSE) detection through in-lens secondary electron detectors and conventional Everhart-Thornley style detectors respectively wereused during the characterization. The atomic force microscopy (AFM) and conductive-AFM (C-AFM) images were recorded through a Bruker Innova AFM platform from the Energy and Environmental Sustainability Laboratories (EESL). The sample was coated directly on an ITO/glass substrate which was further contacted with the bottom electrode of the AFM platform. A Pt-coated AFM tip was used as the top moving electrode at a scan rate of 1.0 Hz. The in-situ isothermal RT crystallization study through an optical microscopy was recorded on an OlympusMX50 microscopy in the Material Characterization Lab (MCL) at Penn State. TGA/MSstudy was performed on a Discovery Series TGA Q5500 coupled with Discovery MS (TA instruments). When coupled to MS, the gaseous species that were released as a result of evaporation were transferred to MS through heated capillary transfer line. The quadrupole detectorin MS provides chemical determination (mass/charge from 1 to 300) of evolved gases giving information about reactions in real time. The in-situ PL study on the RT isothermal crystallization process was performed on the FLS1000 Photoluminescence Spectrometer (Edinburgh Instruments). Specifically, RT-ink was directly dropped on a glass substrate which was under a repeat scan by the Spectrometer. To acquire a high time resolution, data point for each single PL spectra was reduced to a number of 31. For the time-integrated PL map, samples were tested at various excitation (300 to 350 nm) and emission wavelengths (420 to 940 nm). The excitation incident takes place at the perovskite thin film surface with the opposite side being the quenching layers in cases of quenching experiment. For the charge carrier diffusion length study, the time-resolved PL of different samples were excited at 650 nm and detected at 800 nm. For each sample, same incident intensity and optical path was applied. The UV-vis absorption spectroscopy was measured by UH4150 (HITACHI). XRD patterns and HRTEM images were obtained by a Malvern Panalytical Empryean X-Ray Diffractometer (Cu Kα radiation, Rietveld refinement of the PXRD data were performed with the General Structure Analysis System (GSAS) software) and FEI Titan3 G2* (under a working voltage of 80 kV with image corrector and Monochromatorand a screen current of the electron beam of ~1 nA) respectively in MCL.

Device characterization.

All the solar cell devices were tested under one one-sun illumination (AM 1.5) provided by Xenon solar simulator (Solar Simulator, Class AAA, IEC/JIS/ASTM, 450 W Xenon, 2×2 in.) in the ambient atmosphere. The intensity of the simulator was calibrated to 100 mW $cm^{-2}$ by using a standard reference Si solar cell (Calibrated Reference Cell, Meter, KG3 Window, certified by NREL). The spectral mismatch factor was maintained in a narrow range of 0.99 to 1. The device area (0.096 $cm^2$) was defined by a metal aperture placed on top of the cell. J-V curves were obtained by either reverse (high voltage to low voltage) or forward scan (low voltage to high voltage) with a scan step of 20 mV and scan rate of 200 mV/s, if not state otherwise,using a Keithley digital source meter (Model 2,400). The static output power was measured by recording the continuous photocurrent of the device hold at a constant voltage bias close to its maximum power point ($V_{mp}$). The $V_{mp}$ was determined by plotting the power against the voltage. The photocurrent tracking was performed by Electrochemical Workstations programmed in a current-time characterization. The IPCE was recorded by the QuantX 300 (ORIEL) in ambient atmosphere.

Figure 29A:
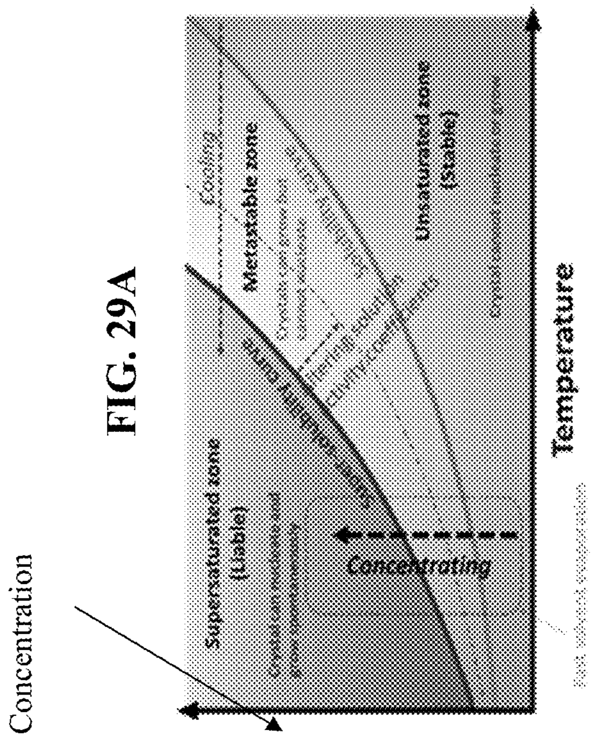
FIG. 29A shows a solubility curve and metastable zone plotted against temperature and concentration.
Figure 29B:
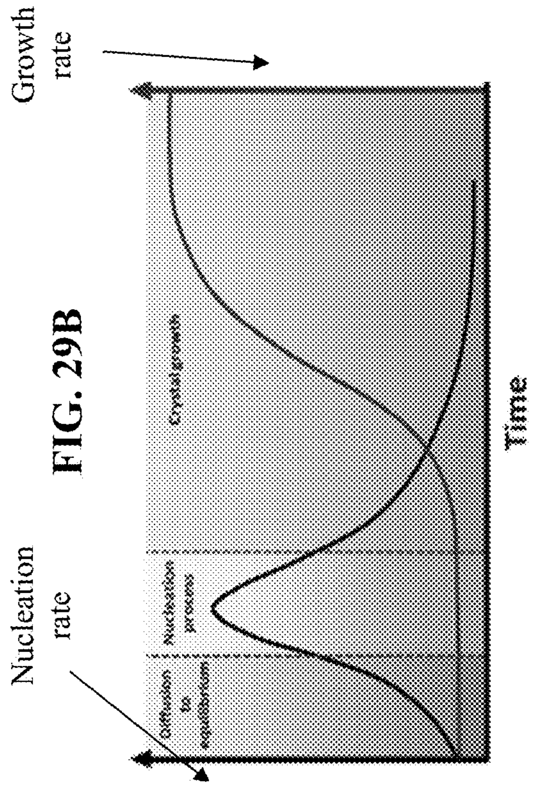
FIG. 29B shows time dependence of nucleation rate (according to the Classical Nucleation Theory (CNT)) and growth rate.
Figure 29C:
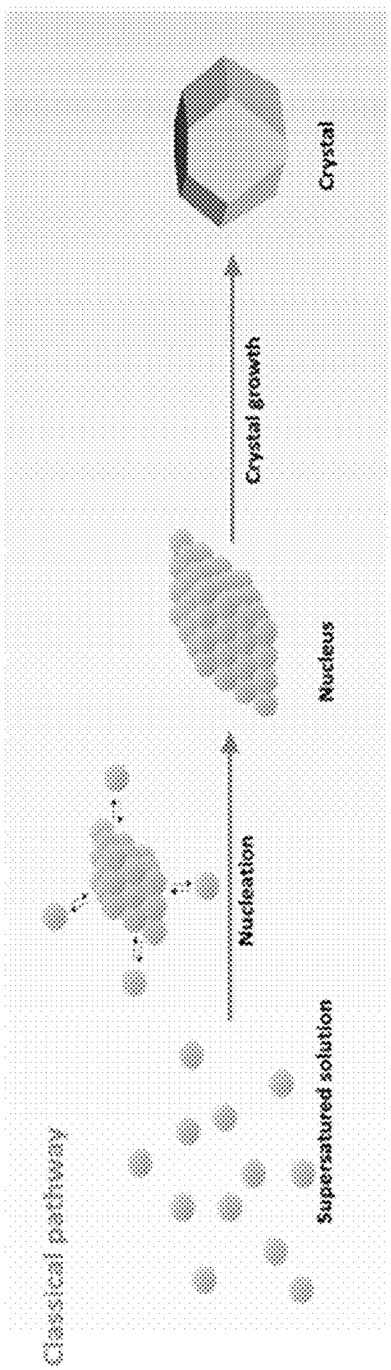
FIG. 29C shows a schematic illustration of the classical pathway of molecular assembly during the crystallization process.

The driving force for the precipitation of a solid phase from a supersaturated solution can be quantified by the chemical potential difference ($\Delta\mu=\mu_s-\mu_c$) of a molecule in the solution ($\mu_s$) and crystalline phase ($\mu_c$). Thermodynamically, this can be expressed as:

$$\Delta\mu=kT\ln S$$

k, T, and S are the Boltzmann constant, absolute temperature, and supersaturation ratio, respectively. Supersaturation is the driving force for crystallization, which can be achieved through (i) temperature adjustment (cooling), (ii)

concentration changes (concentrating), or by (iii) altering the solution activity coefficients, as denoted by the dashed arrow in FIGS. 29A-29C. FIGS. 29A-29C also show the temperature-composition phase behavior. In this RT-isothermal-crystallized halide perovskite system, the whole process from unsaturated zone (in solution state) to the supersaturated zone (which initiate the crystallization) is driven by the spontaneous solvent evaporation at RT that increases the concentration of the system.

Based on the Classical Nucleation Theory (CNT) (derived from the continuums thermodynamics), the time-dependent nucleation rate cap be expressed as:

$$n(t) = \frac{dN}{dt} = \frac{N_0 2a}{\text{erfc}(b)\sqrt{\pi}} \frac{\exp\left[-\left(\frac{a}{1-\tau}+b\right)^2\right]}{(t-\tau)^2}$$

where $$a = \frac{\xi}{\sqrt{2}\sigma_D B} \text{ and } b = \frac{J_m}{\sqrt{2}\sigma_D B} - \frac{\overline{D}}{\sqrt{2}\sigma_D},$$

with D and $\sigma_D$ being the mean and standard deviation of ion vacancy diffusivity for a single population of the breakdown sites on the crystal surface, respectively, $J_m$ is the annihilation flux of cation vacancies, t is time, τ is the dissolution time of the cap over the vacancy condensate from the initial vacancy condensation to the point of rupture, and is the areal concentration of condensed vacancies on the cation sublattice.

Figure 30A:
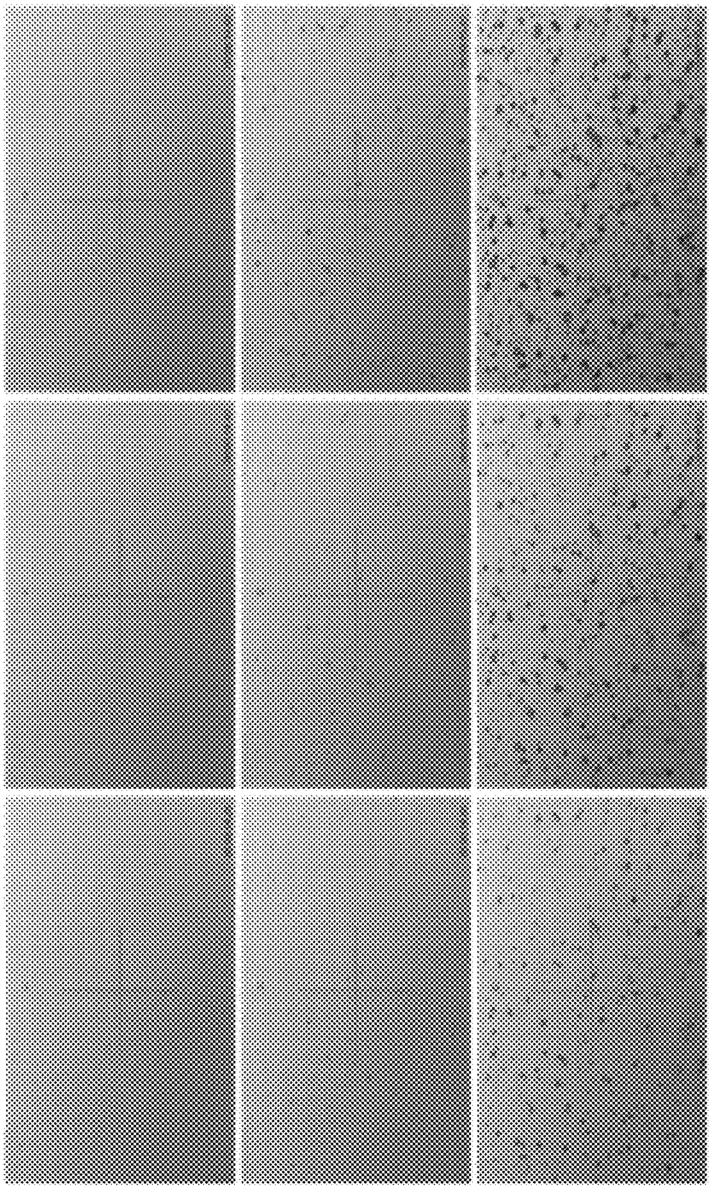
FIGS. 30A-30C show in-situ study on the nucleation of the MAPb(I1−xClx)3.
Figure 30B:
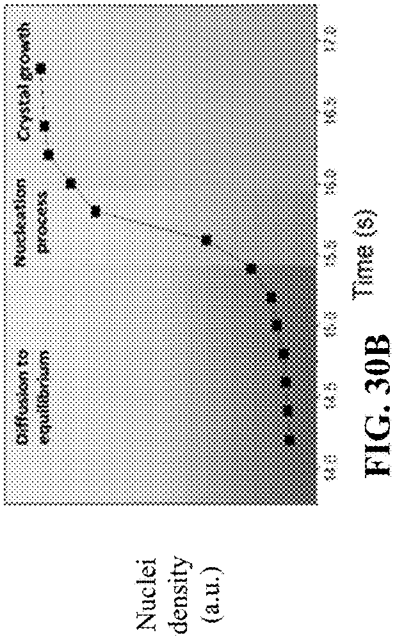
Figure 30C:
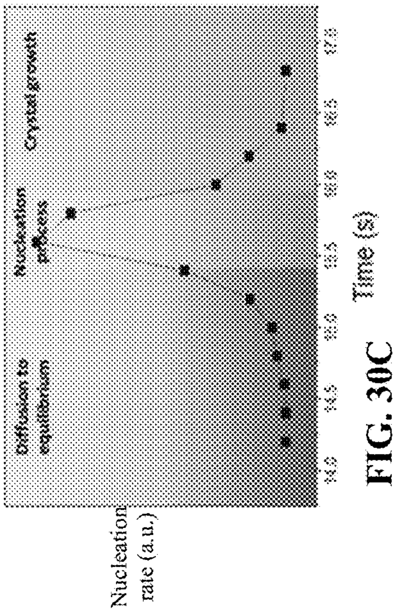

A general (t) vs. t plot is shown in FIG. 29B. The nucleation rate (t) firstly displays an increase, followed by a peak of maximal rate and then a decrease. The nucleation process of the RT-crystallized halide perovskite also followed this classical nucleation mechanism. The nucleation process in a RT-isothermal condition was monitored and snapshots at different times were taken to count the nucleuses. FIG. 30A shows the snapshots of optical microscopic images frozen at different time during the nucleation process. The nuclei density was counted by counting the nuclei numbers in a specific region at different times and plotting the nuclei density-time curve in FIG. 20B. By taking the first order derivative, the (t) vs. t plot in FIG. 30C was obtained. Clearly, the (t) vs. t plot for the RT-crystalized $MAPb(I_{1-x}Cl_x)_3$ exhibits similar features to the classical theory, displaying three regions of diffusion-control, nucleation, and growth.

The in-situ study on the crystal growth of the $MAPb(I_{1-x}Cl_x)_3$ was performed on an optical microscopy at room temperature (with a RH of 43%) in ambient atmosphere. The growth process was and snapshots at different times are shown in FIG. 31A. The radius ($r_t$) of a crystal was measured at each time t, and the ratio of $r_t/\eta_f$ was taken with $\theta_f$ being the radius of the crystal at the final state. FIG. 31B shows the plot of $r_t/\eta_f$ vs. t. The $r_t/\eta_f$ corresponds to the volumetric crystalline phase fraction of the instant crystal to the final crystal. The volume fraction dependence on crystalline phase and crystallizing time can be described by the Avrami equation as:

$$V(t)=1-\exp(-kt^n)$$

where V(t) is the ratio between crystalline phase at time t to that at equilibrium state (v/v). V(t) can be determined by:

$$V(t) = \frac{V_c(t)}{V_c(\infty)} = \frac{\int q(t)dt}{\int_0^\infty q(t)dt}$$

k is a constant corresponding to the rate of reaction and is dependent on the molecular weight and crystallization temperature ($T_{crys}$), and n is the Avrami exponent for a certain materialand can be influenced by the nucleation kinetics. Avrami equation is developed for the isothermal conditions and could be used in the condition of constant temperature, which is used herein to reveal the kinetic nature of the crystallization of the material. The interpretation of Avrami constants provides understanding of the underlying physics during the crystallization process. To obtain the Avrami constants, the logarithm on both sides are taken to get:

$$\ln(1-V(t))=-kt^n$$

, wherein:

$$\log(-\ln(1-V(t)))=\log(k)+n\cdot\log(t)$$

In this way, by plotting log(−ln(1−V(t))) vs log(t), Avrami constants of n can be obtained from the slope and k from they-axis intercept. FIG. 31C shows the plot of log(−ln(1−V(t))) vs. log(t). By extracting the slope and intercept, we obtained the constants of n=3.63 and $k=7.6\times10^{-7}$, respectively. The Avrami exponent (n) consists of two terms given by equation:

$$n=N+C$$

The nucleation parameter (N) is either 0 or 1 and crystallization (C) is 1, 2 or 3 (denoting growth dimension). n=3.63>3, which suggests that the crystal growth involvesa three-dimensional growth accompanied by a simultaneous nucleation process. The three-dimensional growth assists the crystal grain growth to a size of hundreds of nanometers in the thin film. The nucleation is also involved during the process, which can be understood by the fast solvent evaporation that leads to the supersaturation of the system. Overall, nucleation can be random and growth unhindered leading to high values for 3<n<4.

S3 Structural identification of perovskite intermediate of $MA(A)_nPb(I_{1-x}Cl_x)_3$.

Powder X-ray diffractions of perovskite intermediate crystal and Rietveld refinement.

To characterize the phase of the perovskite intermediate crystal $MA(A)_nPb(I_{1-x}Cl_x)_3$, n>1, single crystals were grounded thoroughly in an agate mortar in a chamber filled with amine atmosphere and quickly transferred for measurement using powder X-ray diffraction (PXRD). Rietveld structure refinement was performed by using the PXRD data and a constructed unit cell model. The final refined results of unit cell parameters and reliability factors for as-grown $MA(A)_nPb(I_{1-x}Cl_x)_3$ are listed in Table 4.

TABLE 4

Crystallographic data for $MA(A)_nPb(I_{1-x}C_{lx})_3$ crystal based on Rietveld refinement.

| Cell parameters | a/b (Å) | c (Å) | α (°) | β (°) | γ (°) |
|---|---|---|---|---|---|
| | 8.81532(11) | 24.66372 (4) | 90 | 90 | 90 |
| Space group | | p b c a | | | |
| Unit-cell volume | | 1916.41 (Å$^3$) | | | |
| $R_{wp}$ (%) | | 8.75 | | | |
| $R_p$ (%) | | 11.58 | | | |
| $\chi^2$ | | 0.1224 | | | |
| **Atomic coordinates** | **X** | **Y** | **Z** | **Occ.** | **U** |
| H1 | 0.8170 | 0.7720 | 0.7303 | 1 | 0.069 |
| H2 | 0.9968 | 0.7484 | 0.7459 | 1 | 0.069 |
| C3 | 0.8890 | 0.7560 | 0.7590 | 1 | 0.046 |
| H4 | 0.8815 | 0.8387 | 0.7822 | 1 | 0.069 |
| N5 | 0.8460 | 0.6180 | 0.7849 | 1 | 0.042 |
| H6 | 0.7363 | 0.6246 | 0.7969 | 1 | 0.051 |
| H7 | 0.9570 | 0.4870 | 0.8340 | 1 | 0.038 |
| H8 | 0.9508 | 0.3574 | 0.8342 | 1 | 0.040 |
| H9 | 0.9448 | 0.6002 | 0.7905 | 1 | 0.045 |
| C10 | 0.9250 | 0.4400 | 0.8573 | 1 | 0.033 |
| H11 | 0.8115 | 0.4325 | 0.8657 | 1 | 0.040 |
| I12 | 1.0779 | 1.0298 | 0.8822 | 1 | 0.031 |
| H13 | 1.1198 | 0.4326 | 0.8947 | 1 | 0.045 |
| N14 | 1.0160 | 0.4270 | 0.9025 | 1 | 0.030 |
| H15 | 0.9957 | 0.3391 | 0.9175 | 1 | 0.045 |
| H16 | 0.9905 | 0.5015 | 0.9239 | 1 | 0.045 |
| I17 | 0.6987 | 1.2042 | 0.9771 | 1 | 0.031 |
| Pb18 | 1.0000 | 1.0000 | 1.0000 | 1 | 0.024 |

HRTEM was used to identify the interplanar distance of d(002)=12.33 Å. The strong {00$\ell$ } orientations of thin films of $MA(A)_nPb(I_{1-x}Cl_x)_3$ intermediateperovskite and final $MAPb(I_{1-x}Cl_x)_3$ perovskite are also confirmed by XRD analysis.

Photo-carrier diffusion length quantification through PL study.

The PL study and a diffusion model coupled with continuum theory were used to calculate the photo-carrier diffusion length in perovskite thin film. Briefly, consider the photoactive perovskite layer with a film thickness of L. Such a layer is further coated by either a photocarrier blocking or a quenching layer. Length of x is defined as a distance away from the sample surface upon incident light. A generalized diffusion equation can be written using the continuum theory as $$\frac{\partial n(r,t)}{\partial t} = \nabla \cdot [D(n,r,t)\nabla n(r,t)] - \frac{n(r,t)}{\tau} + G(r,t)$$

(rr, t) is the local density, r is the lifetime of photocarriers, (n, rr, t) is the diffusion coefficient, and G(rr, t) the generation rate, respectively. In the case of a bi-layer structure, the spatial distribution is one-dimensional (1D) for these photocarriers. Thus, (rr, t)=(x, t), where x is the distance from the sample surface upon illumination. Under assumption of low photo-carrier density, there will be no high-order carrier-carrier interaction and the diffusivityis assumed to be independent of either the carrier density or the position inside the homogeneous film, i.e., (n, rr, t)=(t). Under these approximations:

$$\frac{\partial n(x,t)}{\partial t} = D(t)\frac{\partial^2 n(x,t)}{\partial x^2} - \frac{n(x,t)}{\tau} + G(x,t)$$

Considering the initial distribution of photo-carrier under an instantaneous photon-excitation, at the initial-state, the net-generation rate ((rr, t)) can be omitted. An initial-state charge distribution term can be obtained as:

$$n(x,0) = G(x) = n_0\exp\left(-\frac{\alpha x}{\cos\theta}\right)$$

$n_0$ is a constant related to the laser light, α is the absorption coefficient at the excitation wavelength, and θθ is the incidence angle of the laser pulse with respect to the out-of-plane direction ofthe film sample surface, respectively. Three cases of (i) ideal case of quenching, (ii) absence of quencher, and (iii) thickness-dependent transient quenching were considered.

In the ideal case of quenching:

Applying the boundary condition at x=0 (blocking by surface, i.e., no diffusion or quenching):

$$\frac{\partial n(0,t)}{\partial x} = 0$$

At x=L (quenching by a bottom quenching layer and thus no photo-carriers):

$$n(L,t)=0$$

By solving the equations, the solution of photo-carrier density distribution ((x, t)) is function of position x and time, which can be written as:

$$n(x,t) = n_0\sum_{k=0}^{\infty} A_k\exp[-\left(\frac{1}{\tau} + B_k^2\frac{D}{L^2}\right)t]\cos\left(B_k\frac{x}{L}\right)$$

where parameters Ak and Bk have the following expressions:

$$A_k = \frac{2\left[B_k(-1)^k\exp\left(-\frac{\alpha L}{\cos\theta}\right) + \frac{\alpha L}{\cos\theta}\right]}{B_k^2 + \left(\frac{\alpha L}{\cos\theta}\right)^2}$$

$$B_k = \left(k + \frac{1}{2}\right)\pi$$

with k being natural number with value of 0, 1, 2, . . . (using a finite Fourier transform method).

Since the photo-carrier diffusion length is proportional to the square root of the mobility and carrier lifetime, in 1D diffusion mode:

$$L_D=/\sqrt{2D\tau}$$

Here the $L_D$ is the minimum 1D net displacement achieved by 1/e of the initial population of photo-carriers. In terms of $L_D$:

$$n(x,t) = n_0\sum_{k=0}^{\infty} A_k\exp\left\{-\frac{t}{\tau}\left[1 + \frac{B_k^2}{2}\left(\frac{L_D}{L}\right)^2\right]\right\}\cos\left(B_k\frac{x}{L}\right)$$

in dependence of a dimensionless parameter of $$\frac{L_D}{L},$$

denoting the ratio between the length of diffusion and the film thickness (L).

In the case of absence of quencher:

There is no quenching layer and the perovskite layer has both sides "blocking". Applying the oundary condition at x=L:

$$\frac{\partial n(L,t)}{\partial x} = 0$$

By solving the equations:

$$n(x,t) = n_0 A_0 \exp\left(-\frac{t}{\tau}\right) + n_0 \sum_{k=1}^{\infty} A_k \exp\left\{-\frac{t}{\tau}\left[1 + \frac{B_k^2}{2}\left(\frac{L_D}{L}\right)^2\right]\right\}\cos\left(B_k \frac{x}{L}\right)$$

where parameters of $A_0$, $A_k$ and $B_k$ have the following expressions:

$$A_0 = \frac{\cos\theta}{\alpha L}\left[1 - \exp\left(-\frac{\alpha L}{\cos\theta}\right)\right]$$

$$A_k = \frac{\frac{2\alpha L}{\cos\theta}\left[1 - (-1)^k \exp\left(-\frac{\alpha L}{\cos\theta}\right)\right]}{B_k^2 + \left(\frac{\alpha L}{\cos\theta}\right)^2}$$

$$B_k = k\pi$$

with k being natural number of 0, 1, 2, . . .

In the case of thickness-dependent transient quenching:

The average photo-carrier lifetime in dependence of $L_D/L$ and native lifetime can be obtainedbased on above derivation and has the following expression:

$$\overline{n}(t) = n_0 \sum_{k=0}^{\infty} A_k \exp\left\{-\frac{t}{\tau}\left[1 + \frac{B_k^2}{2}\left(\frac{L_D}{L}\right)^2\right]\right\}$$

where $$A_k = \frac{2\left[B_k \exp\left(-\frac{\alpha L}{\cos\theta}\right) + (-1)^k \frac{\alpha L}{\cos\theta}\right]}{B_k\left[B_k^2 + \left(\frac{\alpha L}{\cos\theta}\right)^2\right]}$$

$$B_k = \left(k + \frac{1}{2}\right)\pi$$

with k being natural numbers of 0, 1, 2, . . . .

This can also be regarded as a sum of multiple exponential terms, each weighted by $n_0 A_k$ with a decay rate of $$\tau_k = \tau\left[1 + \frac{B_k^2}{2}\left(\frac{L_D}{L}\right)^2\right]^{-1},$$

which can be rewritten as:

$$\overline{n}(t) = n_0 \Sigma_{k=0}^{\infty} A_k \exp\left(-\frac{t}{\tau_k}\right)$$

By comparing the PL lifetime in presence and absence of the quenching layer, the photo-carrier diffusion length ($L_D$) can be calculated based on the limit behavior of the infinite series solution. It should be noted that above equations were derived based on the fact that the quenching interface is opposite to side of laser incidence. The coefficient $A_k$, defined as the weight of each term in the infinite series of $\overline{n}(t)$, correlates to the optical depth of the photoactive layer. A qualified measurement requires the film thickness to be less than the attenuation length, i.e., $\alpha L<1$. Specifically, the perovskite thin film for this study was used with a thickness of 180 nm under an excitation wavelength of 650 nm ($\alpha=5.4\times10^4$ $cm^{-1}$), which isin accordance to this assumption. Overall, in these conditions the first term $A_0$ is more than 80% (for numerical approximation of the order of error) of the sum of all of the remaining coefficients. The following approximation can be made:

$$\overline{n}(t) \cong n_0 A_0 \exp\left(-\frac{t}{\tau_q}\right)$$

where the average photo-carrier lifetime ($\tau_q$) in presence of a quencher is defined by $$\tau_q \equiv \tau\left[1 + \frac{\pi^2}{8}\left(\frac{L_D}{L}\right)^2\right]^{-1}$$

and the photo-carrier diffusion length ($L_D$) by:

$$\frac{L_D}{L} = \frac{2\sqrt{2}}{\pi}\sqrt{\frac{1}{\tau_{q/\tau}} - 1}$$

It should be noted that above derivation is under assumption of instantaneous photoexcitation, which is applicable for this study because the timescale of photo-carrier transport and decay in theperovskite thin films (with a μs scale) is much longer than the temporal width of the laser pulse. Otherwise, modification terms such as convolution with the instrument response function (IRF) needs to be added, which is applied to the cases of perovskite films coated with quenching layers.

As can be appreciated from the disclosure herein, solution processability of photoactive halide perovskites differentiates them from traditional inorganic semiconducting materials that require multiple post-processing steps, such as thermal/vacuum/blow- and solvent-assistant treatment. This disclosure provides a technical breakthrough of isothermally crystallizing high-quality perovskite films at room-temperature (RT) without the needof any post-processing. And this process is highly timely efficient where the whole crystallization of an inch-scale film could be completed within ten seconds. This process takes advantage of a metastable intermediate of lower-dimensionality formed by amine-assisted crystallographic lattice expansion from initial three-dimensional perovskite, which can be dissolved in low-boiling point solvent. Using in-situ optoelectrical/chemical and ex-situ structural characterizations, a detailed understanding of the low-dimensional metastable intermediate is developed. In conjunction with the metastable intermediate, the rapid evaporation of solvent and amine facilitates ultrafast crystallization at RT within seconds. For example, this RT rapidly synthesized MAPbI3 perovskite film exhibits carrier diffusion length of 2.9 μm and {00ℓ} preferred orientation with anultrahigh Lotgering factor of 97%. These films are highly compatible to conventional or inverted devices, demonstrating 22.3% and 23.1% power conversion efficiencies, respectively. Other components perovskite can also be processed using this methods and are expected to have even higher efficiency and performance in different applications.

It should be understood that the disclosure of a range of values is a disclosure of every numerical value within that range, including the end points. It should also be appreciated that some components, features, and/or configurations may be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement.

It will be apparent to those skilled in the art that numerous modifications and variations of the described examples and embodiments are possible considering the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof It should be understood that modifications to the embodiments disclosed herein can be made to meet a particular set of design criteria. Therefore, while certain exemplary embodiments of the system and methods of using and making the same disclosed herein have been discussed and illustrated, it is to be distinctly understood that the invention is not limited thereto but may be otherwise variously embodied and practiced within the scope of the following claims.

What is claimed is:

1. A method of forming a halide perovskite crystal, the method comprising:

dispersing a halide perovskite material exhibiting a perovskite crystallographic lattice into a solution, the solution comprising amine and a solvent, the solvent volatizing from a liquid to a gas at a temperature of between 15° C. and 80° C.;

forming a metastable intermediate state via amine molecules inserting into the perovskite crystallographic lattice;

transitioning the perovskite material to a photo-sensitive phase via escape of the amine molecules from the perovskite crystallographic lattice; and transitioning the metastable intermediate state to a uniform halide perovskite crystal film.

2. The method of claim 1, wherein:

the steps of transitioning the perovskite material to the photo-sensitive phase and transitioning the metastable intermediate state to the uniform halide perovskite crystal film occur at a temperature within a range from 15° C. and 80° C.

3. The method of claim 1, wherein:

the steps of transitioning the perovskite material to the photo-sensitive phase and transitioning the metastable intermediate state to the halide perovskite crystal film occur within a range from 5 seconds to 60 seconds.

4. The method of claim 1, wherein:

the halide perovskite material is any one of:

a single crystal, a polycrystal, or a precursor powder mixture of $(LA)_2(SA)_{n-1}BX_{3n+1}$ or $ABX_3$ perovskite, where LA, SA, A are a chemical with amine group, B is a metal element, and X is halogen.

5. The method of claim 1, wherein:

the amine is a solvent chemical with amine groups including any of: ammonia ($NH_2$), methylamine ($CH_3NH_2$), or propylamine ($CH_3(CH_3)_3NH_3$) or compounds and functional groups that contain a basic nitrogen atom with a lone pair.

6. The method of claim 4, further comprising:

ultrasonication of the halide perovskite material, or stirring of the precursor powder.

7. The method of claim 1, wherein:

transitioning the perovskite material to the photo-sensitive phase involves escape of the amine molecules and evaporation of the solvent.

8. The method of claim 1, wherein:

transitioning the metastable intermediate state to the halide perovskite crystal film occurs without post-processing procedures.

9. The method of claim 1, wherein:

transitioning the metastable intermediate state to the halide perovskite crystal film occurs without thermal annealing.

10. The method of claim 1, wherein:

the metastable intermediate state exhibits an optical bandgap larger than an optical bandgap of the halide perovskite material before forming the metastable intermediate state.

11. The method of claim 1, further comprising:

increasing interplanar {00ℓ} spacing via the amine molecules inserting into the perovskite crystallographic lattice.

12. The method of claim 11, wherein:

the metastable intermediate state exhibits an {00ℓ} interplanar distance larger than an {00ℓ} interplanar distance of the halide perovskite material before forming the metastable intermediate state.

13. The method of claim 11, wherein:

the amine molecules insert between neighboring $[BX_6]^{4-}$ octahedral sheets.

14. The method of claim 11, wherein:

transitioning the perovskite material to the photo-sensitive phase involves reduction of interplanar {00ℓ} spacing to facilitate crystallographic lattice collapse to form the photo-sensitive phase.

15. The method of claim 11, wherein:

the halide perovskite crystal exhibits an {00ℓ} orientation with a Lotgering factor of 80% to 100%.

16. The method of claim 1, further comprising:

generating a film of the halide perovskite crystal via spin-coating or blade coating.

17. The method of claim 16, wherein:

the film of the halide perovskite crystal exhibits a diffusion length on the order of from a nanometer to a micrometer scale.

18. The method of claim 16, wherein:

the film of the halide perovskite crystal exhibits hexagonal grains with an average size within a micrometer scale.

19. The method of claim 16, further comprising:

generating an optoelectronic device comprising the film.

20. A method of forming a halide perovskite crystal, the method comprising:

dispersing a halide perovskite material exhibiting a perovskite crystallographic lattice into a solution, the solution comprising amine and a solvent;

forming a metastable intermediate state via amine molecules inserting into the perovskite crystallographic lattice;

transitioning the perovskite material to a photo-sensitive phase via escape of the amine molecules from the perovskite crystallographic lattice; and transitioning the metastable intermediate state to a uniform halide perovskite crystal film, wherein the solvent has a boiling point $<100°$ C.

21. The method of claim 20, wherein:

the solvent is any one of: an organic solvent, water, ethanol, or tetrahydrofuran.

* * * * *